US012649804B2

(12) United States Patent
Ishii et al.

(10) Patent No.: US 12,649,804 B2
(45) Date of Patent: Jun. 9, 2026

(54) POLYMERIC COMPOUND, ELECTROLUMINESCENT DEVICE MATERIAL, ELECTROLUMINESCENT DEVICE, AND ELECTRONIC DEVICE

(71) Applicant: SAMSUNG ELECTRONICS CO., LTD., Suwon-si (KR)

(72) Inventors: Norihito Ishii, Suwon-si (KR); Fumiaki Kato, Suwon-si (KR); Masashi Tsuji, Suwon-si (KR); Naotoshi Suganuma, Suwon-si (KR); Takahiro Fujiyama, Suwon-si (KR); Yusaku Konishi, Suwon-si (KR); Eun Joo Jang, Suwon-si (KR); Ha Il Kwon, Suwon-si (KR); Hyo Sook Jang, Suwon-si (KR); Soonmin Cha, Suwon-si (KR); Tae Ho Kim, Suwon-si (KR); Wonsik Yoon, Suwon-si (KR); Yuho Won, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 827 days.

(21) Appl. No.: 18/150,672

(22) Filed: Jan. 5, 2023

(65) Prior Publication Data

US 2023/0212335 A1 Jul. 6, 2023

(30) Foreign Application Priority Data

Jan. 5, 2022 (JP) ................................ 2022-000380
Jan. 4, 2023 (KR) ........................ 10-2023-0001452

(51) Int. Cl.

| | |
|---|---|
| ***C08F 26/12*** | (2006.01) |
| ***H10K 50/15*** | (2023.01) |
| ***H10K 50/17*** | (2023.01) |
| ***H10K 85/10*** | (2023.01) |

(52) U.S. Cl.

CPC ............. *C08F 26/12* (2013.01); *H10K 50/15* (2023.02); *H10K 50/17* (2023.02); *H10K 85/146* (2023.02)

(58) Field of Classification Search

None
See application file for complete search history.

(56) References Cited

U.S. PATENT DOCUMENTS

| | | | |
|---|---|---|---|
| 8,330,142 B2 | 12/2012 | Cho et al. | |
| 8,637,853 B2 * | 1/2014 | Buchholz | H10K 85/00 257/E51.001 |
| 8,679,644 B2 | 3/2014 | Parham et al. | |
| 9,028,980 B2 | 5/2015 | Abe et al. | |
| 9,175,132 B2 | 11/2015 | Meyer et al. | |
| 9,178,159 B2 | 11/2015 | Pan et al. | |
| 9,190,622 B2 | 11/2015 | Pan et al. | |
| 9,373,807 B2 | 6/2016 | Pan et al. | |
| 9,644,070 B2 | 5/2017 | Eckes et al. | |
| 9,745,420 B2 | 8/2017 | Heil et al. | |
| 9,799,830 B2 | 10/2017 | Griffiths | |

(Continued)

FOREIGN PATENT DOCUMENTS

| | | |
|---|---|---|
| CN | 108558739 B | 5/2020 |
| CN | 109369891 B | 3/2021 |

(Continued)

OTHER PUBLICATIONS

English Translation of Office Action dated Jun. 10, 2025, of the corresponding application Japanese Patent Application No. 2022-000380, 4 pp.
Office Action dated Jun. 10, 2025 of the corresponding application Japanese Patent Application No. 2022-000380, 4 pp.
English Abstract of CN 108558739.
English Abstract of CN 109369891.
English Abstract of JP 2017002287.
English Abstract of JP 2021-138915.
English Abstract of JP 6593432.

(Continued)

*Primary Examiner* — Joseph R Kosack
(74) *Attorney, Agent, or Firm* — CANTOR COLBURN LLP

(57) ABSTRACT

As a technology capable of improving the durability of an electroluminescent device, for example, luminescence lifespan, a polymeric compound including a structural unit represented by Chemical Formula 1, or a structural unit represented by Chemical Formula 1 and a structural unit represented by Chemical Formula 2, and an electroluminescent device material or electroluminescent device including the same are provided:

(Chemical Formula 1)

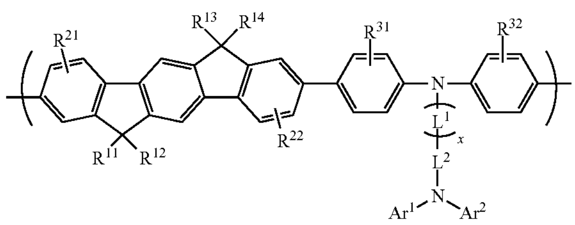

(Chemical Formula 2)

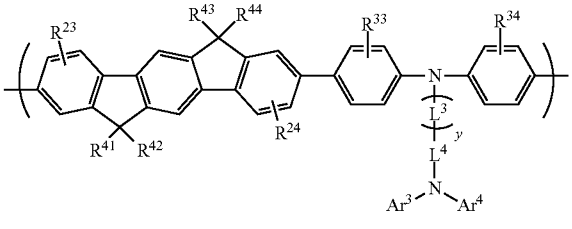

In Chemical Formula 1 and Chemical Formula 2, $R^{11}$ to $R^{14}$ are not the same as $R^{41}$ to $R^{44}$.

19 Claims, 1 Drawing Sheet

(56) References Cited

U.S. PATENT DOCUMENTS

| | | | |
|---|---|---|---|
| 9,815,940 | B2 | 11/2017 | Eckes et al. |
| 9,997,710 | B2 | 6/2018 | Griffiths |
| 10,050,202 | B2 | 8/2018 | Griffiths |
| 10,056,550 | B2 | 8/2018 | Griffiths |
| 10,056,551 | B2 | 8/2018 | Griffiths |
| 10,497,874 | B2 | 12/2019 | Griffiths |
| 10,580,989 | B2 | 3/2020 | Griffiths |
| 10,707,420 | B2 | 7/2020 | Griffiths |
| 10,818,843 | B2 | 10/2020 | Kakimoto et al. |
| 10,833,274 | B2 | 11/2020 | Griffiths |
| 2015/0155494 | A1 | 6/2015 | Wei Tan et al. |
| 2016/0256053 | A1 | 9/2016 | Pan et al. |

FOREIGN PATENT DOCUMENTS

| | | | |
|---|---|---|---|
| EP | 1394188 | B1 | 2/2011 |
| EP | 1932866 | B1 | 7/2011 |
| JP | 2003226744 | A | 8/2003 |
| JP | 2010199067 | A | 9/2010 |
| JP | 2013128082 | A | 6/2013 |
| JP | 2014517524 | A | 7/2014 |
| JP | 2014527290 | A | 10/2014 |
| JP | 2015514839 | A | 5/2015 |
| JP | 5962844 | B2 | 8/2016 |
| JP | 2017002287 | A | 1/2017 |
| JP | 6284922 | B2 | 2/2018 |
| JP | 6593432 | B2 | 10/2019 |
| JP | 6841555 | B2 | 3/2021 |
| JP | 2021138915 | A | 9/2021 |
| KR | 20100006072 | A | 1/2010 |
| KR | 1028415 | B1 | 4/2011 |

OTHER PUBLICATIONS

English Abstract of KR 1028415.
English Abstract of KR 20100006072.

* cited by examiner

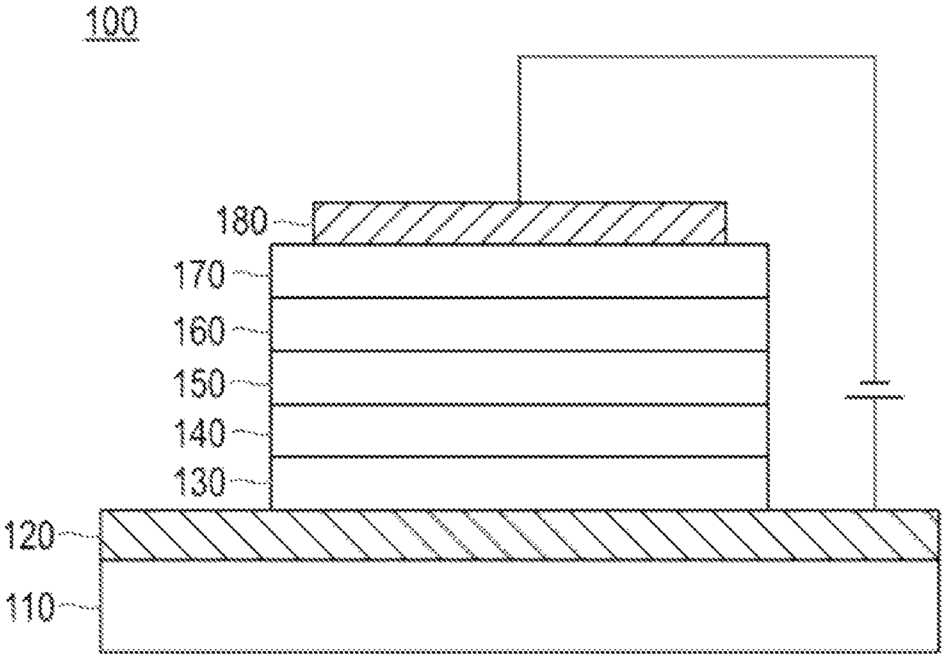
100
180
170
160
150
140
130
120
110

POLYMERIC COMPOUND, ELECTROLUMINESCENT DEVICE MATERIAL, ELECTROLUMINESCENT DEVICE, AND ELECTRONIC DEVICE

CROSS-REFERENCE TO RELATED APPLICATIONS

This application claims priority to and the benefit of Japanese Patent Application No. 2022-000380 filed in the Japanese Patent Office on Jan. 5, 2022, and Korean Patent Application No. 2023-0001452 filed in the Korean Intellectual Property Office on Jan. 4, 2023, the entire contents of which are incorporated herein by reference.

BACKGROUND OF THE INVENTION

(a) Field of the Invention

An embodiment relates to a polymeric compound, an electroluminescent device including the polymeric compound, and an electronic device including the electroluminescent device.

(b) Description of the Related Art

Research and development on electroluminescent devices (EL devices) are being actively conducted. In particular, the EL device is promising for use as an inexpensive large-area full-color display device of a solid-state light-emitting type or a recording light source array. The EL device is a light emitting device having a thin film of several nanometers to several hundreds of nanometers between an anode and a cathode. In addition, the EL device usually has a hole transport layer, a light emitting layer, an electron transport layer, and the like.

Among these, the light emitting layer includes a fluorescent light emitting material and a phosphorescent light emitting material. The phosphorescent light emitting material is a material that is expected to have higher luminous efficiency than fluorescent light emitting material. In addition, since it covers a wide color gamut, an RGB light source requires an emission spectrum having a narrow full width at half maximum. Although deep blue is particularly preferred for blue, there are currently no known devices having a combination of a long-span and satisfactory color purity.

As a method for solving these problems, a light emitting device using an inorganic light emitting material (e.g., "quantum dots") as a light emitting material are known (JP 2010-199067 A).

Quantum dots (QD) are semiconductor materials having a crystal structure of several nanometers in size, and is composed of hundreds to thousands of atoms. Since quantum dots are very small in size, they have a large surface area per unit volume. For this reason, most of the atoms exist on the surface of the nanocrystal, and exhibit a quantum confinement effect and the like. Due to this quantum confinement effect, quantum dots may control an emission wavelength only by adjusting their sizes, and have characteristics such as improved color purity and high PL (photoluminescence) luminous efficiency, and thus, are attracting much attention.

A quantum dot electroluminescent device (QD LED, or QLED) is known as a basic device having a three-layer structure including a hole transport layer and an electron transport layer on both ends with a quantum dot light emitting layer interposed therebetween.

In addition, for the purpose of improving the durability (particularly, luminescence lifespan) of the electroluminescence device (particularly, the quantum dot electroluminescent device) described in JP 2010-199067 A, an electroluminescent device using an alternating arylamine-fluorene copolymer including a structural unit (A) having a specific structure has been reported (JP 2021-138915 A).

The electroluminescent device using the arylamine-fluorene alternating copolymer described in JP 2021-138915 A as a hole transport material has improved durability. However, further improvements in durability are needed for high-performance electroluminescent devices.

SUMMARY OF THE INVENTION

Accordingly, an embodiment provides a technique capable of improving durability (in particular, particularly luminescence lifespan) of an electroluminescent device (in particular, a quantum dot electroluminescent device).

The polymeric compounds of the present disclosure include a structural unit represented by Chemical Formula 1:

(Chemical Formula 1)

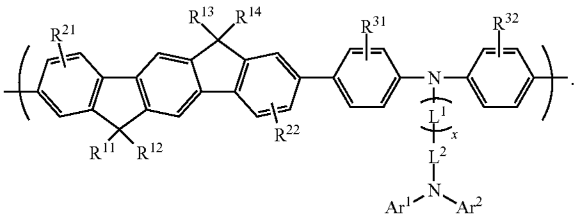

In Chemical Formula 1, $R^{11}$ to $R^{14}$, $R^{21}$, $R^{22}$, $R^{31}$, and $R^{32}$ are each independently a hydrogen atom or a hydrocarbon group having 1 to 18 carbon atoms, $L^1$ is a substituted or unsubstituted aromatic hydrocarbon group having 6 to 25 ring-forming atoms or a substituted or unsubstituted heteroaromatic ring group having 5 to 14 ring-forming atoms, x is 0, 1, or 2, and when x is 2, each occurrence of $L^1$ may be the same as or different from each other, $L^2$ is a substituted or unsubstituted aromatic hydrocarbon group having 6 to 25 ring-forming atoms, or a substituted or unsubstituted heteroaromatic ring group having 5 to 14 ring-forming atoms, wherein $L^2$ may form a ring with $Ar^1$, $Ar^1$ is a substituted or unsubstituted aromatic hydrocarbon group having 6 to 25 ring-forming atoms, or a substituted or unsubstituted heteroaromatic ring group having 5 to 14 ring-forming atoms, wherein $Ar^1$ may form a ring with $Ar^2$ or $L^2$, and $Ar^2$ is (i) an aromatic hydrocarbon group having 6 to 25 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms or a heteroaromatic ring group having 5 to 14 ring-forming atoms, or (ii) an heteroaromatic ring group having 5 to 14 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms or a heteroaromatic ring group having 5 to 14 ring-forming atoms, wherein $Ar^2$ may form a ring with $Ar^1$.

The polymeric compound according to an embodiment further includes a structural unit represented by Chemical Formula 2 together with the structural unit represented by Chemical Formula 1:

(Chemical Formula 2)

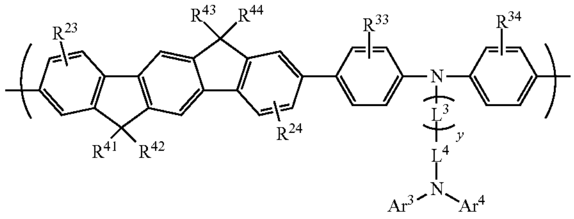

In Chemical Formula 2, $R^{41}$ to $R^{44}$, $R^{23}$, $R^{24}$, $R^{33}$, and $R^{34}$ are each independently a hydrogen atom, or a hydrocarbon group having 1 to 18 carbon atoms, wherein $R^{41}$ to $R^{44}$ are different from $R^{11}$ to $R^{14}$ of Chemical Formula 1, $L^3$ is a substituted or unsubstituted aromatic hydrocarbon group having 6 to 25 ring-forming atoms, or a substituted or unsubstituted heteroaromatic ring group having 5 to 14 ring-forming atoms, y is 0, 1, or 2, when y is 2, each occurrence of $L^3$ may be the same as or different from each other, $L^4$ is a substituted or unsubstituted aromatic hydrocarbon group having 6 to 25 ring-forming atoms, or a substituted or unsubstituted heteroaromatic ring group having 5 to 14 ring-forming atoms, wherein $L^4$ may form a ring with $Ar^3$, $Ar^3$ is a substituted or unsubstituted aromatic hydrocarbon group having 6 to 25 ring-forming atoms, or a substituted or unsubstituted heteroaromatic ring group having 5 to 14 ring-forming atoms, wherein $Ar^3$ may form a ring with $Ar^4$ or $L^4$, and $Ar^4$ is (i) an aromatic hydrocarbon group having 6 to 25 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms, or a heteroaromatic ring group having 5 to 14 ring-forming atoms, or (ii) an heteroaromatic ring group having 5 to 14 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms or a heteroaromatic ring group having 5 to 14 ring-forming atoms, wherein $Ar^4$ may form a ring with $Ar^3$.

According to an embodiment, durability, for example, luminescence lifespan of the electroluminescent device, in particular, the quantum dot electroluminescent device, may be improved.

BRIEF DESCRIPTION OF THE DRAWINGS

The FIGURE is a schematic view showing an electroluminescent device according to an embodiment.

DETAILED DESCRIPTION OF THE EMBODIMENTS

The inventors of the present disclosure conducted research intensively in order to solve the above problems described above with conventional luminescent devices and found that the above problems can be solved by using a polymeric compound including a structural unit represented by Chemical Formula 1.

(Chemical Formula 1)

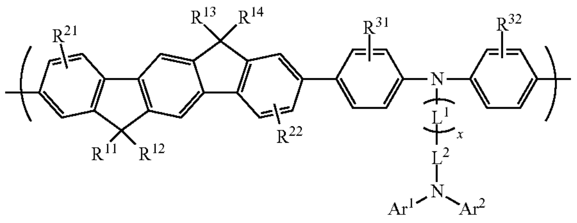

In Chemical Formula 1, $R^{11}$ to $R^{14}$, $R^{21}$, $R^{22}$, $R^{31}$, and $R^{32}$ are each independently a hydrogen atom or a hydrocarbon group having 1 to 18 carbon atoms, $L^1$ is a substituted or unsubstituted aromatic hydrocarbon group having 6 to 25 ring-forming atoms or a substituted or unsubstituted heteroaromatic ring group having 5 to 14 ring-forming atoms, x is 0, 1, or 2, and when x is 2, $L^1$ may be the same or different, respectively, $L^2$ is a substituted or unsubstituted aromatic hydrocarbon group having 6 to 25 ring-forming atoms or a substituted or unsubstituted heteroaromatic ring group having 5 to 14 ring-forming atoms, wherein $L^2$ may form a ring with $Ar^1$, $Ar^1$ is a substituted or unsubstituted aromatic hydrocarbon group having 6 to 25 ring-forming atoms or a substituted or unsubstituted heteroaromatic ring group having 5 to 14 ring-forming atoms, wherein $Ar^1$ may form a ring with $Ar^2$ or $L^2$, and $Ar^2$ is (i) an aromatic hydrocarbon group having 6 to 25 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms or a heteroaromatic ring group having 5 to 14 ring-forming atoms, or (ii) an heteroaromatic ring group having 5 to 14 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms or a heteroaromatic ring group having 5 to 14 ring-forming atoms, wherein $Ar^2$ may form a ring with $Ar^1$.

The polymeric compound according to an embodiment may further include a structural unit represented by Chemical Formula 2 together with the structural unit represented by Chemical Formula 1:

(Chemical Formula 2)

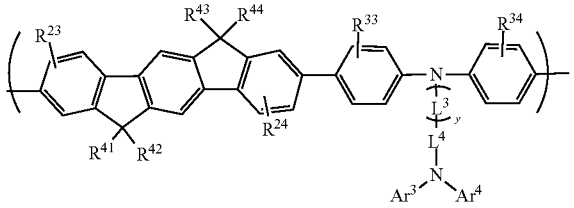

In Chemical Formula 2, $R^{41}$ to $R^{44}$, $R^{23}$, $R^{24}$, $R^{33}$, and $R^{34}$ are each independently a hydrogen atom, or a hydrocarbon group having 1 to 18 carbon atoms, wherein $R^{41}$ to $R^{44}$ are different from $R^{11}$ to $R^{14}$ of Chemical Formula 1, $L^3$ is a substituted or unsubstituted aromatic hydrocarbon group having 6 to 25 ring-forming atoms or a substituted or unsubstituted heteroaromatic ring group having 5 to 14 ring-forming atoms, y is 0, 1, or 2, when y is 2, each of $L^3$ may be the same as or different from each other, $L^4$ is a substituted or unsubstituted aromatic hydrocarbon group having 6 to 25 ring-forming atoms, or a substituted or unsubstituted heteroaromatic ring group having 5 to 14 ring-forming atoms, wherein $L^4$ may form a ring with $Ar^3$, $Ar^3$ is a substituted or unsubstituted aromatic hydrocarbon group having 6 to 25 ring-forming atoms, or a substituted or unsubstituted heteroaromatic ring group having 5 to 14 ring-forming atoms, wherein $Ar^3$ may form a ring with $Ar^4$ or $L^4$, and $Ar^4$ is (i) an aromatic hydrocarbon group having 6 to 25 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms, or a heteroaromatic ring group having 5 to 14 ring-forming atoms, or (ii) an heteroaromatic ring group having 5 to 14 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms or a heteroaromatic ring group having 5 to 14 ring-forming atoms, wherein $Ar^4$ may form a ring with $Ar^3$.

A second embodiment provides an electroluminescent device material including the polymeric compound according to the first embodiment.

A third embodiment provides an electroluminescent device including a first electrode, a second electrode, and one or more layers of an organic film between the first electrode and the second electrode, wherein at least one of the organic films includes the polymeric compound according to the first embodiment.

As used herein, the electroluminescent device is simply referred to as "LED."

The quantum dot electroluminescent device is also simply referred to as "QLED."

An organic electroluminescent device is also simply referred to as "OLED."

As used herein, the structural unit derived from indenofluorene of the polymeric compound according to the first embodiment is referred to as "structural unit A", and the structural unit other than the structural unit derived from indenofluorene is referred to as "structural unit B."

In addition, a structural unit in which structural units A and B are combined is referred to as "structural unit C."

For example, structural units A, B, and C in the structural unit of Chemical Formula 1 are as follows.

As used herein, when the polymeric compound includes both the structural unit of Chemical Formula 1 and the structural unit of Chemical Formula 2, unless otherwise specified, the structural unit of Chemical Formula 1 and the structural unit of Chemical Formula 2 are collectively referred to as "structural unit C."

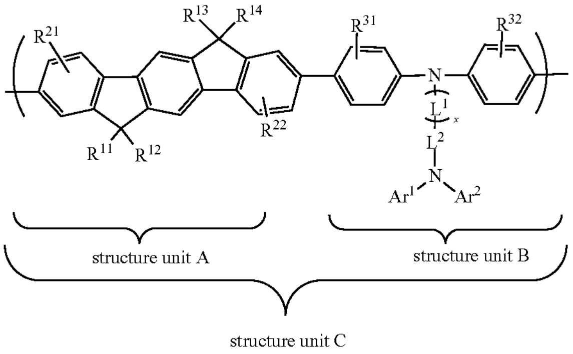

As used herein, the number of ring-forming atoms refers to the number of atoms constituting a ring itself in a structure in which atoms are bonded in a ring (for example, a monocyclic ring, a condensed ring, and a ring assembled) compounds (e.g., monocyclic compounds, condensed ring compounds, bridged ring compounds, carbocyclic compounds, and heterocyclic compounds). Atoms not constituting the ring, for example, hydrogen atoms terminating bonds of atoms constituting the ring or atoms included as substituents when the ring is substituted by substituents are not included in the number of ring-forming atoms. The number of ring-forming atoms described below has the same meaning unless otherwise specified.

For example, a benzene ring has 6 ring-forming atoms, a naphthalene ring has 10 ring-forming atoms, a pyridine ring has 6 ring-forming atoms, and a furan ring has 5 ring-forming atoms.

When the benzene ring is substituted with, for example, an alkyl group as a substituent, the number of carbon atoms in the alkyl group is not included in the number of ring-forming atoms in the benzene ring. Therefore, the number of ring-forming atoms of the benzene ring substituted with an alkyl group is 6. Further, when the naphthalene ring is substituted with, for example, an alkyl group as a substituent, the number of atoms of the alkyl group is not included in the number of ring-forming atoms of the naphthalene ring. For this reason, the number of ring-forming atoms in the naphthalene ring in which the alkyl group is substituted is 10.

For example, the number of hydrogen atoms bonded to the pyridine ring or atoms constituting the substituent is not included in the number of ring-forming atoms of the pyridine ring. For this reason, the number of ring-forming atoms in the pyridine ring to which a hydrogen atom or a substituent is bonded is 6.

Various low-molecular materials and polymeric compounds are used as materials constituting the light emitting layer and the carrier transport layer of conventional electroluminescent devices. For example, as a polymer material, TFB (for example, Paragraph [0037]) is reported in JP 2010-199067 A, and an alternating copolymer of fluorene and an arylamine having a specific structure (claims) is reported in JP 2021-138915 A, respectively.

The inventors of the present disclosure have found that by incorporating a structural unit derived from indenofluorene into a polymer material, that durability is improved, for example, by improving device lifespan and luminescence lifespan, compared to conventional polymer materials, in particular, those polymer materials including the arylamine-fluorene alternating copolymer of JP 2021-138915 A. In particular, it was found that durability, for example, device lifespan and luminescence lifespan, could be further improved by replacing the structural unit derived from fluorene used in the conventional devices with a structural unit derived from indenofluorene.

Without wishing to be bound by any particular theory, a mechanism for exerting the above action and effect is proposed as follows.

The arylamine structure in the structural unit A and the structural unit B, particularly, the structural unit B [-$L^2$-N($Ar^1$)($Ar^2$) in Chemical Formula 1 or -$L^4$-N($Ar^3$)($Ar^4$) in Chemical Formula 2] has many resonance structures such as a condensed ring. For this reason, the structural unit C has a stable skeleton with high resonance energy. Therefore, the bond dissociation energy (BDE) of the C—N bond in the exciton state and the anion state is high (strong for excitons and electrons). In particular, by applying the structural unit derived from indenofluorene to the structural unit A, the bond dissociation energy of the C—N bond in the exciton state may be increased compared to the structural unit derived from fluorene as described in JP 2021-138915 A. A hole transport layer or a hole injection layer using the polymeric compound according to an embodiment may easily maintain its structure even when electrons leaked from the electron transport layer or excitons generated by recombination of electrons and holes are present. Therefore, the electroluminescent device using the polymeric compound according to the embodiment, e.g., the quantum dot electroluminescent device, may further improve durability, e.g., device lifespan or luminescence lifespan, and the like.

Further, in the structural unit (structural unit C) of Chemical Formula 1 or Chemical Formula 2, a nitrogen atom cleaves the conjugation of the main chain. Accordingly, a triplet energy level of the polymeric compound may increase, bulk mobility of holes along the main chain may become high, and high current efficiency may be achieved. Therefore, an electroluminescent device using the polymeric compound (main chain) according to the present disclosure, for example, a quantum dot electroluminescent device, may achieve improved luminous efficiency. In addition, since the conjugation of the main chain of the structural unit C is interrupted with the nitrogen atom, the polymeric compound according to an embodiment exhibits properties of a low molecular compound having a close energy level to that of the quantum dots even when polymerized. For this reason, an electroluminescent device using a polymeric compound according to an embodiment, for example, a quantum dot electroluminescent device, suppresses an increase in driving voltage and makes it possible to lower the driving voltage.

In addition, since the polymeric compound according to an embodiment has improved film-forming properties and solvent solubility, it is possible to form a film using a wet (coating) method. Therefore, by using the polymeric compound according to an embodiment, it is possible to increase the area of the electroluminescent device and to achieve high productivity. The above effects may be effectively exhibited when the polymeric compound according to an embodiment is applied to a hole transport layer or a hole injection layer of an EL device, particularly a QLED.

On the other hand, the mechanism is based on speculation, and the present disclosure is not limited to the mechanism at all.

Hereinafter, the polymeric compounds and the electroluminescent devices including the polymeric compounds are described in more detail.

On the other hand, the present disclosure is not limited to the following embodiments, and may be variously changed within the scope of the claims. In addition, unless otherwise noted, operation and measurement of physical properties are measured at room temperature (20° C. or higher and 25° C. or lower)/relative humidity 40% RH or higher and 50% RH or lower.

In addition, each drawing is exaggerated for better understanding and ease of description, and a dimensional ratio in each drawing may be different from the actual one.

As used herein, "X and Y are each independently" means that X and Y may be the same or different. As used herein, "X and/or Y" means including at least one of X and Y, and includes "X alone," "Y alone," and "a combination of X and Y."

[Polymeric Compound]

A polymeric compound according to an embodiment includes a structural unit represented by Chemical Formula 1. Alternatively, the polymeric compound according to an embodiment includes a structural unit represented by Chemical Formula 1 and a structural unit represented by Chemical Formula 2. A polymeric compound including such a structural unit has a stable skeleton with high resonance energy and high C—N bond dissociation energy. In addition, the polymeric compound has high hole injection and transport properties into quantum dots. Therefore, durability (device lifespan or luminescence lifespan) may be further improved. In addition, high current efficiency and low driving voltage may be achieved.

(Chemical Formula 1)

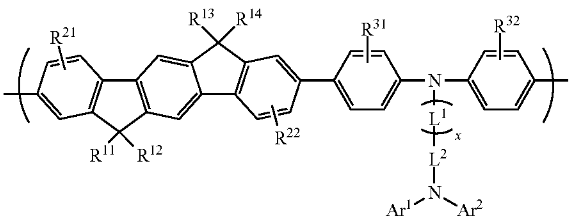

Chemical Formula 2)

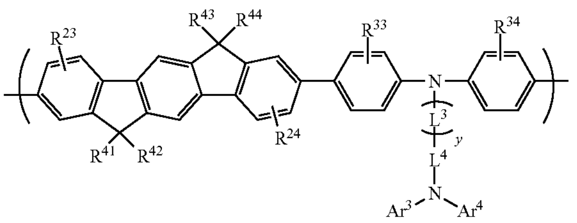

The structural unit represented by Chemical Formula 1 and the structural unit represented by Chemical Formula 2 have structures different from each other in that at least $R^{11}$ to $R^{14}$ are different from $R^{41}$ to $R^{44}$.

As used herein, "the polymeric compound containing the structural unit represented by Chemical Formula 1" means that the polymeric compound includes at least one structural unit C. In addition, "the polymeric compound including the structural unit represented by Chemical Formula 1 and the structural unit represented by Chemical Formula 2" means that the polymeric compound includes at least two types of structural units C.

In other words, the polymeric compound according to an embodiment may include one type of structural unit C, or may include two or more types of structural units C. From the viewpoint of further improving the effect according to an embodiment, the structural unit C in the polymeric compound according to an embodiment may be one or two types, for example, two types. For example, by including two types of different structural units C, desired properties such as durability, glass transition temperature, etc. may be more appropriately and more easily controlled.

In Chemical Formula 1, $R^{11}$ to $R^{14}$, $R^{21}$, $R^{22}$, $R^{31}$, and $R^{32}$ are each independently a hydrogen atom or a hydrocarbon group having 1 to 18 carbon atoms and may be the same or different from each other.

From the viewpoint of further improving the effect according to an embodiment, at least one pair of $R^{11}$ and $R^{12}$, and $R^{13}$, and $R^{14}$ may be the same, and for example, all of $R^{11}$ to $R^{14}$ may be the same.

For example, $R^{21}$ and $R^{22}$ may be the same or different from each other, and for example, $R^{21}$ and $R^{22}$ may be the same.

For example, $R^{31}$ and $R^{32}$ may be the same or different from each other, and for example, $R^{31}$ and $R^{32}$ may be the same.

In Chemical Formula 2, $R^{41}$ to $R^{44}$, $R^{23}$, $R^{24}$, $R^{33}$, and $R^{34}$ are each independently a hydrogen atom or a hydrocarbon group having 1 to 18 carbon atoms. In this case, $R^{41}$ to $R^{44}$ of Chemical Formula 2 are different from $R^{11}$ to $R^{14}$ of Chemical Formula 1.

$R^{41}$ to $R^{44}$, $R^{23}$, $R^{24}$, $R^{33}$, and $R^{34}$ may be the same as or different from each other.

From the viewpoint of further improving the effect according to an embodiment, at least one pair of $R^{41}$ and $R^{42}$ and $R^{43}$ and $R^{44}$ may be the same, and for example, all of $R^{41}$ to $R^{44}$ may be the same.

For example, $R^{23}$ and $R^{24}$ may be the same or different from each other, and for example, $R^{23}$ and $R^{24}$ may be the same.

For example, $R^{33}$ and $R^{34}$ may be the same or different from each other, and for example, $R^{33}$ and $R^{34}$ may be the same.

The hydrocarbon group having 1 to 18 carbon atoms is not particularly limited, and examples thereof include a linear or branched alkyl group, a linear or branched alkenyl group, a linear or branched alkynyl group, and a cycloalkyl group. On the other hand, when the hydrocarbon group is an alkenyl group or an alkynyl group, the hydrocarbon group has 2 to 18 carbon atoms. Similarly, when the hydrocarbon group is a cycloalkyl group, the hydrocarbon group has 3 to 18 carbon atoms.

Examples of the alkyl group having 1 to 18 carbon atoms may include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, and the like, but are not limited thereto.

Examples of the alkenyl group having 2 to 18 carbon atoms include a vinyl group, an allyl group, a 1-propenyl group, a 2-butenyl group, a 1,3-butadienyl group, a 2-pentenyl group, an isopropenyl group, and the like, but are not limited thereto.

Examples of the alkynyl group having 2 to 18 carbon atoms include an ethynyl group and a propargyl group, but are not limited thereto.

Examples of the cycloalkyl group having 3 to 18 carbon atoms include a cyclopropyl group, a cyclobutyl group, a cyclopentyl group, and a cyclohexyl group, but are not limited thereto.

At least two of $R^{11}$ to $R^{14}$ and/or at least two of $R^{41}$ to $R^{44}$ may be a hydrocarbon group having 1 to 18 carbon atoms; for example, at least three of $R^{11}$ to $R^{14}$ and/or at least three of $R^{41}$ to $R^{44}$ may be a hydrocarbon group having 1 to 18 carbon atoms; or all of $R^{11}$ to $R^{14}$ and all of $R^{41}$ to $R^{44}$ may be a hydrocarbon group having 1 to 18 carbon atoms.

As described above, as the number of hydrocarbon groups in the indenofluorene ring is increased, hole injection and transport properties are improved, and thus durability (device lifespan) may be further improved.

In addition, the hydrocarbon group as $R^{11}$ to $R^{14}$ or $R^{41}$ to $R^{44}$ may be a linear alkyl group having 1 to 18 carbon atoms or a branched alkyl group having 3 to 18 carbon atoms. For example, the hydrocarbon group as $R^{11}$ to $R^{14}$ or $R^{41}$ to $R^{44}$ may be a linear alkyl group having 3 to 14 carbon atoms or a branched alkyl group having 3 to 14 carbon atoms.

In particular, when the structural unit C in the polymeric compound is one type (the polymeric compound includes the structural unit of Chemical Formula 1), the hydrocarbon group as $R^{11}$ to $R^{14}$ may be a linear alkyl group having 6 to 12 carbon atoms, for example, a linear alkyl group having 7 to 9 carbon atoms, for example, an n-octyl group.

As such, when the number of carbon atoms of the hydrocarbon group in the indenofluorene ring is within the above range, in a quantum dot electroluminescent device including a hole transport layer including the polymeric compound and a light emitting layer including quantum dots, the hydrocarbon groups in the indenofluorene ring of the polymeric compound in the hole transport layer and quantum dots included in the light emitting layer exist more closely (the hydrocarbon groups interact more closely with the quantum dots). Accordingly, the hole injection and transport properties are further improved, and the durability (device lifespan or luminescence lifespan) may be further improved.

In addition, when the polymeric compound has two types of structural units C (the polymeric compound includes the structural unit of Chemical Formula 1 and the structural unit of Chemical Formula 2), in the combination of $R^{11}$ to $R^{14}$ of Chemical Formula 1 and $R^{41}$ to $R^{44}$ of Chemical Formula 2, any one may be a hydrocarbon group having a lower carbon number and the other may be a hydrocarbon group having a higher carbon number. In an embodiment, the polymeric compound includes the structural unit represented by Chemical Formula 1 and the structural unit represented by Chemical Formula 2, wherein $R^{11}$ to $R^{14}$ in Chemical Formula 1 may be a hydrocarbon group having 1 to 9 carbon atom and $R^{41}$ to $R^{44}$ in Chemical Formula 2 may be a hydrocarbon group having 10 to 18 carbon atoms.

In an embodiment, the polymeric compound includes the structural unit represented by Chemical Formula 1 and the structural unit represented by Chemical Formula 2, wherein $R^{11}$ to $R^{14}$ of Chemical Formula 1 may each independently be a hydrocarbon group having 3 to 9 carbon atoms and $R^{41}$ to $R^{44}$ in Chemical Formula 2 may each independently be a hydrocarbon group having 10 to 14 carbon atoms.

In another embodiment, the polymeric compound includes the structural unit represented by Chemical Formula 1 and the structural unit represented by Chemical Formula 2, wherein $R^{11}$ to $R^{14}$ in Chemical Formula 1 may each independently be a linear or branched alkyl group having 5 to 7 carbon atoms and $R^{41}$ to $R^{44}$ in Chemical Formula 2 may each independently be a linear or branched alkyl group having 11 to 13 carbon atoms.

In another embodiment, the polymeric compound includes the structural unit represented by Chemical Formula 1 and the structural unit represented by Chemical Formula 2, wherein $R^{11}$ to $R^{14}$ in Chemical Formula 1 is an n-hexyl group and $R^{41}$ to $R^{44}$ in Chemical Formula 2 is an n-dodecyl group.

In the above embodiments, $R^{11}$ to $R^{14}$ may be the same or different, but, for example, they may all be the same. Similarly, $R^{41}$ to $R^{44}$ may be the same as or different from each other, but, for example, they may all be the same. That is, in an embodiment, all of $R^{11}$ to $R^{14}$ may be the same, and also all of $R^{41}$ to $R^{44}$ may be the same.

By combining $R^{11}$ to $R^{14}$ and $R^{41}$ to $R^{44}$ among the two structural units C in the polymeric compound as described above, hole injection and transport properties, and thus durability and film-forming properties, for example, glass transition temperatures, may be adjusted in an appropriate balance.

Further, $R^{21}$, $R^{22}$, $R^{31}$, $R^{32}$, $R^{23}$, $R^{24}$, $R^{33}$, and $R^{34}$ may each independently be a hydrogen atom (unsubstituted), a linear alkyl group having 1 to 8 carbon atoms, or a branched alkyl group having 3 to 8 carbon atoms, and may be, for example, a hydrogen atom (unsubstituted), a linear alkyl group having 3 to 6 carbon atoms, and may be, for example, a hydrogen atom (unsubstituted).

In Chemical Formula 1, $L^1$ is a substituted or unsubstituted aromatic hydrocarbon group having 6 to 25 ring-forming atoms or a substituted or unsubstituted heteroaromatic ring group having 5 to 14 ring-forming atoms.

In Chemical Formula 2, $L^3$ is a substituted or unsubstituted aromatic hydrocarbon group having 6 to 25 ring-forming atoms or a substituted or unsubstituted heteroaromatic ring group having 5 to 14 ring-forming atoms. When the polymeric compound according to an embodiment includes the structural unit of Chemical Formula 1 and the structural unit of Chemical Formula 2, $L^1$ of Chemical Formula 1 and $L^3$ of Chemical Formula 2 may be the same or different from each other, and may be, for example, the same.

Herein, the aromatic hydrocarbon group may include a group derived from aromatic hydrocarbons such as benzene (phenylene group), pentane, indene, naphthalene, anthracene, azulene, acenaphthene, phenalene, fluorene, phenanthrene, biphenyl, terphenyl, quaterterphenyl, pyrene, 9,9-diphenyl fluorene, 9,9'-spirobi[fluorene], 9,9-dialkyl fluorene, and the like.

In addition, the heteroaromatic ring group may include a group derived from heteroaromatic ring groups such as pyridine, pyrazine, pyridazine, pyrimidine, triazine, quinoline, isoquinoline, quinoxaline, quinazoline, naphthyridine, acridine, phenazine, benzoquinoline, benzoisoquinoline, phenanthridine, phenanthroline, benzoquinone, coumarin, fluorenone, furan, thiophene, benzofuran, benzothiophene, dibenzofuran, dibenzothiophene, pyrrole, indole, carbazole, imidazole, benzimidazole, pyrazole, indazole, oxazole, isoxazole, benzoxazole, benzoisoxazole, thiazole, isothiazole, benzothiazole, benzoisothiazole, imidazolinone, benzimidazolinone, imidazopyridine, imidazo pyrimidine, azadibenzofuran, azacarbazole, azadibenzothiophene, diazadibenzofuran, diazacarbazole, diazadibenzothiophene, xanthone, thioxanthone, and the like.

Among these, $L^1$ and $L^3$ may each independently be a group derived from a compound selected from benzene, fluorene, dibenzofuran, dibenzothiophene, or biphenyl. For example, $L^1$ and $L^3$ may each independently be a group derived from a compound selected from benzene (o, m, or p-phenylene group), dibenzofuran, or fluorene.

$L^1$ and $L^3$ may each independently be a phenylene group, for example, an m-phenylene group or a p-phenylene group, for example, a p-phenylene group. With such $L^1$ or $L^3$, a higher bond dissociation energy may be achieved. In addition, viewpoints of a higher hole injection and transport properties and triplet energy level, a lower driving voltage, and film-forming properties, and a balance of any two or more of these (particularly, a balance between hole injection transport properties and film-forming properties) may be achieved.

$L^1$ or $L^3$ may each be unsubstituted, or any one of the hydrogen atoms may be substituted with a substituent.

Herein, when any one of $L^1$ or $L^3$ is substituted, the number of introduced substituents is not particularly limited, but may be, for example, 1 to 3, for example, 1 to 2, or for example, 1.

In an embodiment, $L^1$ and $L^3$ may be unsubstituted.

In another embodiment, $L^1$ or $L^3$ may have one substituent.

When $L^1$ or $L^3$ has a substituent, a binding position of the substituent is not particularly limited.

The substituent may be, for example, located as far as possible from the nitrogen atom of the main chain to which $L^1$ or $L^3$ is linked. For example, when $L^1$ or $L^3$ is a p-phenylene group, the substituent may be located at a meta position to the bond linked to the nitrogen atom of the main chain. A higher bond dissociation energy may be achieved by the presence of a substituent at such a position. In addition, higher hole injection and transport properties and triplet energy levels, lower driving voltages, and film-forming properties, and a balance of any two or more of these (particularly, a balance of hole injection and transport properties and film-forming properties) may be achieved.

In addition, when any hydrogen atom in $L^1$ or $L^3$ is substituted, the substituent that may be present is not particularly limited, and may be an alkyl group, a cycloalkyl group, a hydroxyalkyl group, an alkoxyalkyl group, an alkoxy group, a cycloalkoxy group, an alkenyl group, an alkynyl group, an amino group, an aryl group, an aryloxy group, an alkylthio group, a cycloalkylthio group, an arylthio group, an alkoxycarbonyl group, an aryloxycarbonyl group, a hydroxy group (—OH), a carboxy group (—COOH), a thiol group (—SH), a cyano group (—CN), and the like.

Herein, the alkyl group may be either linear or branched, and examples thereof may be a linear alkyl group having 1 to 18 carbon atoms or a branched alkyl group having 3 to 18 carbon atoms.

For example, the alkyl group may include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, 3,5,5-trimethyl hexyl group, an n-decyl group, an isodecyl group, an n-undecyl group, a 1-methyldecyl group, an n-dodecyl group, an n-tridecyl group, an n-tetra decyl group, an n-penta decyl group, an n-hexadecyl group, an n-heptadecyl group, an n-octadecyl group, and the like.

The cycloalkyl group may include, for example, a cyclopropyl group, a cyclobutyl group, a cyclopentyl group, a cyclohexyl group, and the like.

The hydroxyalkyl group may be, for example, an alkyl group that is substituted with 1 to 3 hydroxy groups, for example 1 or 2 hydroxy groups, for example, one hydroxy group (e.g., a hydroxymethyl group, a hydroxyethyl group, etc.).

The alkoxyalkyl group may be, for example, an alkyl group that is substituted with 1 to 3, for example 1 or 2, for example, one of the following alkoxy groups.

For example, the alkoxy group may include a methoxy group, an ethoxy group, a propoxy group, an isopropoxy group, a butoxy group, a pentoxy group, a hexyloxy group, a heptyloxy group, an octyloxy group, a nonyloxy group, decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, and the like.

The cycloalkoxy group may include, for example, a cyclopropyl group, a cyclobutyl group, a cyclopentyl group, a cyclohexyl group, and the like.

The alkenyl group may include, for example, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, and the like.

The alkynyl group may include, for example, an ethynyl group, a 1-propynyl group, a propargyl group, a 1-butynyl group, a 2-butynyl group, a 3-butynyl group, a 1-pentynyl group, a 2-pentynyl group, a 3-pentynyl group, a 1-hexynyl group, a 2-hexynyl group, a 3-hexynyl group, a 1-heptynyl group, a 2-heptynyl group, a 5-heptynyl group, a 1-octynyl group, a 3-octynyl group, a 5-octynyl group, and the like.

The aryl group may include, for example, a phenyl group, a naphthyl group, a biphenyl group, a fluorenyl group, an anthryl group, a pyrenyl group, an azulenyl group, an acenaphthylenyl group, a terphenyl group, a phenanthryl group, and the like.

The aryloxy group may include, for example, a phenoxy group, and a naphthyloxy group.

The alkylthio group may include, for example, a methylthio group, an ethylthio group, a propylthio group, a pentylthio group, a hexylthio group, an octylthio group, a dodecylthio group, and the like.

The cycloalkylthio group may include, for example, a cyclopentylthio group, a cyclohexylthio group, and the like.

The arylthio group may include, for example, a phenylthio group, a naphthylthio group, and the like.

The alkoxycarbonyl group may include, for example, a methyloxy carbonyl group, an ethyloxy carbonyl group, a butyloxy carbonyl group, an octyloxy carbonyl group, a dodecyloxy carbonyl group, and the like.

The aryloxycarbonyl group may include, for example, a phenyloxy carbonyl group, a naphthyloxy carbonyl group, and the like.

Among these, when any one hydrogen atom of $L^1$ or $L^3$ is replaced with a substituent, the substituent that may be present may be a linear or branched alkyl group having 1 to 8 carbon atoms, and for example, a linear or branched alkyl group having 1 to 3 carbon atoms, for example, a methyl group.

Among the above, $L^1$ and $L^3$ may each independently be a group selected from the following groups.

In an embodiment, x in Chemical Formula 1 may be 1 or 2 (e.g., 1), and each occurrence of $L^1$ may independently be a group selected from the following groups.

In an embodiment, y in Chemical Formula 2 may be 1 or 2 (e.g., 1) and each occurrence of $L^3$ may each independently be a group selected from the following groups.

In the following structures, $R^{111}$ to $R^{125}$ may each independently be a hydrogen atom, a linear hydrocarbon group having 1 to 18 carbon atoms, or a branched hydrocarbon group having 3 to 18 carbon atoms (for example, $R^{111}$ to $R^{125}$ may be a hydrogen atom or a methyl group, and for example, $R^{111}$ to $R^{125}$ may be a hydrogen atom).

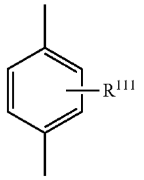

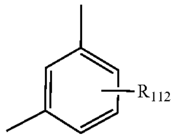

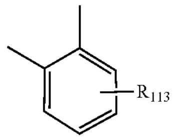

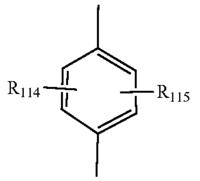

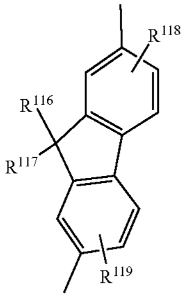

-continued

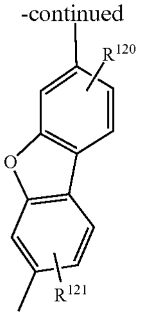

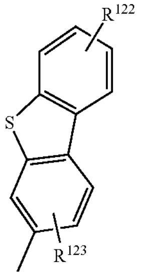

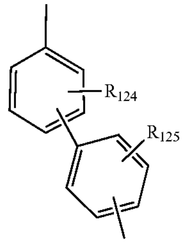

In Chemical Formula 1, x may be 0, 1, or 2.

When x is 2, $L^1$ may be the same or different from each other.

In addition, when x is 0, $L^1$ may be a single bond, and the nitrogen atom of the main chain may be directly bonded to $L^2$.

From the viewpoint of further improving the effect according to an embodiment, x may be 0 or 1, and for example, x may be 1.

In Chemical Formula 2, y may be 0, 1, or 2.

When y is 2, each occurrence of $L^3$ may be the same or different from each other.

In addition, when y is 0, $L^3$ may be a single bond, and the nitrogen atom of the main chain may be directly bonded to $L^4$.

From the viewpoint of further improving the effect according to an embodiment, y may be 0 or 1, and for example, 1.

The x in Chemical Formula 1 and y in Chemical Formula 2 may be the same or different from each other, but, for example, may be the same.

In Chemical Formula 1, $L^2$ may be a substituted or unsubstituted aromatic hydrocarbon group having 6 to 25 carbon atoms, or a substituted or unsubstituted heteroaromatic ring group having 5 to 14 ring-forming atoms. $L^2$ may form a ring with $Ar^1$.

In Chemical Formula 2, $L^4$ may be a substituted or unsubstituted aromatic hydrocarbon group having 6 to 25 carbon atoms, or a substituted or unsubstituted heteroaromatic ring group having 5 to 14 ring-forming atoms. $L^4$ may form a ring with $Ar^3$.

When the polymeric compound includes the structural unit of Chemical Formula 1 and the structural unit of Chemical Formula 2, $L^2$ of Chemical Formula 1 and $L^4$ of Chemical Formula 2 may be the same or different from each other, and for example, they may be the same.

Herein, the aromatic hydrocarbon group and heteroaromatic ring group as $L^2$ or $L^4$ are not particularly limited.

When $L^2$ does not form a ring with $Ar^1$, or when $L^4$ does not form a ring with $Ar^3$, groups derived from aromatic hydrocarbons having 6 to 25 ring-forming atoms defined for $L^1$ and $L^3$ may be exemplified.

Similarly, in the above case, the heteroaromatic ring group as $L^2$ or $L^4$ is not particularly limited, but groups derived from heteroaromatic ring groups defined for $L^1$ and $L^3$ may be exemplified.

Further, when $L^2$ forms a ring with $Ar^1$ or $L^4$ forms a ring with $Ar^3$, they may be exemplified by a group derived from an aromatic hydrocarbon having 6 to 25 ring-forming atoms defined in $L^1$ and LP.

Similarly, in the above case, the heteroaromatic ring group as $L^2$ or $L^4$ is not particularly limited, but may be exemplified by a group derived from the heteroaromatic ring groups defined for $L^1$ and LP.

Among these, $L^2$ and $L^4$ may each independently be a group derived from benzene, fluorene, dibenzofuran, dibenzothiophene, or biphenyl. For example, $L^2$ and $L^4$ may each independently be a group derived from benzene, fluorene, and dibenzofuran, for example, an o, m, or p-phenylene group, or a trivalent group; and for example, a 1,3,4-phenylene group. For example, $L^2$ and $L^4$ may each independently be a divalent (phenylene group) derived from benzene (particularly, a p-phenylene group) or a trivalent group (particularly, a 1,3,4-phenylene group).

With such $L^2$ or $L^4$ groups, a higher bond dissociation energy may be achieved.

In addition, higher hole injection and transport properties and triplet energy level, lower driving voltages, and film-forming properties, and a balance of two or more of these (particularly, a balance between hole injection and transport property and film-forming properties) may be achieved.

In an embodiment, $L^2$ or $L^4$ may be unsubstituted, or any one hydrogen atom may be substituted with a substituent. In addition, when any one hydrogen atom in $L^2$ or $L^4$ is substituted with a substituent, substituents that may be present are not particularly limited, and the same examples as in $L^1$ and $L^3$ may be applied. For example, $L^2$ or $L^4$ may be unsubstituted.

In Chemical Formula 1, $Ar^1$ may be a substituted or unsubstituted aromatic hydrocarbon group having 6 to 25 ring-forming atoms, or a substituted or unsubstituted heteroaromatic ring group having 5 to 14 ring-forming atoms.

In Chemical Formula 2, $Ar^3$ may be a substituted or unsubstituted aromatic hydrocarbon group having 6 to 25 ring-forming atoms, or a substituted or unsubstituted heteroaromatic ring group having 5 to 14 ring-forming atoms.

When the polymeric compound includes the structural unit of Chemical Formula 1 and the structural unit of Chemical Formula 2, $Ar^1$ of Chemical Formula 1 and $Ar^3$ of Chemical Formula 2 may be the same or different from each other, and for example, they may be the same.

Herein, the aromatic hydrocarbon group having 6 to 25 ring-forming atoms as $Ar^1$ or $Ar^3$ is not particularly limited, but examples thereof include groups derived from aromatic hydrocarbons having 6 to 25 ring-forming atoms as defined for $L^1$ and $L^3$.

Similarly, the heteroaromatic ring group as $Ar^1$ or $Ar^3$ is not particularly limited, but may be exemplified by a group derived from the heteroaromatic ring groups defined for $L^1$ and $L^3$. Among these, $Ar^1$ and $Ar^3$ may each independently be selected from a phenylene group, a biphenylene group, a dibenzofuranylene group, a dibenzothiophenylene group, and a fluorenylene group. For example, $Ar^1$ and $Ar^3$ may each independently be a phenylene group (o, m, or p-phenylene group). For example, $Ar^1$ and $Ar^3$ may be an o-phenylene group.

With such $Ar^1$ or $Ar^3$ groups, a higher bond dissociation energy may be achieved. In addition, higher hole injection and transport properties and triplet energy level, lower driving voltages, film-forming properties, and a balance of any two or more of these (particularly, a balance between hole injection transport properties and film-forming properties) may be achieved.

$Ar^1$ or $Ar^3$ may be unsubstituted, or any hydrogen atom may be substituted with a substituent.

When any one of $Ar^1$ or $Ar^3$ is substituted, substituents that may be present are not particularly limited, and the same examples as $L^1$ and $L^3$ may be applied.

For example, $Ar^1$ and $Ar^3$ may each independently be a group derived from benzene that is unsubstituted or substituted with a linear alkyl group having 3 to 10 carbon atoms or a branched alkyl group having 3 to 10 carbon atoms, biphenyl that is unsubstituted or substituted with a linear alkyl group having 3 to 10 carbon atoms or a branched alkyl group having 3 to 10 carbon atoms, and fluorene that is unsubstituted or substituted with a linear alkyl group having 3 to 10 carbon atoms or a branched alkyl group having 3 to 10 carbon atoms. For example, $Ar^1$ and $Ar^3$ may each independently be an o, m, or p-phenylene group that is unsubstituted or substituted with a linear alkyl group having 3 to 10 carbon atoms or a branched alkyl group having 3 to 10 carbon atoms. Further, for example, $Ar^1$ and $Ar^3$ may each independently be an o-phenylene group that is unsubstituted or substituted with a linear alkyl group having 5 to 8 carbon atoms. For example, $Ar^1$ and $Ar^3$ may be an unsubstituted o-phenylene group.

When $Ar^1$ or $Ar^3$ has a substituent, that is, a substituted aromatic hydrocarbon group having 6 to 25 carbon atoms or a substituted heteroaromatic ring group, the position of the substituent is not particularly limited, but may be located as faraway as possible from the nitrogen atom bonded to $Ar^1$ or $Ar^3$. For example, when $Ar^1$ or $Ar^3$ is an o-phenylene group, the substituent may be at a para position to the nitrogen atom. With this arrangement, a distance between the polymeric compound and the quantum dot becomes closer, and an interaction between the polymeric compound in the hole transport layer and the quantum dot in the light emitting layer becomes stronger, so that hole injection and transport properties and thus durability (device lifespan or luminescence lifespan) may be further improved.

In Chemical Formula 1, $Ar^1$ may form a ring with $Ar^2$ or $L^2$.

In Chemical Formula 2, $Ar^3$ may form a ring with $Ar^4$ or $L^4$.

In this way, when $Ar^1$ forms a ring with $Ar^2$ or $L^2$ and $Ar^3$ forms a ring with $Ar^4$ or $L^4$, a higher triplet energy level may be imparted. Among these, from the viewpoint of further improving the effect according to an embodiment, $Ar^1$ forms a ring with $L^2$ and/or $Ar^3$ forms a ring with $L^4$, and for example, $Ar^1$ forms a ring with $L^2$ and $Ar^3$ may form a ring with $L^4$.

That is, in an embodiment, $Ar^1$ forms a ring with $L^2$, or $Ar^3$ forms a ring with $L^4$.

In another embodiment, $Ar^1$ forms a ring with $L^2$, and $Ar^3$ forms a ring with $L^4$.

The ring structure formed by $Ar^1$ and $L^2$ when $Ar^1$ forms a ring with $L^2$, or the ring structure formed by $Ar^3$ and $L^4$ when $Ar^3$ forms a ring with $L^4$ is not particularly limited, but at least one of the ring structure formed by $Ar^1$ and $L^2$, and the ring structure formed by $Ar^3$ and $L^4$ may be a carbazole ring, and $Ar^1$ and $L^2$ and $Ar^3$ and $L^4$ may form a carbazole ring.

That is, in an embodiment, $-L^2-N(Ar^1)(Ar^2)$ of Chemical Formula 1 may have a structure selected from the following groups. In addition, in an embodiment, $-L^4-N(Ar^3)(Ar^4)$ of Chemical Formula 2 may have a structure selected from the following groups.

In the following structures, $R^{211}$ to $R^{214}$ may each independently be a hydrogen atom or a linear or branched alkyl group having 3 to 10 carbon atoms. For example, $R^{211}$ to $R^{214}$ are hydrogen atoms.

In the following structures, "*1" indicates a binding site to $L^1$ or $L^3$, and "*2" indicates a binding site to $Ar^2$ or $Ar^4$.

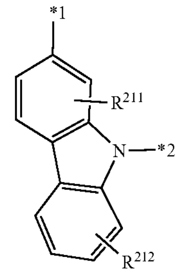

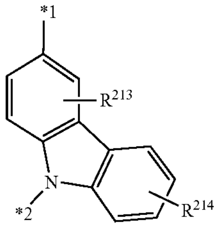

For example, at least one of $Ar^1$ and $L^2$, and $Ar^3$ and $L^4$ form a carbazole ring of the following structures. For example, $Ar^1$ and $L^2$, and $Ar^3$ and $L^4$ may form a carbazole ring having the following structure.

In the following structures, $R^{211}$ to $R^{214}$ may each independently be a hydrogen atom or a linear or branched alkyl group having 3 to 10 carbon atoms. For example, $R^{211}$ to $R^{214}$ are hydrogen atoms. In the following structures, "*1" is a binding site to $L^1$ or $L^3$, and "*2" is a binding site to $Ar^2$ or $Ar^4$.

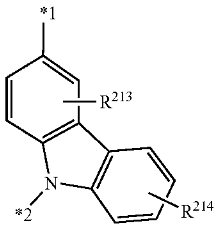

In an embodiment, in Chemical Formula 1, $Ar^1$ may form a ring with $L^2$, and $-(L^1)x-L^2-N(Ar^1)(Ar^2)$ may have a structure selected from the following groups.

In an embodiment, in Chemical Formula 2, $Ar^3$ forms a ring with $L^4$, and $-(L^3)_y-L^4-N(Ar^3)(Ar^4)$ may have a structure selected from the following groups.

In the following structures, "*1" represents a binding site to a nitrogen atom of the main chain, and "*2" represents a binding site to $Ar^2$ or $Ar^4$.

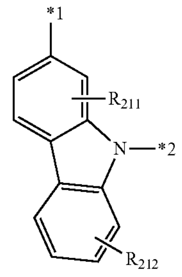

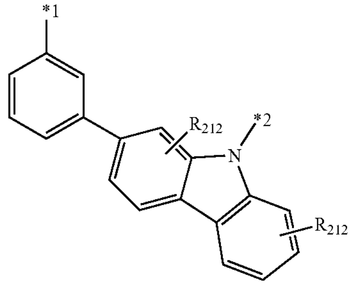

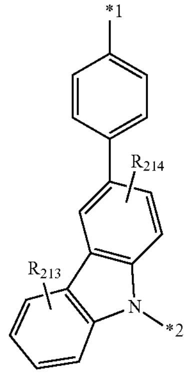

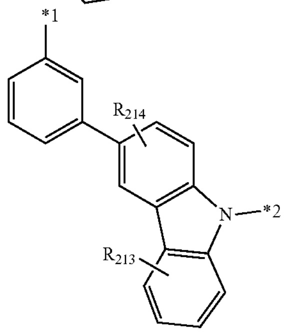

$R^{211}$ to $R^{214}$ are each independently a hydrogen atom, a linear alkyl group having 3 to 10 carbon atoms, or a branched alkyl group having 3 to 10 carbon atoms. For example, $R^{211}$ and $R^{213}$ are a hydrogen atom and $R^{212}$ and $R^{214}$ are hydrogen atom or a linear alkyl group having 5 to 8 carbon atoms.

In Chemical Formula 1, $Ar^2$ is (i) an aromatic hydrocarbon group having 6 to 25 ring-forming atoms that is substituted with a linear hydrocarbon group having 1 to 12 carbon atoms, a branched hydrocarbon group having 3 to 12 carbon atoms, an aromatic hydrocarbon group having 6 to 25 ring-forming atoms, or a divalent heteroaromatic ring group having 5 to 14 ring-forming atoms, or (ii) an heteroaromatic ring group having 5 to 14 ring-forming atoms that is substituted with a linear hydrocarbon group having 1 to 12 carbon atoms, a branched hydrocarbon group having 3 to 12 carbon atoms, an aromatic hydrocarbon group having 6 to 25 ring-forming atoms, or a divalent heteroaromatic ring group having 5 to 14 ring-forming atoms.

$Ar^2$ may form a ring with $Ar^1$.

In Chemical Formula 2, $Ar^4$ is (i) an aromatic hydrocarbon group having 6 to 25 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms, or a divalent heteroaromatic ring group having 5 to 14 ring-forming atoms, or (ii) an heteroaromatic ring group having 5 to 14 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms, or a divalent heteroaromatic ring group having 5 to 14 ring-forming atoms.

$Ar^4$ may form a ring with $Ar^3$.

$Ar^2$ of Chemical Formula 1 and $Ar^4$ of Chemical Formula 2 may be the same as or different from each other, but they may be, for example, the same.

In an embodiment, when the polymeric compound according to an embodiment includes the structural unit of Chemical Formula 1 and the structural unit of Chemical Formula 2, $R^{21}$, $R^{22}$, $R^{31}$, $R^{32}$, $L^1$, x, $L^2$, $Ar^1$, and $Ar^2$ of Chemical Formula 1 are the same as $R^{23}$, $R^{24}$, $R^{33}$, $R^{34}$, $L^3$, y, $L^4$, $Ar^3$, and $Ar^4$ of Chemical Formula 2, respectively.

Here, the aromatic hydrocarbon group having 6 to 25 ring-forming atoms as $Ar^2$ or $Ar^4$ and the divalent heteroaromatic ring group having 5 to 14 ring-forming atoms are not particularly limited.

When $Ar^2$ or $Ar^4$ does not form a ring with $Ar^1$ or $Ar^3$, they may be exemplified by a derived from an aromatic hydrocarbon having 6 to 25 ring-forming atoms as defined in $L^1$ or LP.

Similarly, in the above case, the heteroaromatic ring group as $Ar^2$ or $Ar^4$ is not particularly limited, but may be exemplified by a group derived from the heteroaromatic ring group defined in $L^1$ or LP.

Further, when $Ar^2$ or $Ar^4$ forms a ring with $Ar^1$ or $Ar^3$, groups derived from aromatic hydrocarbons having 6 to 25 ring-forming atoms defined in $L^1$ or $L^3$ may be exemplified.

Similarly, the heteroaromatic ring group as $Ar^2$ or $Ar^4$ in the above case is not particularly limited, but examples thereof include groups derived from heteroaromatic ring group as defined in $L^1$ or LP.

Among these, $Ar^2$ and $Ar^4$ may each independently be a group derived from benzene, biphenyl, dibenzofuran, dibenzothiophene, and fluorene. For example, $Ar^2$ and $Ar^4$ may each independently be a group derived from benzene, that is, a phenyl group or an o, m, or p-phenylene group.

For example, $Ar^2$ or $Ar^4$ may be a phenyl group when $Ar^2$ or $Ar^4$ does not form a ring with $Ar^1$ or $Ar^3$, or may be an o-phenylene group when $Ar^2$ or $Ar^4$ forms a ring with $Ar^1$ or $Ar^3$.

With such $Ar^2$ or $Ar^4$ (unsubstituted form), higher bond dissociation energy may be achieved. Further, from the viewpoints of higher hole injection and transport properties and triplet energy levels, lower driving voltages, and film-forming properties, a balance of any two or more of these (particularly, a balance between hole injection and transport properties and film-forming properties) may be achieved.

In an embodiment of the present disclosure, $Ar^2$ or $Ar^4$ have a linear hydrocarbon group having 1 to 12 carbon atoms, a branched hydrocarbon group having 3 to 12 carbon atoms, an aromatic hydrocarbon group having 6 to 25 ring-forming atoms, or a divalent heteroaromatic ring group having 5 to 14 ring-forming atoms as a substituent. With such a substituent at the terminal end of the polymeric compound, the polymeric compound in the hole transport layer can closely interact with the quantum dots in the light emitting layer, so that hole injection and transport properties may be improved. Therefore, the electroluminescent device using the polymeric compound according to an embodiment, in particular, the quantum dot electroluminescent device, may more effectively improve durability, for example, device lifespan or luminescence lifespan.

Herein, the hydrocarbon group having 1 to 12 carbon atoms is not particularly limited, and examples thereof include linear or branched alkyl groups, linear or branched alkenyl groups, linear or branched alkynyl groups, and cycloalkyl groups.

When $Ar^2$ or $Ar^4$ is an alkenyl group or an alkynyl group, the number of carbon atoms of $Ar^2$ or $Ar^4$ is 2 or more and 12 or less. Similarly, when $Ar^2$ or $Ar^4$ is a cycloalkyl group, the number of carbon atoms of $Ar^2$ or $Ar^4$ is 3 or more and 12 or less.

The alkyl group having 1 to 12 carbon atoms may include, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyl group, and the like.

The alkenyl group having 2 to 12 carbon atoms may include, for example, a vinyl group, an allyl group, a 1-propenyl group, a 2-butenyl group, a 1,3-butadienyl group, and a 2-pentenyl group.

The alkynyl group having 2 to 12 carbon atoms may include, for example, an ethynyl group, a propargyl group, and the like.

The cycloalkyl group having 3 to 12 carbon atoms may include, for example, a cyclopropyl group, a cyclobutyl group, a cyclopentyl group, a cyclohexyl group, and the like.

Further, the aromatic hydrocarbon group having 6 to 25 ring-forming atoms present in $Ar^2$ or $Ar^4$ is not particularly limited, but may be exemplified by groups derived from an aromatic hydrocarbon group having 6 to 25 ring-forming atoms as defined in $L^1$ or $L^3$.

For example, the aromatic hydrocarbon group having 6 to 25 ring-forming atoms present in $Ar^2$ or $Ar^4$ may each independently be a phenyl group, a biphenyl group, a terphenyl group, a naphthyl group, or a 9,9-dimethyl fluorenyl group, for example a 9,9-dimethyl-2-phenyl fluorenyl group.

In addition, the heteroaromatic ring group having 5 to 14 ring-forming atoms present in $Ar^2$ or $Ar^4$ is not particularly limited.

For example, the heteroaromatic ring group having 5 to 14 ring-forming atoms present in $Ar^2$ or $Ar^4$ may be a pyridine-derived group.

The aromatic hydrocarbon group having 6 to 25 ring-forming atoms and the divalent heteroaromatic ring group having 5 to 14 ring-forming atoms may be present in $Ar^2$ or $Ar^4$ in combination.

Among these, the substituent present in $Ar^2$ or $Ar^4$ may be selected from a linear or branched alkyl group having 4 to 10 carbon atoms, a phenyl group, a biphenyl group, a terphenyl group, a naphthyl group, a 9,9-dimethyl fluorenyl group and pyridinyl group, a pyridinyl group, or a combination of any of these (e.g., a 9,9-dimethyl-2-phenyl fluorenyl group). Accordingly, the polymeric compound in the hole transport layer may be present more closely (may interact more closely) with the quantum dots in the light emitting layer. Accordingly, hole injection and transport properties may be further improved. Accordingly, the electroluminescent device using the polymeric compound according to the embodiment, for example, the quantum dot electroluminescent device, may more effectively improve durability, for example, device lifespan or luminescence lifespan.

In other words, in an embodiment, $Ar^2$ and $Ar^4$ are each independently be a group derived from a compound selected from benzene, biphenyl, dibenzofuran, dibenzothiophene, and fluorene, and also may be substituted with a linear or branched alkyl group having 4 to 10 carbon atoms, or a phenyl group, a biphenyl group, a terphenyl group, a naphthyl group, a 9,9-dimethyl fluorenyl group, a 9,9-dimethyl-2-phenyl fluorenyl group, a pyridinyl group, a 3-pyridinyl phenyl group, a 4-pyridinyl phenyl group, or a biphenyl group substituted with a pyridinyl group.

For example, the hydrocarbon group present in $Ar^2$ or $Ar^4$ is a linear alkyl group having 5 to 8 carbon atoms.

In other words, in an embodiment, $Ar^2$ or $Ar^4$ may be a benzene-derived group (phenyl group, an o, m, or p-phenylene group) substituted with a linear alkyl group having 5 to 8 carbon atoms.

For example, the hydrocarbon group present in $Ar^2$ or $Ar^4$ is a linear alkyl group having 6 to 8 carbon atoms.

In other words, in an embodiment, $Ar^2$ or $Ar^4$ is a phenyl group (when $Ar^2$ or $Ar^4$ does not form a ring with $Ar^1$ or $Ar^3$) substituted with a linear alkyl group having 6 to 8 carbon atoms, or an o-phenylene group (when $Ar^2$ or $Ar^4$ forms a ring with $Ar^1$ or $Ar^3$) substituted with a linear alkyl group having 6 to 8 carbon atoms.

The position of the substituent present in $Ar^2$ or $Ar^4$ is not particularly limited, but may be present at a position as far as possible from the nitrogen atom of $-L^2-N(Ar^1)(Ar^2)$ or $-L^4-N(Ar^3)(Ar^4)$. For example, when $Ar^1$ forms a ring with $L^2$ and $Ar^2$ is a phenyl group, the hydrocarbon group may be present in the para position to the nitrogen atom. According to this arrangement, the polymeric compound in the hole transport layer may be present more closely with (i.e., may interact more closely) the quantum dots in the light emitting layer, and the hole injection and transport properties may be further improved. Therefore, the electroluminescent device using the polymeric compound according to the embodiment, for example, the quantum dot electroluminescent device, may more effectively improve durability, for example, device lifespan or luminescence lifespan.

$Ar^2$ or $Ar^4$ may also form a ring with $Ar^1$ or $Ar^3$. When $Ar^2$ or $Ar^4$ forms a ring with $Ar^1$ or $Ar^3$, the ring structure formed by $Ar^2$ or $Ar^4$ and $Ar^1$ or $Ar^3$ is not particularly limited, but $Ar^2$ or $Ar^4$ and $Ar^1$ or $Ar^3$ may form a carbazole ring. In other words, in an embodiment, $Ar^1$ in Chemical Formula 1 forms a ring with $Ar^2$, and —$N(Ar^1)(Ar^2)$ is a group selected from the following groups. In an embodiment, $Ar^3$ in Chemical Formula 2 forms a ring with $Ar^4$, and —$N(Ar^3)(Ar^4)$ is a group selected from the following groups.

[Chemical Formula 11]

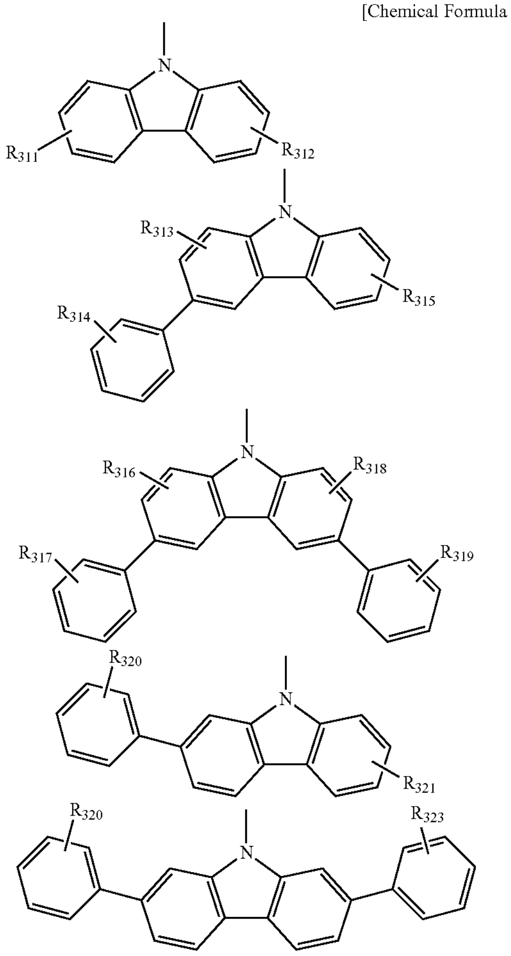

In the chemical formulas, $R_{311}$ to $R_{323}$ are each independently a hydrogen atom or a hydrocarbon group having 1 to 12 carbon atoms. In an embodiment, at least one of $R_{311}$ and $R_{312}$, at least one of $R_{313}$ to $R_{315}$, at least one of $R_{316}$ to $R_{319}$, at least one of $R_{320}$ and $R_{321}$, or at least one of $R_{322}$ and $R_{323}$ is a linear alkyl group having 1 to 12 carbon atoms or a branched alkyl group having 3 to 12 carbon atoms (e.g., a linear alkyl group having 4 to 10 carbon atoms, or a branched alkyl group having 4 to 10 carbon atoms, for example a linear alkyl group having 5 to 8 carbon atoms, for example a linear alkyl group having 6 to 8 carbon atoms).

For example, $Ar^2$ or $Ar^4$ and $Ar^1$ or $Ar^3$ may form a carbazole ring having the following structure. In other words, in an embodiment, $-L^2-N(Ar^1)(Ar^2)$ in Chemical Formula 1 includes the following structure. In another embodiment, $-L^4-N(Ar^3)(Ar^4)$ in Chemical Formula 2 has the following structure.

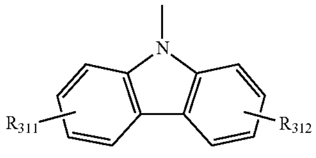

$R_{311}$ is a hydrogen atom, a linear alkyl group having 4 to 10 carbon atoms, or a branched alkyl group having 4 to 10 carbon atoms (for example, a hydrogen atom or a linear alkyl group having 5 to 8 carbon atoms), and $R_{312}$ is a linear alkyl group having 4 to 10 carbon atoms, or a branched alkyl group having 4 to 10 carbon atoms (e.g., a linear alkyl group having 5 to 8 carbon atoms, for example a linear alkyl group having 6 to 8 carbon atoms).

Accordingly, the structural unit B may include the following structures. In other words, in an embodiment, the following structure in Chemical Formula 1

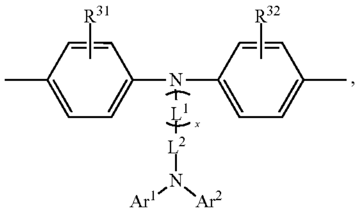

and the following structure in Chemical Formula 2:

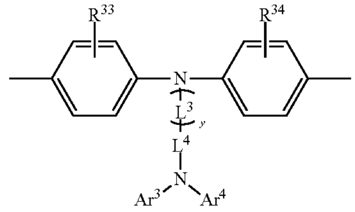

may each independently have a structure selected from the following groups:

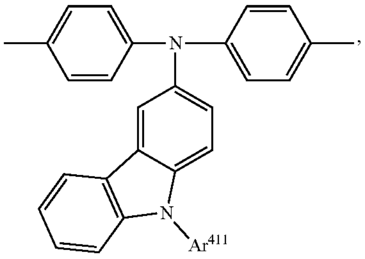

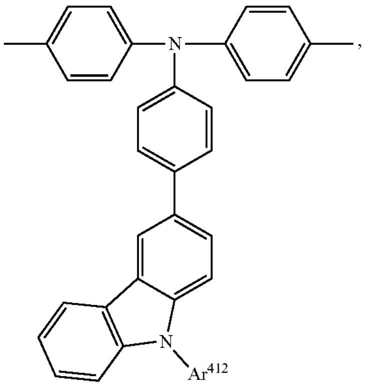

-continued
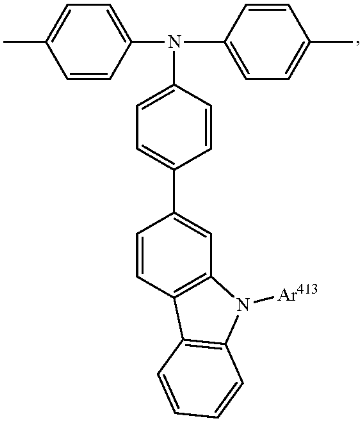
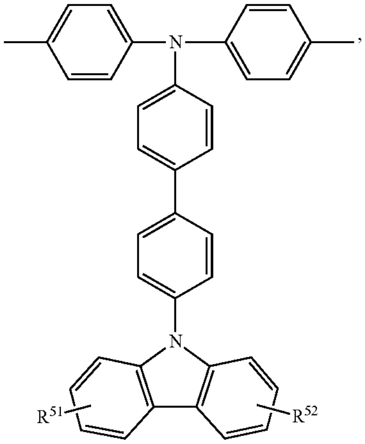
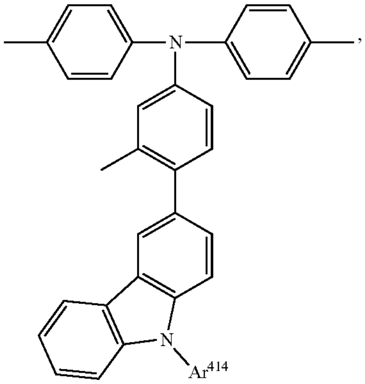
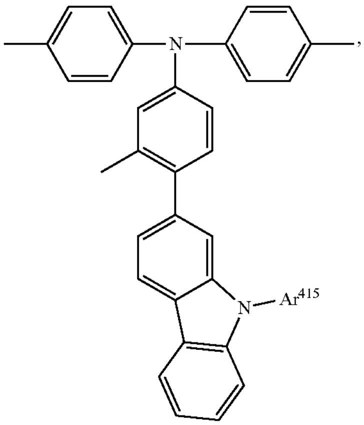
-continued
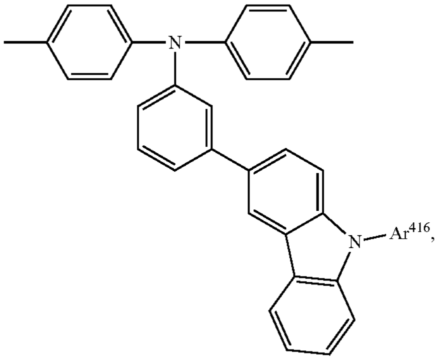
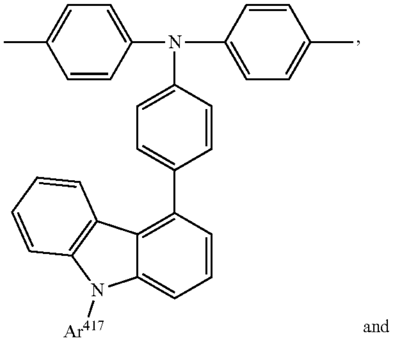
and
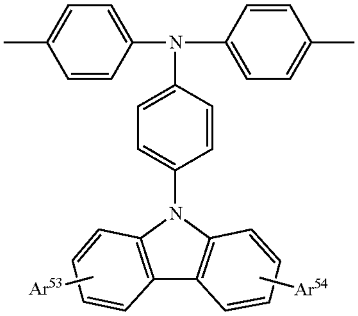
wherein, in the structures,
$R^{51}$ to $R^{54}$ are each independently a hydrogen atom, a linear alkyl group having 1 to 12 carbon atoms, a branched alkyl group having 3 to 12 carbon atoms, or a group selected from the following groups:
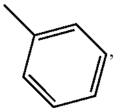
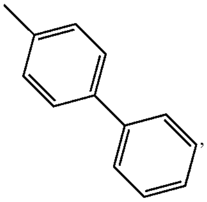
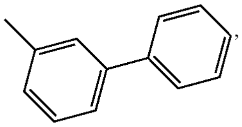

-continued

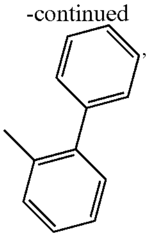

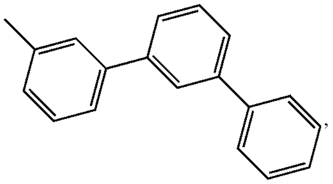

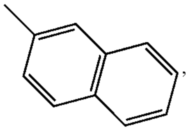

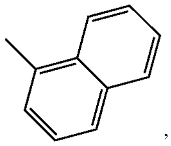

, and

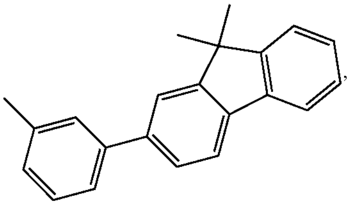

$Ar^{411}$ to $Ar^{417}$ are each independently a group selected from the following groups:

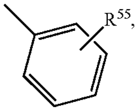

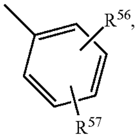

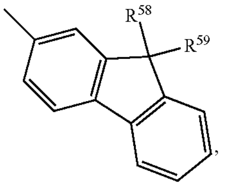

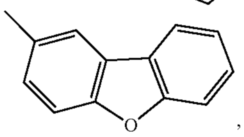

, and

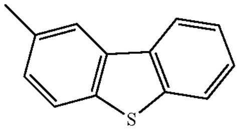

wherein, $R^{55}$ to $R^{57}$ are each independently a hydrogen atom, a linear alkyl group having 1 to 12 carbon atoms, a branched alkyl group having 3 to 12 carbon atoms, or a group selected from the following groups, and

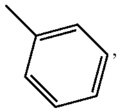

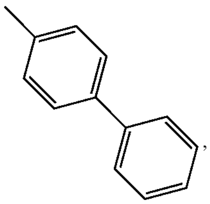

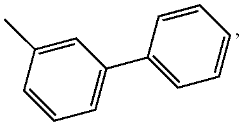

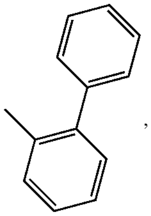

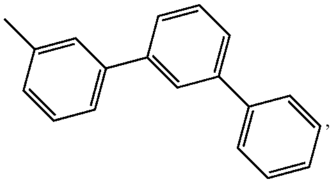

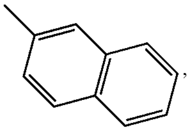

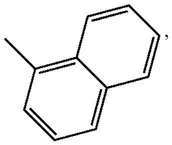

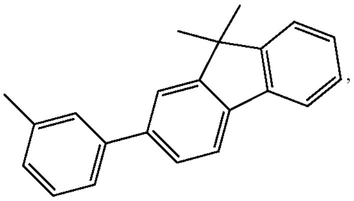

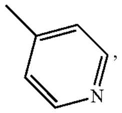

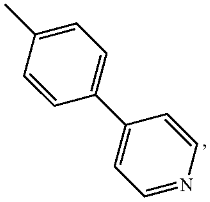

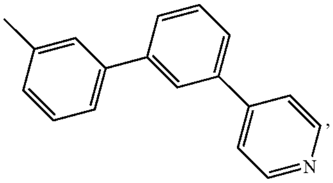

and

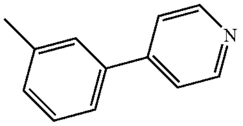

wherein, $R^{58}$ and $R^{59}$ are each independently a hydrogen atom, a linear alkyl group having 1 to 12 carbon atoms, or a branched alkyl group having 3 to 12 carbon atoms.

For example, the structural unit B may include the following structure. In other words, in an embodiment, the structural unit B in Chemical Formula 1 may include the following structure:

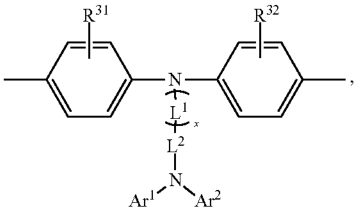, and the structural unit B in Chemical Formula 2 may include the following structure:

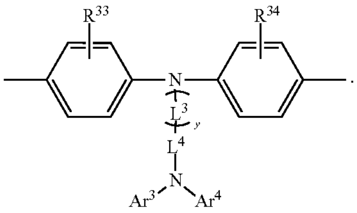.

For example, the structural unit B in Chemical Formula 1 or Chemical Formula 2 may each independently have a structure selected from the following groups:

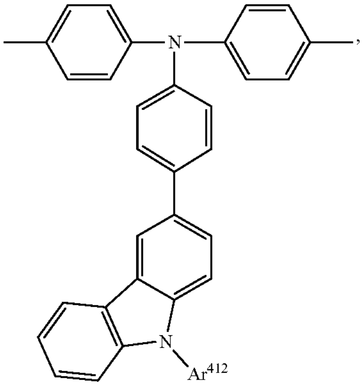,

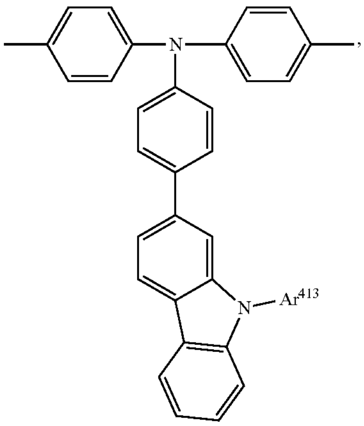,

-continued

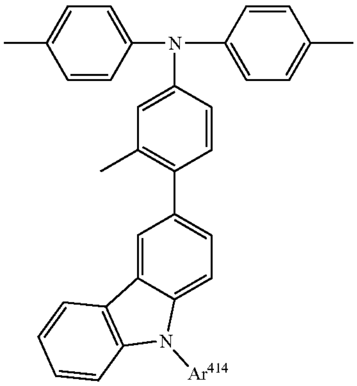,

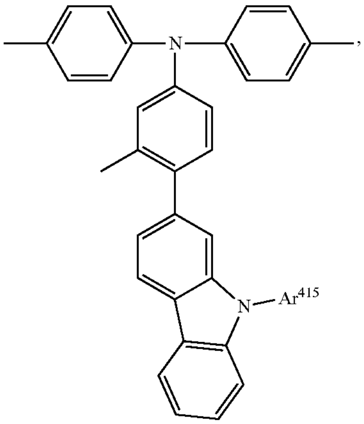, and

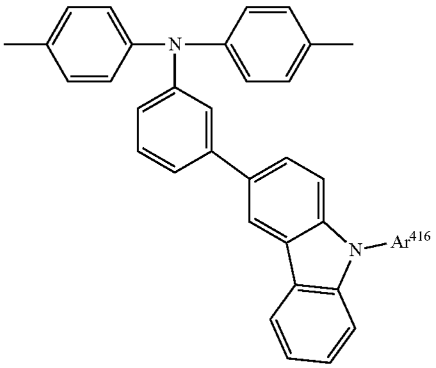

wherein, in the structures, $Ar^{412}$ to $Ar^{416}$ are each independently a group selected from the following groups:

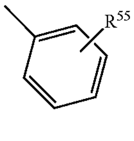, and 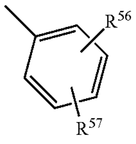

wherein, in the structures, $R^{55}$ to $R^{57}$ are each independently a linear alkyl group having 4 to 10 carbon atoms, or a branched alkyl group having 4 to 10 carbon atoms.

Accordingly, the structural unit of Chemical Formula 1 according to an embodiment may be selected from the following groups:

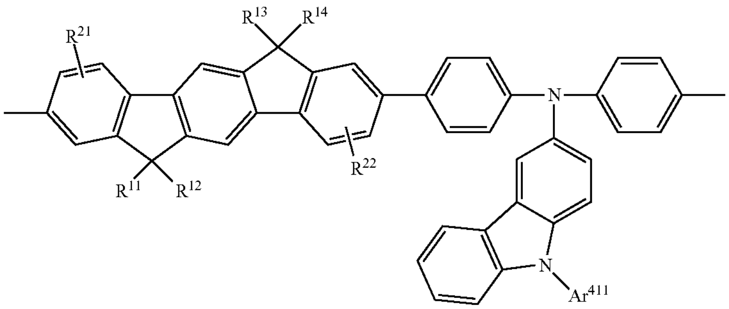
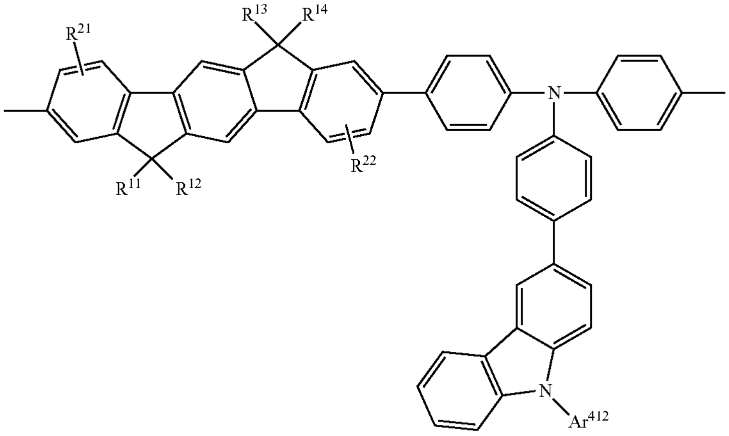
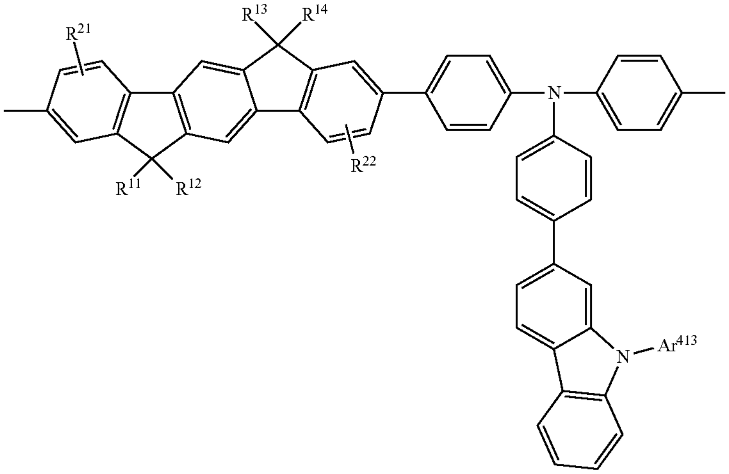
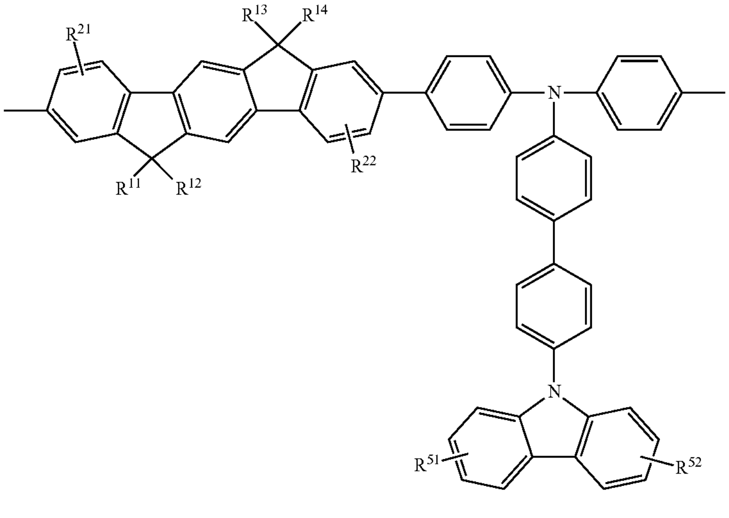

-continued
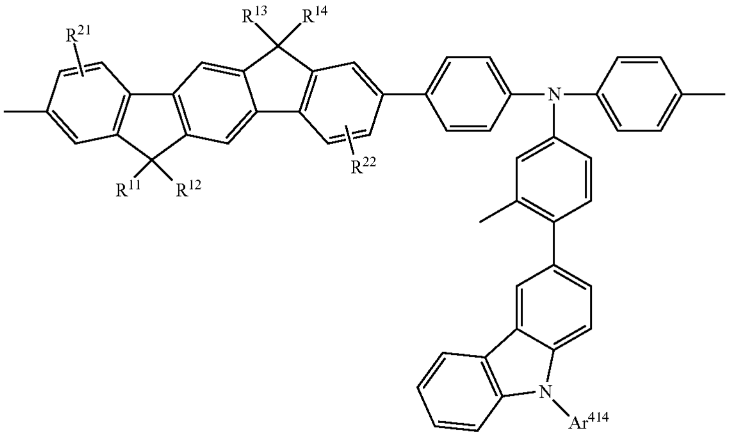
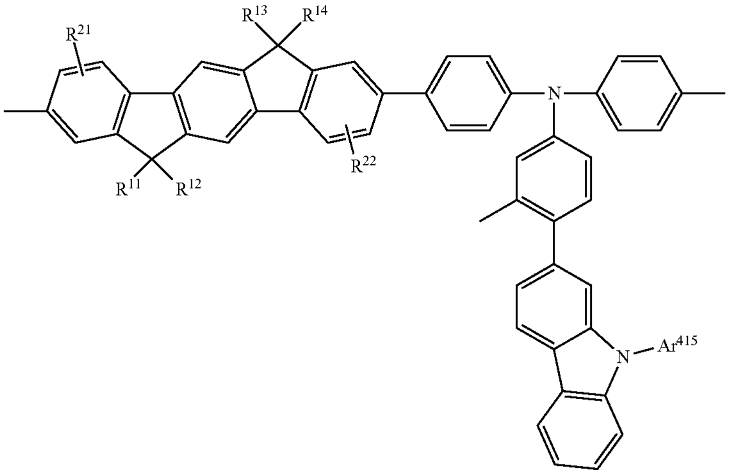
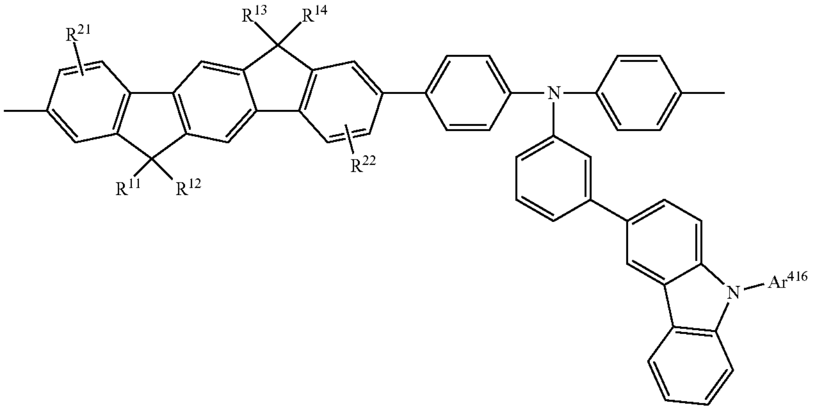
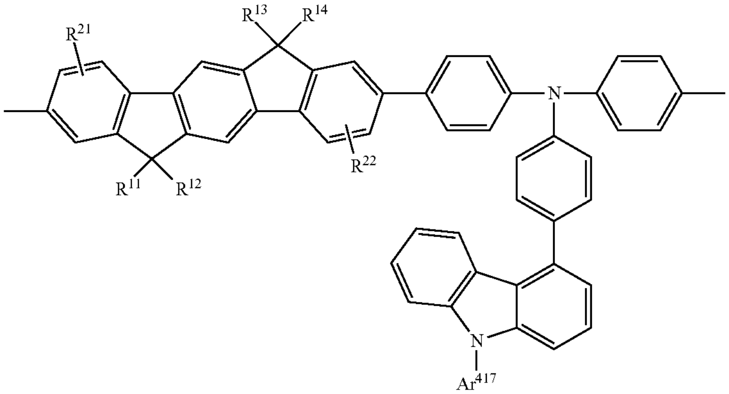

-continued

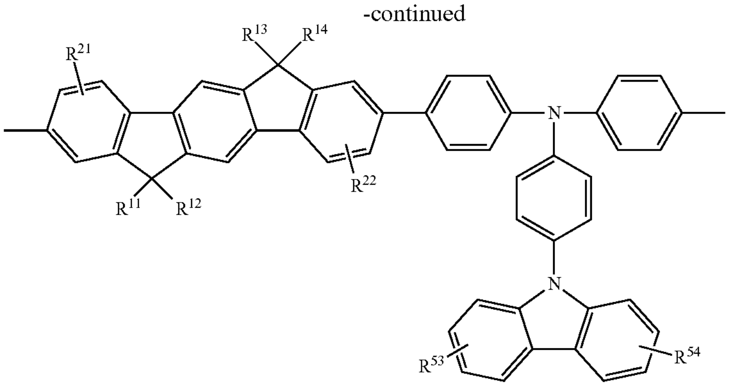

wherein, in the structures $R^{11}$ to $R^{14}$, $R^{21}$, and $R^{22}$ are defined as in Chemical Formula 1, and $R^{51}$ to $R^{54}$ are each independently a hydrogen atom, a linear alkyl group having 1 to 12 carbon atoms, a branched alkyl group having 3 to 12 carbon atoms, or a group selected from the following groups:

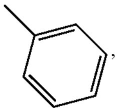,

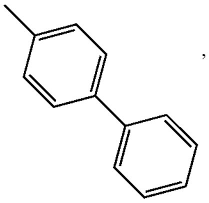,

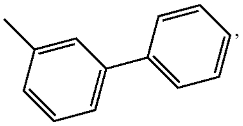,

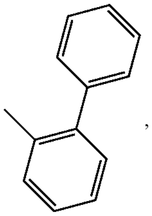,

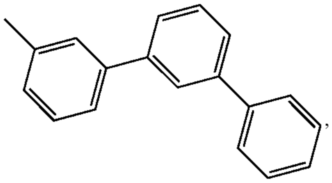,

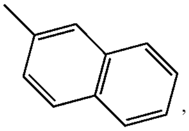,

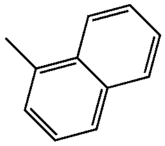, and

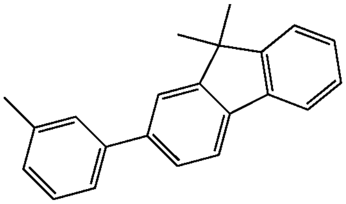

$Ar^{411}$ to $Ar^{417}$ are each independently a group selected from the following groups:

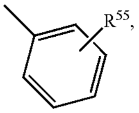,

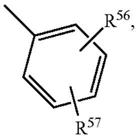,

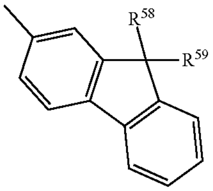,

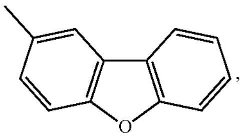, and

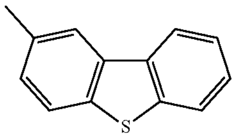

wherein, in the chemical formulas, $R^{55}$ to $R^{57}$ are each independently a hydrogen atom, a linear alkyl group having 1 to 12 carbon atoms, a branched alkyl group having 3 to 12 carbon atoms, or a group selected from the following group:

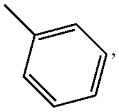,

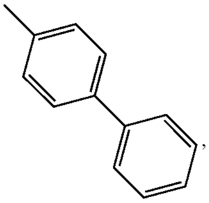,

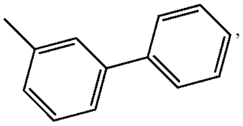,

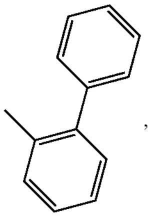,

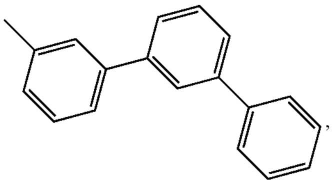,

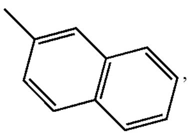,

-continued
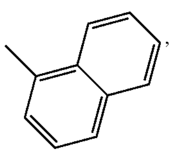
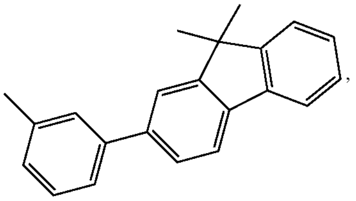
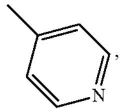
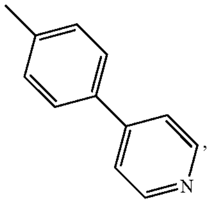
-continued
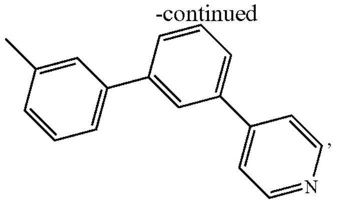
and
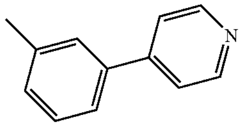
In the chemical formulas, $R^{58}$ and $R^{59}$ are each independently a hydrogen atom, a linear alkyl group having 1 to 12 carbon atoms, or a branched alkyl group having 3 to 12 carbon atoms.
In addition, the structural unit of Chemical Formula 2 according to an embodiment may be selected from the following groups:
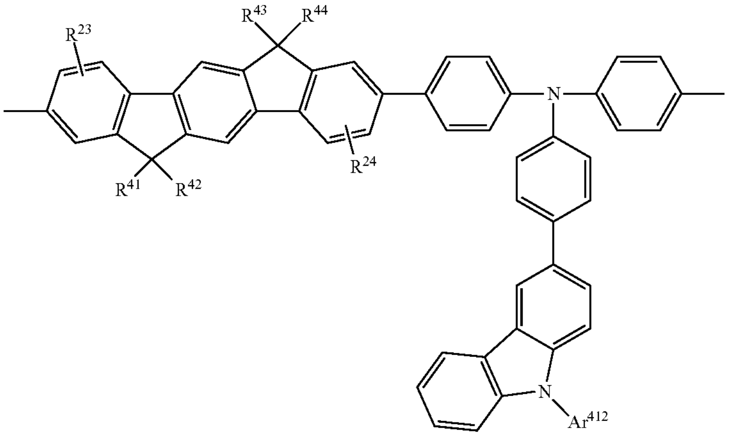
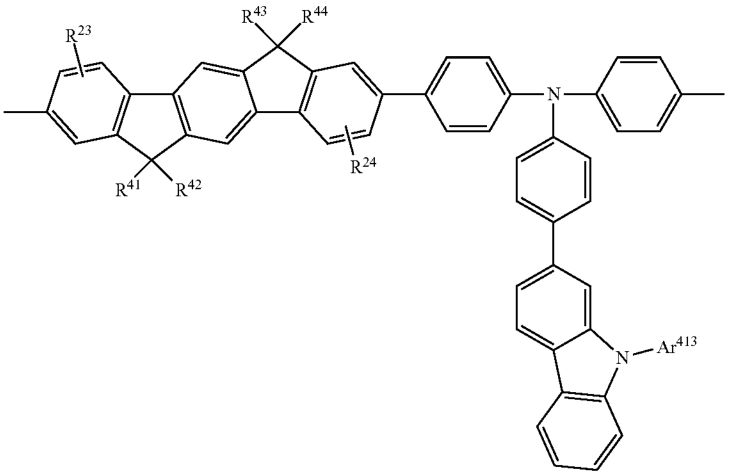

-continued

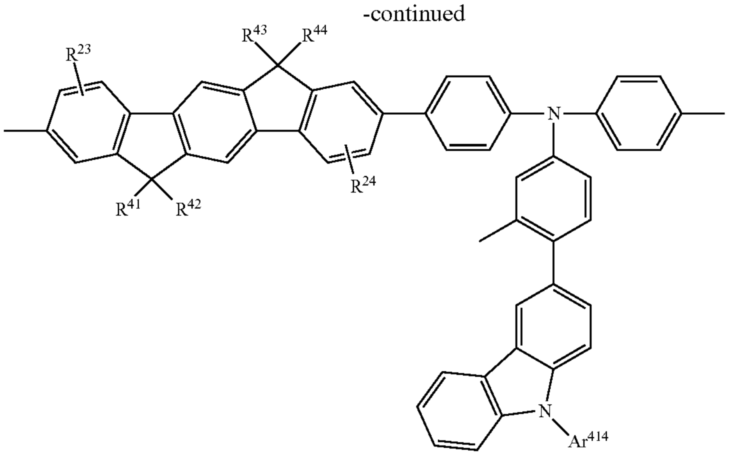

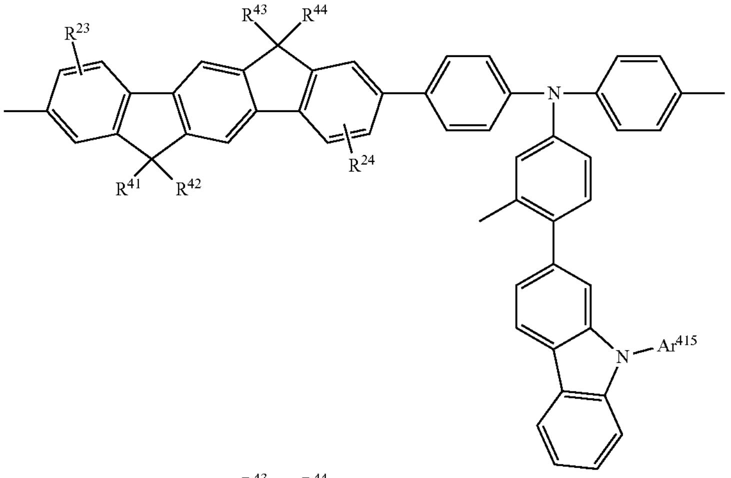

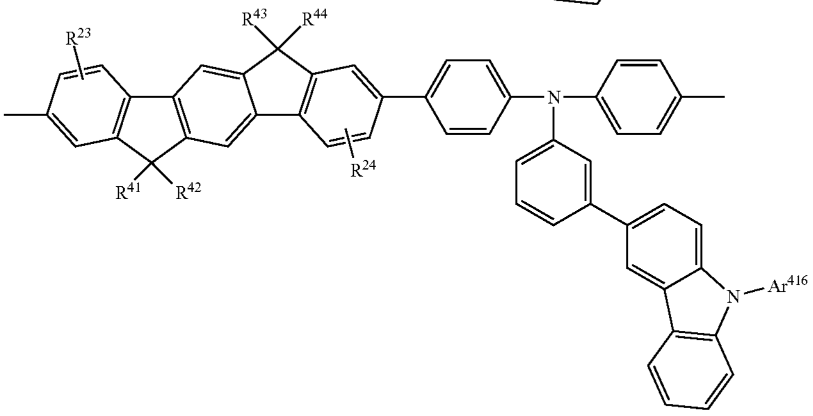

wherein, in the structures, $R^{41}$ to $R^{44}$, $R^{23}$, and $R^{24}$ are defined as in Chemical Formula 2, and $Ar^{412}$ to $Ar^{416}$ are each independently a group selected from the following groups:

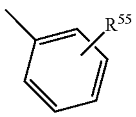

, and

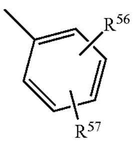

wherein, in the structures, $R^{55}$ to $R^{57}$ are each independently a linear alkyl group having 4 to 10 carbon atoms, or a branched alkyl group having 4 to 10 carbon atoms.

A composition of the structural unit C in the polymeric compound according to an embodiment is not particularly limited.

For example, when considering the durability (device lifespan or luminescence lifespan, etc.) of a layer formed using the obtained polymeric compound, for example, a hole injection layer or a hole transport layer, or a new improvement effect of hole injection and transport ability, the structural unit C may be included in an amount of, for example, greater than or equal to about 10 mol % and less than or equal to about 100 mol %, for example, greater than or equal to about 50 mol % and less than or equal to about 100 mol %, for example 100 mol %, based on the total structural units constituting the polymeric compound (i.e., the polymeric compound consists of one type of the structural unit C alone).

When the polymeric compound includes two or more types of structural units C, the amount of the structural unit C means a total amount of the structural units C.

When the polymeric compound according to an embodiment includes the structural unit of Chemical Formula 1 and the structural unit of Chemical Formula 2 in a composition, the structural units of Chemical Formula 2 and the structural unit of Chemical Formula 1 may have a mole ratio. In an embodiment, a mole ratio of the structural unit represented by Chemical Formula 2 to the structural unit represented by Chemical Formula 1 may be, for example, greater than or equal to about 0.3 moles and less than or equal to about 10 moles of the structural unit represented by Chemical Formula 2 to 1 mole of the structural unit represented by Chemical Formula 1. In an embodiment, a mole ratio of the structural unit represented by Chemical Formula 2 to the structural unit represented by Chemical Formula 1 may be, for example, greater than or equal to about 1 mole and less than or equal to about 20 moles of the structural unit represented by Chemical Formula 2 to 1 mole of the structural unit represented by Chemical Formula 1. In an embodiment, a mole ratio of, for example, greater than or equal to about 1 mole and less than or equal to about 3 moles of the structural unit represented by Chemical Formula 2 to 1 mole of the structural unit represented by Chemical Formula 1. Due to the presence of two types of structural units C in this composition, desired properties, for example, durability and film-forming properties, may be appropriately adjusted.

As described above, the polymeric compound according to an embodiment may be composed of the structural unit C alone.

Alternatively, the polymeric compound of an embodiment may further include structural units other than the structural unit C.

In the case of including other structural units, other structural units are not particularly limited as long as they do not impair the effects of the polymeric compound (in particular, durability, film-forming properties, high triplet energy level, and low driving voltage). For example, structural units selected from the following groups may be used.

Structural units represented by the following groups are also referred to as "structural unit D."

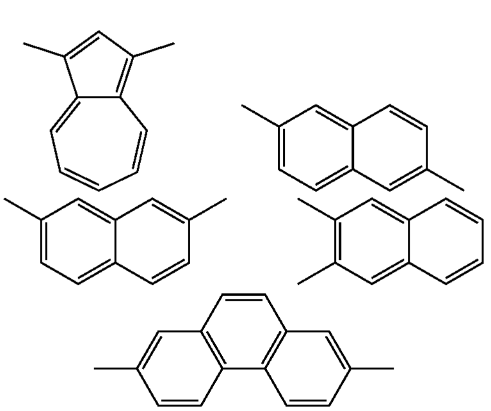

-continued

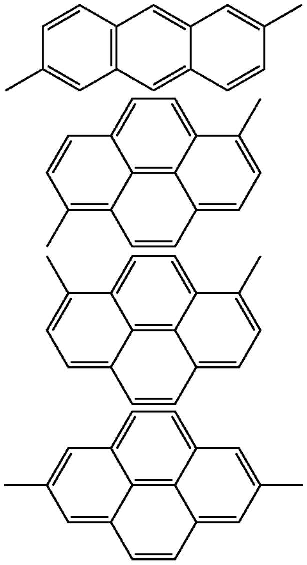

The composition of the structural unit D in the polymeric compound of the present embodiment is not particularly limited. Considering the ease of film formation and the new effect of improving film strength by the resulting polymeric compound, the structural unit D may be included in an amount of, for example, greater than or equal to about 1 mol % and less than or equal to about 10 mol % based on all structural units constituting the polymeric compound. When the polymeric compound includes two or more types of structural units D, a content of the structural units D means a total amount of the structural units D.

The weight average molecular weight (Mw) of the polymeric compound is not particularly limited as long as the desired effect of the present disclosure is obtained. The weight average molecular weight (Mw) may be, for example, greater than or equal to about 8,000 g/mol and less than or equal to about 1,000,000 g/mol, greater than or equal to about 12,000 g/mol and less than or equal to about 1,000,000 g/mol, for example, greater than or equal to about 20,000 g/mol and less than or equal to about 800,000 g/mol, or greater than or equal to about 50,000 g/mol and less than or equal to about 500,000 g/mol. With such a weight average molecular weight, a viscosity of a coating solution for forming a layer (e.g., a hole injection layer, a hole transport layer, etc.) using a polymeric compound may be appropriately adjusted, and a layer having a uniform film thickness may be formed.

In addition, the number average molecular weight (Mn) of the polymeric compound is not particularly limited as long as the desired effect of the present disclosure is obtained. The number average molecular weight (Mn) may be, for example, greater than or equal to about 4,000 g/mol and less than or equal to about 250,000 g/mol, greater than or equal to about 10,000 g/mol and less than or equal to about 250,000 g/mol, greater than or equal to about 20,000 g/mol and less than or equal to about 150,000 g/mol, or for example, greater than or equal to 25,000 g/mol and less than or equal to about 100,000 g/mol. With such a number average molecular weight, a viscosity of a coating solution for forming a layer (e.g., a hole injection layer, a hole transport layer) using the polymeric compound may be appropriately adjusted, and a layer having a uniform film thickness may be formed.

Further, a polydispersity (weight average molecular weight/number average molecular weight) of the polymeric compound of the present embodiment may be, for example, greater than or equal to about 1.2 and less than or equal to about 6.0, for example greater than or equal to about 1.2 and less than or equal to about 4.0, or for example, greater than or equal to about 1.5 and less than or equal to about 3.5.

As used herein, the measurement of the number average molecular weight (Mn) and the weight average molecular weight (Mw) is not particularly limited, and may be obtained by using a known method or by appropriately modifying the known method.

As used herein, the number average molecular weight (Mn) and the weight average molecular weight (Mw) may be values measured by the following method.

The polydispersity (Mw/Mn) of the polymer is calculated by dividing the weight average molecular weight (Mw) by the number average molecular weight (Mn) measured by the following method.

(Measurement of Number Average Molecular Weight (Mn) and Weight Average Molecular Weight (Mw))

Detector (UV-VIS detector): Shimadzu Corporation, SPD-10AV

Standard sample: polystyrene.

The terminal of the main chain of the polymeric compound of the present embodiment is not particularly limited and is appropriately defined depending on the type of raw material used, but it may be usually a hydrogen atom.

The polymeric compound of the present embodiment may be synthesized using a known organic synthesis method.

A specific method for synthesizing the polymeric compound of the present embodiment may be easily understood by those skilled in the art by referring to examples described later. For example, the polymeric compound of the present embodiment may be prepared by a polymerization reaction using a monomer represented by Chemical Formula 1' or a monomer represented by Chemical Formula 1' and a monomer represented by Chemical Formula 2'; or by a copolymerization reaction using a monomer represented by Chemical Formula 1', or a monomer represented by Chemical Formula 1' and a monomer represented by Chemical Formula 2', and monomers other than those corresponding to the above other structural units.

(Chemical Formula 1')

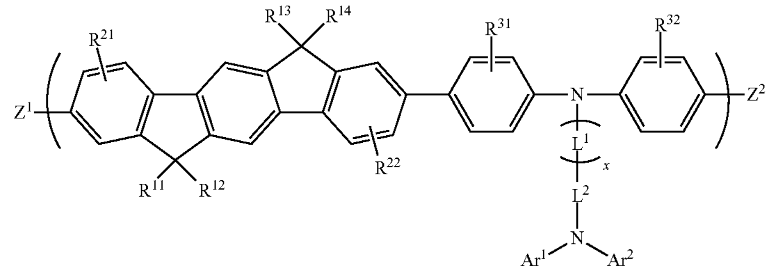

(Chemical Formula 2')

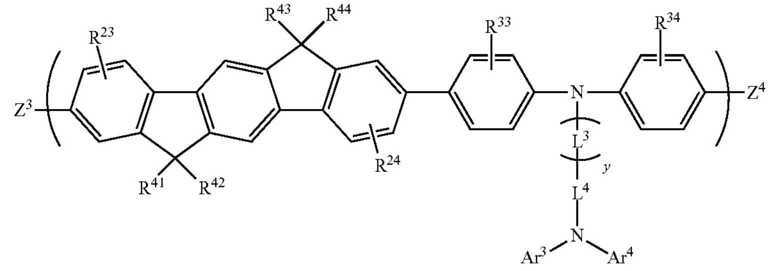

The number average molecular weight (Mn) and weight average molecular weight (Mw) of the polymeric compounds are measured under the following conditions by SEC (Size Exclusion Chromatography) using polystyrene as a standard material:

(SEC Measurement Conditions)

Analysis equipment (SEC): Shimadzu Corporation, Prominence

Column: Polymer Laboratories, PLgel MIXED-B

Column temperature: 40° C.

Flow rate: 1.0 mL/min

Injection amount of sample solution: 20 μL (polymer concentration: about 0.05 mass %)

Eluent: tetrahydrofuran (THF)

In the present disclosure, the monomers usable for polymerization to prepare the polymeric compound may be synthesized by appropriately combining known synthesis reactions, and their structures may also be confirmed by known methods such as NMR and LC-MS. For example, the monomer represented by Chemical Formula 1' is obtained by a reaction between a compound represented by Chemical Formula 3' and a compound represented by Chemical Formula 4'. Similarly, the monomer represented by Chemical Formula 2' can be obtained by a reaction between a compound represented by Chemical Formula 5' and a compound represented by Chemical Formula 6'.

(Chemical Formula 3')

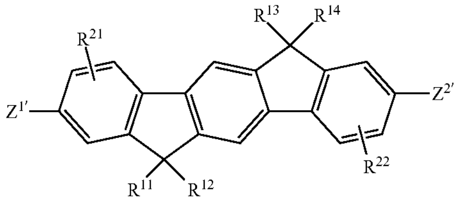

(Chemical Formula 4')

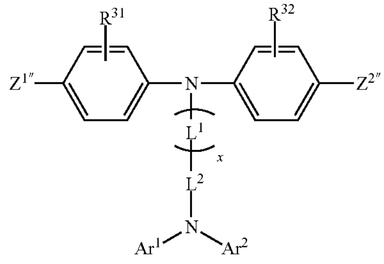

(Chemical Formula 5')

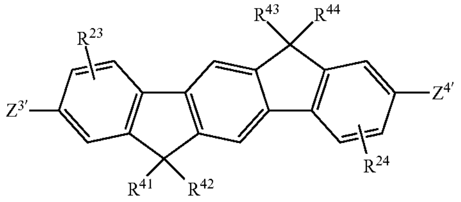

(Chemical Formula 6')

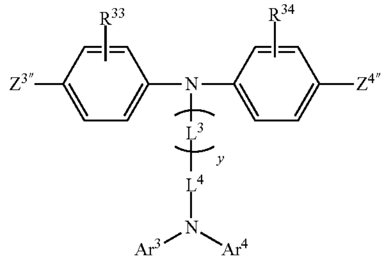

In Chemical Formula 1' to Chemical Formula 6', $R^{11}$ to $R^{14}$, $R^{21}$, $R^{22}$, $R^{31}$, $R^{32}$, $L^1$, x, $L^2$, $Ar^1$, and $Ar^2$ are as defined in Chemical Formula 1.

In addition, in Chemical Formula 1' to Chemical Formula 6', $R^{41}$ to $R^{44}$, $R^{23}$, $R^{24}$, $R^{33}$, $R^{34}$, $L^3$, y, $L^4$, $Ar^3$, and $Ar^4$ are as defined in Chemical Formula 2.

$Z^1$ and $Z^2$, $Z^3$ and $Z^4$, $Z^{1'}$ and $Z^{2'}$, $Z^{3'}$ and $Z^{4'}$, $Z^{1''}$ and $Z^{2''}$, and $Z^{3''}$ and $Z^{3''}$ are each independently a halogen atom (a fluorine atom, a chlorine atom, a bromine atom, an iodine atom, particularly a bromine atom) or a group having the following structure. In the following structure, $R_A$ to $R_D$ are each independently an alkyl group having 1 to 3 carbon atoms. For example, $R_A$ to $R_D$ are methyl groups.

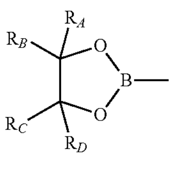

$Z^1$ and $Z^2$, $Z^3$ and $Z^4$, $Z^{1'}$ and $Z^{2'}$, $Z^{3'}$ and $Z^{4'}$, $Z^{1''}$ and $Z^{2''}$, and $Z^{3''}$ and $Z^{4''}$ in Chemical Formula 1' to Chemical Formula 6' are, respectively, the same or different. For example, $Z^1$ and $Z^2$ in Chemical Formula 1' are different. For example, $Z^3$ and $Z^4$ in Chemical Formula 2' are different. Alternatively, $Z^1$ and $Z^2$ in Chemical Formula 1' may be different, $Z^3$ and $Z^4$ in Chemical Formula 2' may be different, $Z^1$ and $Z^3$ in Chemical Formula 1' may be the same, and $Z^2$ and $Z^4$ in Chemical Formula 1' may be the same. For example, $Z^{1'}$ and $Z^{2'}$ in Chemical Formula 3' are the same. For example, $Z^{1''}$ and $Z^{2''}$ in Chemical Formula 4' are the same. In addition, $Z^{1'}$ and $Z^{2'}$ in Chemical Formula 3' may be the same, $Z^{1''}$ and $Z^{2''}$ in Chemical Formula 4' may be the same, and $Z^{1'}$ and $Z^{2'}$ in Chemical Formula 3' may be different from $Z^{1''}$ and $Z^{2''}$ in Chemical Formula 4'. For example, $Z^{3'}$ and $Z^{4'}$ in Chemical Formula 5' are the same. For example, $Z^{3''}$ and $Z^{4''}$ in Chemical Formula 6' are the same. In addition, $Z^{3'}$ and $Z^{4'}$ in Chemical Formula 5' may be the same, $Z^{3''}$ and $Z^{4''}$ in Chemical Formula 6' may be the same, and $Z^{3'}$ and $Z^{4'}$ in Chemical Formula 3' may be different from $Z^{3''}$ and $Z^{4''}$ in Chemical Formula 6'.

The polymeric compound of the present embodiment includes structural unit C. For this reason, the polymeric compound has a large C—N bond dissociation energy and a high hole injection and transport properties. Therefore, when the polymeric compound according to an embodiment is used as a hole injection material or a hole transport material (particularly, a hole transport material), high durability (device lifespan or luminescence lifespan) may be achieved. Further, the polymeric compound of the present embodiment has a combination of a high triplet energy level and a low driving voltage. Therefore, when the polymeric compound according to an embodiment is used as a hole injection material or a hole transport material (particularly, a hole transport material), high hole mobility may be achieved with a low driving voltage. Therefore, the electroluminescent device using the polymeric compound according to the embodiment has improved durability (device lifespan or luminescence lifespan, etc.) and luminous efficiency.

[Electroluminescent Device Material]

The polymeric compound according to an embodiment can be advantageously used as an electroluminescent device material.

According to the polymeric compound according to an embodiment, an electroluminescent device material having improved durability (device lifespan or luminescence lifespan, etc.) may be provided. In addition, according to the polymeric compound according to an embodiment, an electroluminescent device material having a high triplet energy level (current efficiency) and a low driving voltage may also be provided. In addition, the main chain (structural unit C) of the polymeric compound has appropriate flexibility. For this reason, the polymeric compound according to an embodiment exhibits high solubility in solvents and high heat resistance. Therefore, the polymeric compound may be easily formed into a film (thin film) by a wet (coating) method. Therefore, in the second embodiment, an electroluminescent device material including the polymeric compound according to the first embodiment is provided. Alternatively, a use of the above polymeric compound as an electroluminescent device material is provided.

In addition, the polymeric compound according to an embodiment has a HOMO energy value of greater than about 5.20 eV, for example, greater than about 5.47 eV. For this reason, the polymeric compound according to an embodiment may be suitably used for a quantum dot electroluminescent device (particularly, a hole transport layer).

[Electroluminescent Device]

As described above, the polymeric compound according to an embodiment may be desirably used in an electroluminescent device. In other words, an electroluminescent device including a pair of electrodes and one or more organic films between the electrodes and including the polymeric compound or electroluminescent device material of embodiments is provided. Such an electroluminescent device has improved durability (device lifespan or luminescence lifespan, etc.). In addition, such an electroluminescent device may exhibit improved luminous efficiency with a low driving voltage.

Accordingly, in the third embodiment, an electroluminescent device includes a first electrode, a second electrode, and one or more layers of an organic film between the first electrode and the second electrode, wherein at least one layer of the organic film includes the polymeric compound according to an embodiment.

The object (or effect) of the present disclosure may also be achieved by the electroluminescent device according to this embodiment. As an example of the above embodiment, the electroluminescent device further includes a light emitting layer between the electrodes and including a light emitting material capable of emitting light as a triplet exciton.

The electroluminescent device of the present embodiment is an example of an electroluminescent device according to an embodiment.

Further, the present embodiment provides a method for manufacturing an electroluminescent device including a pair of electrodes and one or more layers of organic films between the electrodes and including the polymeric compound of an embodiment, wherein at least one of the organic films is formed by a coating method. Further, according to this method, the present embodiment provides an electroluminescent device in which at least one layer of the organic films is formed by a coating method.

The polymeric compound of the present embodiment and the electroluminescent device material (EL device material) according to embodiments (hereinafter collectively referred to as "polymeric compound/EL device material") have improved solubility in organic solvents. For this reason, the polymeric compound/EL device material according to embodiments may be used particularly advantageously in the manufacture of devices (e.g., particularly thin films) by a coating method (e.g., wet process). For this reason, this embodiment provides the liquid composition including the polymeric compound of this embodiment, and a solvent or a dispersion medium. This liquid composition is an example of a liquid composition according to an embodiment.

In addition, as described above, the electroluminescent device material according to an embodiment may be desirably used for manufacturing a device (especially a thin film) by a coating method (e.g., wet process). In view of the above, the present embodiment provides a thin film including the polymeric compound of the present embodiment. Such a thin film is an example of a thin film according to an embodiment.

In addition, the EL device material according to the embodiment has improved hole injection and transport properties. For this reason, it may be suitably used also in formation of any organic film, such as a hole injection material, a hole transport material, or a light emitting material (host). Among these, from the viewpoint of hole transport properties, it may be desirably as a hole injection material or a hole transport material, and may be desirably used as a hole transport material.

In other words, this embodiment provides a composition including a polymeric compound and at least one material selected from a hole transport material, an electron transport material, a light emitting material, or a combination thereof. Herein, the light emitting material included in the composition is not particularly limited, but may include organometallic complexes (luminescent organometallic complex compounds) or semiconductor nanoparticles (semiconductor inorganic nanoparticles).

[Electroluminescent Device]

Hereinafter, an electroluminescent device according to an exemplary embodiment will be described in detail with reference to the FIGURE.

The FIGURE is a schematic view showing an electroluminescent device according to an exemplary embodiment.

In addition, in this specification, an "electroluminescent device" may be abbreviated as "EL device."

As shown in the FIGURE, an EL device 100 according to an embodiment includes a substrate 110, a first electrode 120 on the substrate 110, a hole injection layer 130 on the first electrode 120, a hole transport layer 140 on the hole injection layer 130, a light emitting layer 150 on the hole transport layer 140, an electron transport layer 160 on the light emitting layer 150, an electron injection layer 170 on the electron transport layer 160, and a second electrode 180 on the electron injection layer 170.

Herein, the polymeric compound of this embodiment is included in any one organic film (organic layer) between the first electrode 120 and the second electrode 180. For example, the polymeric compound may be included in the hole injection layer 130 as a hole injection material, in the hole transport layer 140 as a hole transport material, or in the light emitting layer 150 as a light emitting material (host). For example, the polymeric compound may be included in the hole injection layer 130 as a hole injection material or in the hole transport layer 140 as a hole transport material. For example, the polymeric compound may be included in the hole transport layer 140 as a hole transport material. In other words, in an embodiment, the organic film including the polymeric compound may be a hole transport layer, a hole injection layer, or a light emitting layer.

In an embodiment of the present disclosure, the organic film including the polymeric compound is a hole transport layer or a hole injection layer.

In an embodiment of the present disclosure, the organic film including the polymeric compound is a hole transport layer.

In addition, the organic film including the polymeric compound/EL device material of the present embodiment may be formed by a coating method (e.g., solution coating method).

For example, the organic film may be formed by using a solution coating method such as a spin coating method, a casting/casting method, a micro gravure coating method, a gravure coating method, a bar coating method, a roll coating method, a wire bar coating method, a dip coating method, a spray coating method, a screen printing method, a flexographic printing method, an offset printing method, or an ink jet printing method.

The solvent used in the solution coating method is not particularly limited as long as it can dissolve the polymeric compound/EL device material and may be appropriately selected. For example, it may be toluene, xylene, ethyl benzene, diethylbenzene, mesitylene, propyl benzene, cyclohexyl benzene, dimethoxy benzene, anisole, ethoxy toluene, phenoxy toluene, isopropyl biphenyl, dimethyl anisole, phenyl acetate, phenyl pyropionate, methyl benzoate, ethyl benzoate, cyclohexane, and the like.

In addition, the amount of the solvent used is not particularly limited, but considering the ease of coating and the like, a concentration of the polymeric compound/EL device material may be, for example, greater than or equal to about 0.1 mass % and less than or equal to about 10 mass %, for example, greater than or equal to about 0.5 mass % and less than or equal to about 5 mass %.

The method for forming a layer other than the organic film including the polymeric compound/EL device material is not particularly limited.

Layers other than the organic film including the polymeric compound/EL device material of the present embodiment may be formed, for example, by a vacuum deposition method or a solution coating method.

The substrate 110 may be a substrate used in a general EL device. For example, the substrate 110 may be a semiconductor substrate such as a glass substrate, a silicon substrate, and the like, or a transparent plastic substrate.

The first electrode 120 is formed on the substrate 110. The first electrode 120 is specifically an anode, and is formed by a material having a large work function among a metal, an alloy, or a conductive compound. For example, the first electrode 120 may be formed as a transmissive electrode by indium tin oxide ($In_2O_3$—$SnO_2$: ITO), indium zinc oxide ($In_2O_3$—ZnO), tin oxide ($SnO_2$), zinc oxide (ZnO) or the like due to improved transparency and conductivity.

The first electrode 120 may be formed as a reflective electrode by laminating magnesium (Mg), aluminum (Al), or the like on the transparent conductive layer. Further, after forming the first electrode 120 on the substrate 110, cleaning and UV-ozone treatment may be performed, if necessary.

On the first electrode 120, the hole injection layer 130 is formed. The hole injection layer 130 is a layer that facilitates injection of holes from the first electrode 120, and may be formed to have a thickness (dry film thickness, the same below) of greater than or equal to about 10 nm and less than or equal to about 1000 nm, or greater than or equal to about 20 nm and less than or equal to about 50 nm.

The hole injection layer 130 may be formed of a known hole injection material. The known hole injection material of the hole injection layer 130 may include, for example, triphenylamine-containing poly(ether ketone) (TPAPEK), 4-isopropyl-4'-methyldiphenyl iodonium tetrakis(pentafluorophenyl)borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4"-tris(3-methylphenylphenylamino)triphenylamine (m-MTDATA), N,N'-di(1-naphthyl)-N,N'-diphenylbenzidine (NPB), 4,4',4"-tris(diphenylamino)triphenylamine (TDATA), 4,4',4"-tris(N,N-2-naphthylphenylamino)triphenylamine (2-TNATA), polyaniline/dodecylbenzenesulphonic acid, poly(3,4-ethylenedioxythiophene)/poly(4-styrenesulfonate) (PEDOT/PSS), and polyaniline/10-camphorsulfonic acid, and the like.

The hole transport layer 140 is formed on the hole injection layer 130. The hole transport layer 140 is a layer having a function of transporting holes, and may be formed with a thickness of, for example, greater than or equal to about 10 nm and less than or equal to about 150 nm, and for example greater than or equal to about 20 nm and less than or equal to about 50 nm. In an embodiment, the hole transport layer 140 may be formed by a solution coating method using the polymeric compound according to the present embodiment. According to this method, the durability of the EL device 100 (device lifespan, luminescence lifespan, etc.) may be further improved. It is also possible to improve the current efficiency of the EL device 100 and reduce the driving voltage. In addition, since the hole transport layer may be formed by the solution coating method, a large area may be formed efficiently.

When any one other organic film of the EL device 100 includes the polymeric compound according to the present embodiment, the hole transport layer 140 may be formed of a known hole transport material. The known hole transport material may be, for example, 1,1-bis[(di-4-tolylamino)phenyl]cyclohexane (TAPC), carbazole derivatives such as N-phenylcarbazole and polyvinyl carbazole, and the like, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB).

The light emitting layer 150 is formed on the hole transport layer 140. The light emitting layer 150 is a layer that emits light by fluorescence or phosphorescence, and may be formed using a vacuum deposition method, a spin coating method, an inkjet printing method, or the like. The light emitting layer 150 may have a thickness of, for example, greater than or equal to about 10 nm and less than or equal to about 60 nm, for example, greater than or equal to about 20 nm and less than or equal to about 50 nm. The light emitting material of the light emitting layer 150 is not particularly limited and a well-known light emitting material may be used. The light emitting material included in the light emitting layer 150 may be, for example, a light emitting material capable of emitting light from triplet excitons (i.e., phosphorescent light emission). In this case, the driving lifespan of the EL device 100 may also be improved.

The light emitting layer 150 is not particularly limited and may have a known configuration. For example, the light emitting layer may include semiconductor nanoparticles or organometallic complexes. In other words, in an embodiment, the organic film has a light emitting layer containing semiconductor nanoparticles or organometallic complexes. When the light emitting layer includes the semiconductor nanoparticles, the EL device is a quantum dot electroluminescent device (QLED) or a quantum dot light emitting device. In the case where the light emitting layer includes the organometallic complexes, the EL device is an organic electroluminescent device (OLED).

In an embodiment (OLED) in which the light emitting layer includes semiconductor nanoparticles, the light emitting layer may include a plurality of semiconductor nanoparticles (quantum dots) arranged in a single layer or a plurality of layers. Herein, the semiconductor nanoparticles (quantum dots) are particles of a predetermined size having a quantum confinement effect. The diameter (average diameter) of the semiconductor nanoparticles (quantum dots) is not particularly limited, but may be greater than or equal to about 1 nm and less than or equal to about 10 nm.

The semiconductor nanoparticles (quantum dots) arranged in the light emitting layer may be synthesized by a wet chemical process, an organometallic chemical vapor deposition process, a molecular beam epitaxy process, or other similar processes. Among them, the wet chemical process is a method of growing particles by adding a precursor material to an organic solvent.

In the wet chemical process, when the crystal is grown, the organic solvent is naturally coordinated on the surface of the quantum dot crystal to act as a dispersant, thereby controlling the growth of the crystal. For this reason, the wet chemical processes are easier than vapor deposition methods such as metal organic chemical vapor deposition (MOCVD)

or molecular beam epitaxy (MBE), and the growth of semiconductor nanoparticles may be controlled at low cost.

By controlling the size of semiconductor nanoparticles (quantum dots), an energy band gap may be adjusted, and light in various wavelength bands may be obtained from the light emitting layer (quantum dot light emitting layer). Therefore, by using a plurality of quantum dots of different sizes, a display that emits light of a plurality of wavelengths may be manufactured. The size of the quantum dots may be selected to emit red, green, or blue light to constitute a color display. In addition, the size of the quantum dots may be combined to emit white light with various colors of light.

The semiconductor nanoparticles (quantum dots) may be a Group II-VI semiconductor compound; a Group III-V semiconductor compound; a Group IV-VI semiconductor compound; a Group IV element or compound; or a combination thereof.

The Group II-VI semiconductor compound is not particularly limited, but includes, for example, a binary compound selected from CdSe, CdTe, ZnS, ZnSe, ZnTe, ZnO, HgS, HgSe, HgTe, or a mixture thereof; a ternary compound selected from CdSeS, CdSeTe, CdSTe, ZnSeS, ZnTeSe, ZnSTe, HgSeS, HgSeTe, HgSTe, CdZnS, CdZnSe, CdZnTe, CdHgS, CdHgSe, CdHgTe, HgZnS, HgZnSe, HgZnTe, ora mixture thereof; ora quaternary compound selected from CdZnSeS, CdZnSeTe, CdZnSTe, CdHgSeS, CdHgSeTe, CdHgSTe, HgZnSeS, HgZnSeTe, HgZnSTe, or a mixture thereof.

The Group III-V semiconductor compound is not particularly limited, but includes, for example, a binary compound selected from GaN, GaP, GaAs, GaSb, AlN, AlP, AlAs, AlSb, InN, InP, InAs, InSb, or a mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof; or a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof.

The Group IV-VI semiconductor compound is not particularly limited, but includes, for example, a binary compound selected from SnS, SnSe, SnTe, PbS, PbSe, PbTe, or a mixture thereof; a ternary compound selected from SnSeS, SnSeTe, SnSTe, PbSeS, PbSeTe, PbSTe, SnPbS, SnPbSe, SnPbTe, or a mixture thereof; or a quaternary compound selected from SnPbSSe, SnPbSeTe, SnPbSTe, or a mixture thereof.

The Group IV element or compound is not particularly limited, but includes, for example, a single element compound selected from Si, Ge, or a mixture thereof; or a binary compound selected from SiC, SiGe, or a mixture thereof.

The semiconductor nanoparticles (quantum dots) may have a homogeneous single structure or a double structure of a core-shell.

The core-shell may include different materials. The materials constituting each core and shell may be made of different semiconductor compounds. However, an energy bandgap of the shell material is larger than an energy bandgap of the core material.

For example, the core-shell may have a structure of ZnTeSe/ZnSe/ZnS, InP/ZnSe/ZnS, CdSe/ZnS, InP/ZnS, and the like.

For example, a process of producing a quantum dot having a core (CdSe)-shell (ZnS) structure.

First, trioctylphosphine oxide (TOPO) is used as a surfactant. A precursor material of the core (CdSe), such as $(CH_3)_2Cd$ (dimethylcadmium) or TOPSe (trioctylphosphine selenide), is injected into an organic solvent to form crystals. At this time, after maintaining a certain time at high temperature so that the crystals grow to a certain size, the precursor materials of the shell (ZnS) are injected, to form a shell on the surface of the core already produced. As a result, a quantum dot of CdSe/ZnS capped with TOPO may be produced.

In addition, in the embodiment (OLED) in which the light emitting layer includes an organometallic complex, the light emitting layer 150 may include, for example, 6,9-diphenyl-9'-(5'-phenyl-[1,1':3',1"-terphenyl]-3-yl) 3,3'-bi[9H-carbazole], 3,9-biphenyl-5-(3-(4-phenyl-6-(5'-phenyl-[1,1':3',1"-terphenyl]-3-yl)-1,3,5-triazin-2-yl)phenyl)-9H-carbazole, 9,9'-diphenyl-3,3'-bi[9H-carbazole], tris(8-quinolinato)aluminum (Alq3), 4,4'-bis(carbazol-9-yl)biphenyl (CBP), poly(n-vinyl carbazole) (PVK), 9,10-di(naphthalene)anthracene (ADN), 4,4',4"-tris(N-carbazolyl)triphenylamine (TCTA), 1,3,5-tris(N-phenyl-benzimidazol-2-yl)benzene (TPBI), 3-tert-butyl-9,10-di(naphth-2-yl)anthracene (TBADN), distyrylarylene (DSA), 4,4'-bis(9-carbazole)2,2'-dimethyl-biphenyl (dmCBP), and the like, as a host material.

The light emitting layer 150 may include, for example, perylene and a derivative thereof, rubrene and a derivative thereof, coumarin and a derivative thereof, 4-dicyanomethylene-2-(dimethylaminostyryl)-6-methyl-4H-pyran (DCM) and a derivative thereof, an iridium (Ir) complex such as bis[2-(4,6-difluorophenyl)pyridinato]picolinate iridium(III) (Flrpic)), bis(1-phenylisoquinoline) (acetylacetonate) iridium(III) ($Ir(piq)_2(acac)$), tris(2-phenylpyridine)iridium (III) ($Ir(ppy)_3$), tris(2-(3-p-xylylphenyl)pyridine iridium (III), an osmium (Os) complex, a platinum complex, and the like, as a dopant material. Among these, for example, the light emitting material may be a light emitting organometallic complex compound.

A method for forming the light emitting layer is not particularly limited. It may be formed by coating (e.g., a solution coating method) a coating liquid including the semiconductor nanoparticles or organometallic complex. At this time, a solvent constituting the coating liquid may be a solvent which does not dissolve the materials (hole transport material, particularly polymeric compound) in the hole transport layer.

The electron transport layer 160 is formed on the light emitting layer 150. The electron transport layer 160 is a layer having a function of transporting electrons. The electron transport layer is formed using a vacuum deposition method, a spin coating method, or an inkjet method. The electron transport layer 160 may be formed to have a thickness of greater than or equal to about 15 nm and less than or equal to about 50 nm.

The electron transport layer 160 may be formed of a known electron transport material. The known electron transport material may include, for example, $ZnCl_2$, ZnMgO, 8-lithium(lithium quinolate) (Liq), tris 8-aluminum (Alq3), and a compound having a nitrogen-containing aromatic ring. Examples of the compound having the nitrogen-containing aromatic ring may include, for example, a compound including a pyridine ring such as 1,3,5-tri[(3-pyridyl)-phen-3-yl]benzene), a compound including a triazine ring such as 2,4,6-tris(3'-(pyridin-3-yl)biphenyl-3-yl)-1,3,5-triazine), a compound including an imidazole ring such as 2-(4-(N-phenylbenzoimidazolyl-1-yl-phenyl)-9,10-dinaphthylanthracene or 1,3,5-tris(N-phenyl-benzimidazol-2-yl) benzene (TPBI). The electron transport material may be used alone or as a mixture of two or more.

The electron injection layer 170 is formed on the electron transport layer 160. The electron injection layer 170 is a layer having a function of facilitating injection of electrons from the second electrode 180. The electron injection layer 170 is formed using a vacuum deposition method or the like. The electron injection layer 170 may be formed to have a thickness of greater than or equal to about 0.1 nm and less than or equal to about 5 nm, and more specifically, greater than or equal to about 0.3 nm and less than or equal to about 2 nm.

As a material for forming the electron injection layer 170, any known material may be used. For example, the electron injection layer 170 may be formed of a lithium compound such as (8-quinolinato) lithium (lithium quinolate, Liq) and lithium fluoride (LiF), sodium chloride (NaCl), cesium fluoride (CsF), lithium oxide ($Li_2O$), or barium oxide (BaO).

The second electrode 180 is formed on the electron injection layer 170. The second electrode 180 is formed using a vacuum deposition method or the like. The second electrode 180 may be, for example, a cathode, and may be formed of a metal, an alloy, or a conductive compound having a small work function. For example, the second electrode 180 may be formed as a reflective electrode with a metal such as lithium (Li), magnesium (Mg), aluminum (Al), calcium (Ca), or an alloy such as aluminum-lithium (Al—Li), magnesium-indium (Mg—In), magnesium-silver (Mg—Ag), or the like. The second electrode 180 may be formed to have a thickness of greater than or equal to about 10 nm and less than or equal to about 200 nm, and more and specifically, greater than or equal to about 50 nm and less than or equal to about 150 nm. Alternatively, the second electrode 180 may be formed as a transmissive electrode by a thin film of less than or equal to about 20 nm of a metal material or a transparent conductive layer such as indium tin oxide ($In_2O_3$—$SnO_2$), and indium zinc oxide ($In_2O_3$—ZnO).

In the above, the EL device 100 according to an embodiment has been described as an example of an electroluminescent device according to an embodiment. In the EL device 100 according to an embodiment, durability (device lifespan or luminescence lifespan, etc.) may be further improved by disposing an organic film (particularly, a hole transport layer or a hole injection layer) including the polymeric compound. In addition, the luminous efficiency (current efficiency) may be further improved and the driving voltage may be reduced.

The stacked structure of the EL device 100 according to an embodiment is not limited to the above embodiments.

The EL device 100 according to an embodiment may also be formed in other known stacked structures. For example, in the EL device 100, one or more of the hole injection layer 130, the hole transport layer 140, the electron transport layer 160, and the electron injection layer 170 may be omitted, or an additional layer may be further provided. In addition, each layer of the EL device 100 may be formed as a single layer, or may be formed as a plurality of layers.

For example, the EL device 100 may further include a hole blocking layer between the hole transport layer 140 and the light emitting layer 150 to prevent excitons or holes from diffusing into the electron transport layer 160. The hole blocking layer may be formed of, for example, an oxadiazole derivative, a triazole derivative, or a phenanthroline derivative.

In addition, the polymeric compound according to an embodiment may be applied to electroluminescent devices other than the QLED or OLED.

Examples of other electroluminescent devices to which the polymeric compound according to an embodiment is applicable are not particularly limited, but examples thereof include organic-inorganic perovskite light emitting devices and the like.

EXAMPLES

The effects of the present disclosure will be described with reference to the following examples and comparative examples. However, the technical scope of the present disclosure is not limited only to the following examples. Unless otherwise specified in the following examples, the operation is performed at room temperature (25° C.). In addition, unless otherwise indicated, "%" and "part" mean "mass %" and "part by mass", respectively.

Synthesis Example 1

(Synthesis of Compound M-1)

Compound M-1 is synthesized according to the following reaction scheme.

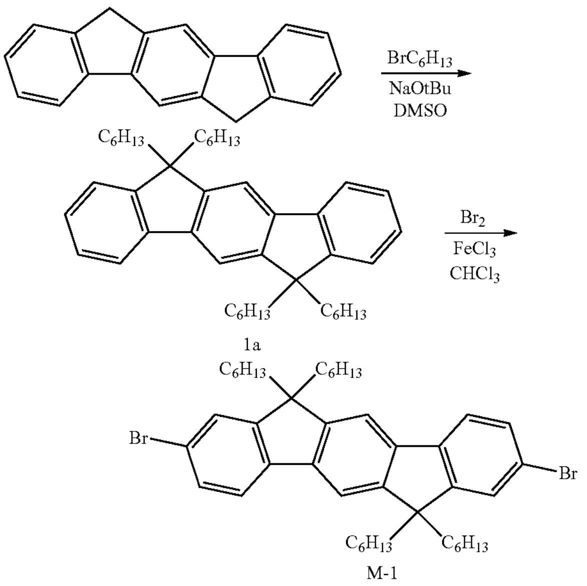

(Synthesis of Compound 1a)

In a four-necked flask, 6,12-dihydroindeno[1,2-b]fluorene (39.3 mmol, 10.0 g), DMSO (65 ml), and sodium tert-butoxide (NaOtBu) (235 mmol, 22.7 g) are added and then stirred under a nitrogen atmosphere at room temperature (25° C.) for 10 minutes. Subsequently, 1-bromo hexane (235 mmol, 38.9 g) is added dropwise thereto and then, stirred by heating to 80° C. for 3 hours. When the reaction is completed, the obtained solution is cooled to room temperature and extracted with hexane. The obtained organic layer is concentrated and then, the crude solid is recrystallized with hexane and ethanol, obtaining Compound 1a (amount: 19.7 g, yield: 85%).

(Synthesis of Compound M-1)

In a four-necked flask, Compound 1a (16.9 mmol, 10.0 g), iron(III) chloride ($FeCl_3$) (0.25 mmol, 15 mg), and chloroform (150 ml) are added and then, stirred under a nitrogen atmosphere at 0° C. for 5 minutes. Subsequently, bromine (33.8 mmol, 1.7 ml) is added dropwise thereto and then stirred at room temperature for 3 hours. When the reaction is completed, an aqueous solution of sodium thiosulfate is added to the reaction mixture, and extracted with hexane.

The organic layer is concentrated and recrystallized with hexane and ethanol, obtaining Compound M-1 (amount: 6.1 g, yield: 72%).

Synthesis Example 2

(Synthesis of Compound M-2)

Compound M-2 is synthesized according to the following reaction scheme.

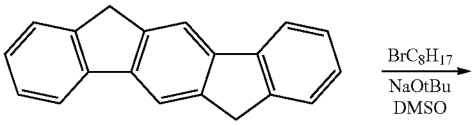

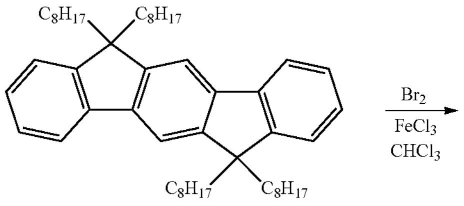

2a

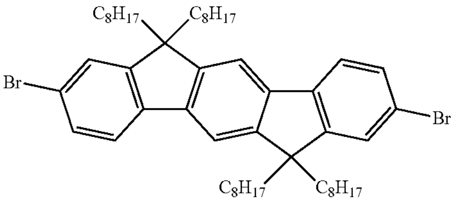

M-2

Compound M-2 is obtained in the same manner as in Synthesis Example 1 except that 1-bromo octane is used instead of the 1-bromo hexane (amount: 5.9 g, yield: 70%).

Synthesis Example 3

(Synthesis of Compound M-3)

Compound M-3 is synthesized according to the following reaction scheme.

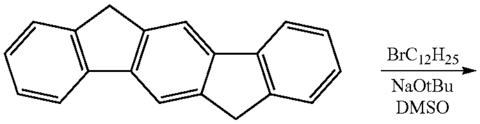

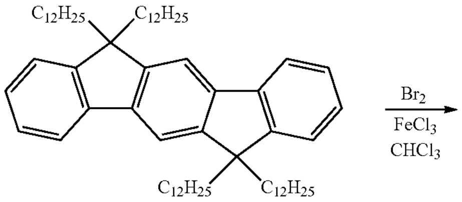

3a

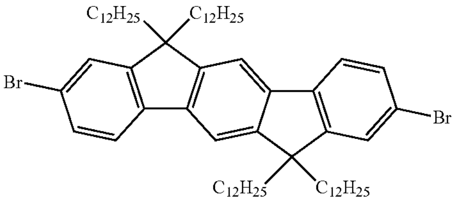

M-3

Compound M-3 is obtained in the same manner as in Synthesis Example 1 except that 1-bromododecane is used instead of the 1-bromo hexane (amount: 5.4 g, yield: 74%).

Synthesis Example 4

(Synthesis of M-A1)

Compound M-A1 (Compound M-A1) is synthesized according to the following reaction scheme.

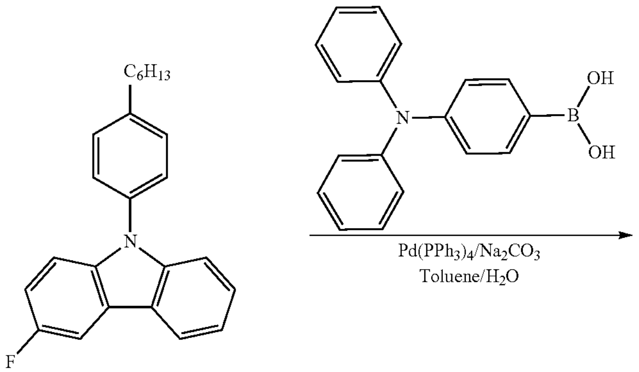

-continued
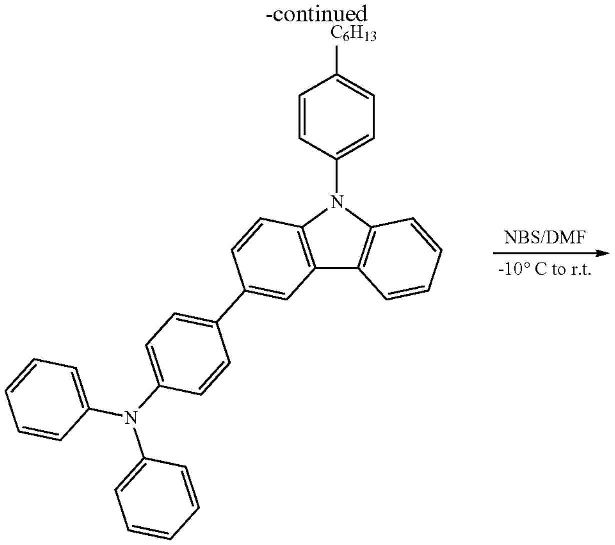
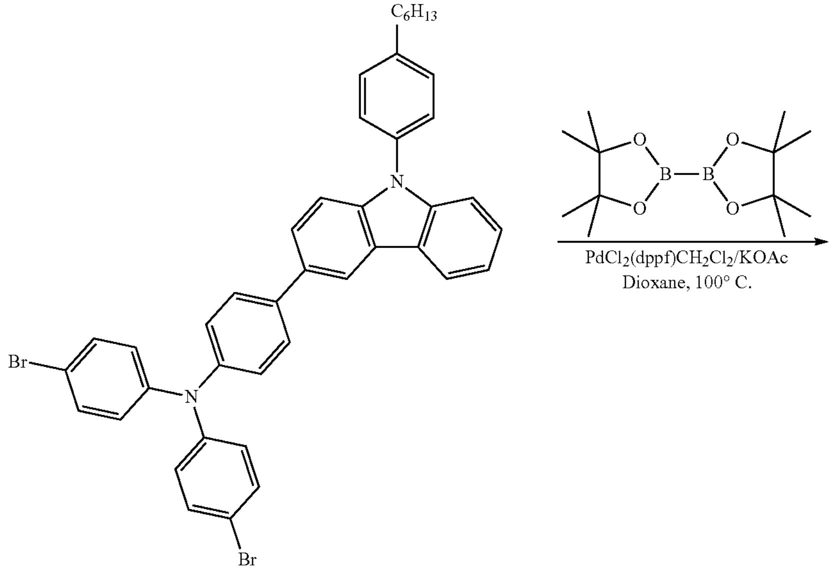

-continued

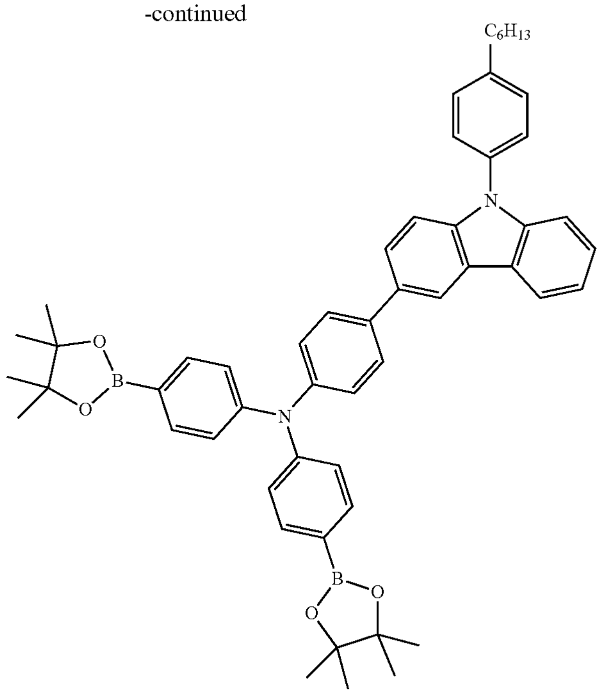

Compound M-A1

In a 1 L-four-necked flask, 9-(4-hexylphenyl)-3-iodo-9-carbazole (20.0 g), 4-(diphenyl amino)phenyl boronic acid (15.3 g), sodium carbonate (9.51 g), tetrakis(triphenylphosphine)palladium (0) ($Pd(PPh_3)_4$) (2.49 g), toluene (221 mL), ethanol (110 mL), and water (110 mL) are added and then stirred at 120° C. (bath temperature) for 3 hours.

The reaction mixture is cooled to room temperature, and after separating an aqueous layer, an organic layer therefrom is washed with water (100 mL×2) and dried with magnesium sulfate. After removing the solvent under a reduced pressure distillation, the residue is purified through column chromatography, obtaining 4-(9-(4-hexylphenyl)-9-carbazol-3-yl)-N,N-diphenyl)aniline (17.7 g).

In a 500 mL-four-necked flask, the obtained 4-(9-(4-hexylphenyl)-9-carbazol-3-yl)-N,N-diphenyl)aniline (17.7 g) is combined with N,N-dimethyl formamide (DMF) (310 mL). The reaction mixture is cooled by ice, and N-bromo succinimide (NBS) (11.7 g) dissolved in DMF (30 mL) is added thereto under a nitrogen atmosphere and then stirred for 6 hours.

An insoluble matter is separated therefrom by filtration, washed with 800 mL of methanol, washed with 800 mL of water, and vacuum-dried, obtaining 4-bromo-N-(4-bromophenyl)-N-(4-(9-(4-hexylphenyl)-9-carbazol-3-yl)phenyl) aniline (14.0 g).

In a 500 mL-four-necked flask, the obtained 4-bromo-N-(4-bromophenyl)-N-(4-(9-(4-hexylphenyl)-9-carbazol-3-yl) phenyl)aniline (14.0 g), bis(pinacolato)diboron (14.8 g), potassium acetate (KOAc) (11.4 g), [1,1'-bis(diphenyl phosphino)ferrocene]dichloro palladium (II) dichloromethane adduct ($PdCl_2(dppf)CH_2Cl_2$) (0.477 g), and 1,4-dioxane (160 mL) are put and then, refluxed under a nitrogen atmosphere at 100° C. for 4 hours.

The reaction solution is cooled to room temperature, treated with Celite as a filter aid, and passed through silica gel. After removing the solvent through distillation under a reduced pressure, the residue is dissolved in toluene (200 mL), and activated carbon (14.2 g) is added thereto and then, the mixture is refluxed for 30 minutes. After separating the activated carbon by filtration and removing the solvent through distillation under a reduced pressure, the residue is recrystallized with a mixed solvent of toluene and acetonitrile, obtaining Compound M-A1 (11.9 g).

Example 1

(Synthesis of Polymeric Compound P-1)

Under an argon atmosphere, Compound M-A1 (1.777 g) synthesized in Synthesis Example 4, Compound M-1 (1.617 g) synthesized in Synthesis Example 1, palladium acetate (4.8 mg), tris(2-methoxy phenyl)phosphine (45.7 g), toluene (64 mL), and a 20 mass % tetraethylammonium hydroxide aqueous solution (11.1 g) are mixed and then, stirred under reflux for 6 hours. Subsequently, phenyl boronic acid (261.4 mg), bis(triphenylphosphine)palladium(II) dichloride (91.0 mg), and a 20 mass % tetraethylammonium hydroxide aqueous solution (11.1 g) are added thereto and then, heated under reflux for 6 hours. Then, after removing an aqueous layer from the obtained solution, sodium N,N-diethyldithiocarbamate trihydrate (6.5 g) and ion-exchanged water (60 mL) are added thereto, and then, stirred at 85° C. for 6 hours.

After separating the obtained solution into an organic layer and an aqueous layer, the organic layer is washed with water, followed by a 3 mass % acetic acid aqueous solution, and lastly, water. The organic layer is added dropwise to methanol to precipitate a polymer, and the polymer is isolated and dried, obtaining a solid. This solid is dissolved in toluene and passed through a chromatography column charged with silica gel/alumina, and a solvent is removed therefrom through distillation under a reduced pressure. The obtained liquid is added dropwise to methanol to precipitate a solid, and the solid is isolated and dried, obtaining Polymeric Compound P-1 (amount: 1.56 g). Polymeric Compound P-1 is measured with respect to a weight average molecular weight (Mw) and polydispersity (Mw/Mn) by using SEC. As a result, Polymeric Compound P-1 has a weight average molecular weight (Mw) and polydispersity (Mw/Mn) of 150,600 g/mol and 2.35, respectively.

Polymeric Compound P-1 is presumed to be a polymeric compound having the following structural unit from the composition of the monomers.

(Polymeric Compound P-1)

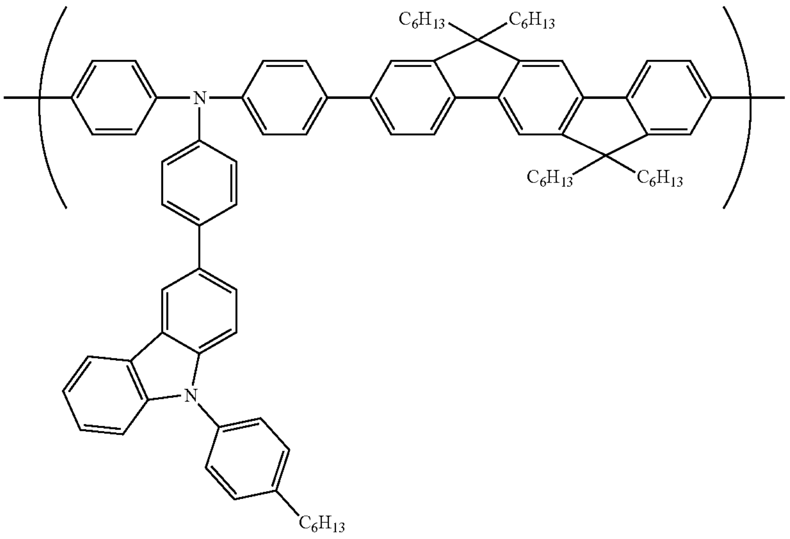

Example 2

(Synthesis of Polymeric Compound P-2)

Polymeric Compound P-2 is obtained in the same manner as in Example 1 except that Compound M-2 (1.296 g) synthesized according to Synthesis Example 2 is used instead of Compound M-1. Polymeric Compound P-2 is measured with respect to a weight average molecular weight (Mw) and polydispersity (Mw/Mn) by using SEC. As a result, the weight average molecular weight (Mw) and the polydispersity (Mw/Mn) of Polymeric Compound P-2 are respectively 149,000 g/mol and 2.24.

Polymeric Compound P-2 obtained in this way is presumed to be a polymeric compound having the following structural unit from the composition of the monomers.

(Polymeric Compound P-2)

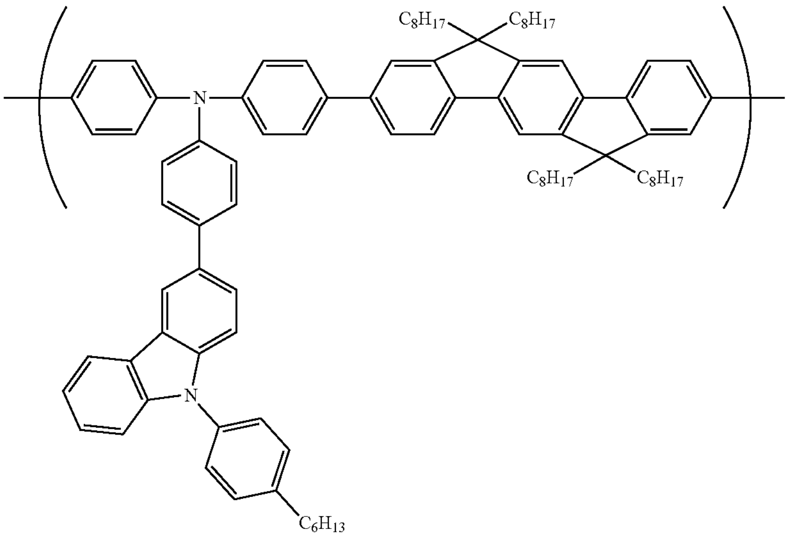

Example 3

(Synthesis of Polymeric Compound P-3)

Polymeric Compound P-3 is obtained in the same manner as in Example 1 except that Compound M-3 (1.673 g) synthesized according to Synthesis Example 3 is used instead of Compound M-1. Polymeric Compound P-3 is measured with respect to a weight average molecular weight (Mw) and polydispersity (Mw/Mn) with SEC. As a result, the weight average molecular weight (Mw) and the polydispersity (Mw/Mn) of Polymeric Compound P-3 are respectively 134,400 g/mol and 2.23.

Polymeric Compound P-3 obtained in this way is presumed to be a polymeric compound having the following structural unit from the composition of the monomers.

(Polymeric Compound P-3)

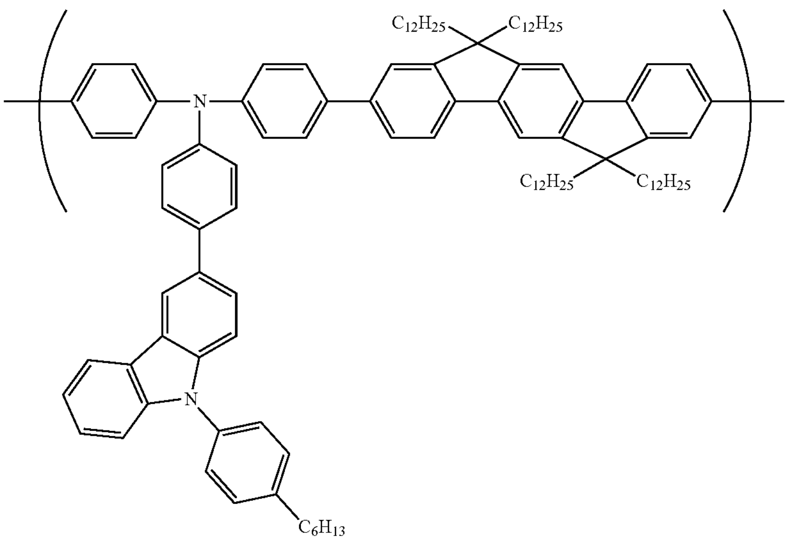

Example 4

(Synthesis of Polymeric Compound P-4)

Under an argon atmosphere, Compound M-A1 (0.592 g, 1.0 mole equivalent) synthesized in Synthesis Example 4, Compound M-1 (0.270 g, 0.5 mole equivalent) synthesized in Synthesis Example 1, Compound M-3 (0.391 g, 0.5 mole equivalent) synthesized in Synthesis Example 3, palladium acetate (1.6 mg), tris(2-methoxy phenyl)phosphine (15.7 g), toluene (20 mL), and a 20 mass % tetraethylammonium hydroxide aqueous solution (4.1 g) are mixed and then, stirred under reflux for 6 hours. Subsequently, phenyl boronic acid (261.4 mg), bis(triphenylphosphine) palladium (II)dichloride (30.1 mg), and a 20 mass % tetraethyl ammonium hydroxide aqueous solution (11.1 g) are added to the reaction solution and then, heated under reflux for 6 hours. After removing an aqueous layer from the obtained solution, sodium N,N-diethyldithiocarbamate trihydrate (6.5 g) and ion-exchanged water (60 mL) are added thereto and then, stirred at 85° C. for 6 hours. The obtained solution is separated into an organic layer and an aqueous layer, and the organic layer is washed with water, followed by a 3 mass % acetic acid aqueous solution, and lastly, water. The organic layer is added dropwise to methanol to precipitate a polymer, and the polymer is isolated and dried, obtaining a solid. This solid is dissolved in toluene and passed through column chromatography charged with silica gel/alumina to remove a solvent through distillation under a reduced pressure. The obtained liquid is added dropwise to methanol, and a solid precipitated therein is separated therefrom and dried, obtaining Polymeric Compound P-4 (amount: 0.56 g). Polymeric Compound P-4 is characterized with respect to a weight average molecular weight (Mw) and polydispersity (Mw/Mn) with SEC. As a result, the weight average molecular weight (Mw) and the polydispersity (Mw/Mn) of Polymeric Compound P-4 are respectively 185,000 g/mol and 2.56.

Polymeric Compound P-4 obtained in this way is presumed to be a polymeric compound having the following structural unit from the composition of the monomers.

(Polymeric Compound P-4)

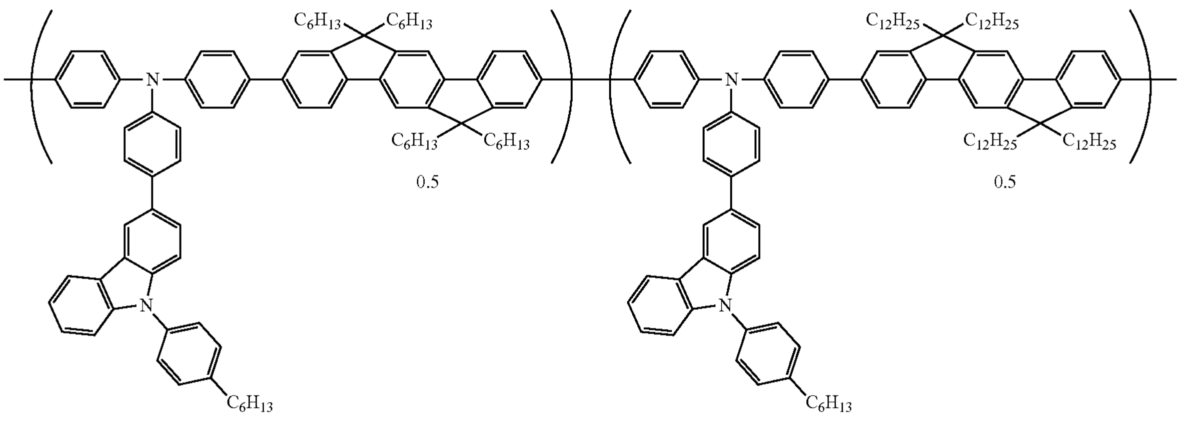

Example 5

(Synthesis of Polymeric Compound P-5)

Polymeric Compound P-5 is obtained in the same manner as in Example 4 except that Compound M-A1 (0.790 g, 1.0 mole equivalent) synthesized in Synthesis Example 4, Compound M-1 (0.270 g, 0.375 mole equivalent) synthesized in Synthesis Example 1, and Compound M-3 (0.651 g, 0.625 mole equivalent) synthesized in Synthesis Example 3 are used. Polymeric Compound P-5 is characterized with respect to a weight average molecular weight (Mw) and polydispersity (Mw/Mn) with SEC. As a result, the weight average molecular weight (Mw) and the polydispersity (Mw/Mn) of Polymeric Compound P-5 are respectively 102,000 g/mol and 2.12.

Polymeric Compound P-5 obtained in this way is presumed to be a polymeric compound having the following structural unit from the composition of the monomers.

Example 6

(Synthesis of Polymeric Compound P-6)

Polymeric Compound P-6 is obtained in the same manner as in Example 4 except that Compound M-A1 (0.592 g, 1.0 mole equivalent) synthesized in Synthesis Example 4, Compound M-1 (0.135 g, 0.25 mole equivalent) synthesized in Synthesis Example 1, and Compound M-3 (0.586 g, 0.75 mole equivalent) synthesized in Synthesis Example 3. Polymeric Compound P-6 is characterized with respect to a weight average molecular weight (Mw) and polydispersity (Mw/Mn) with SEC. As a result, the weight average molecular weight (Mw) and the polydispersity (Mw/Mn) of Polymeric Compound P-6 are respectively 55,000 g/mol and 2.20.

Polymeric Compound P-6 obtained in this way is presumed to be a polymeric compound having the following structural unit from the composition of the monomers.

(Polymeric Compound P-5)

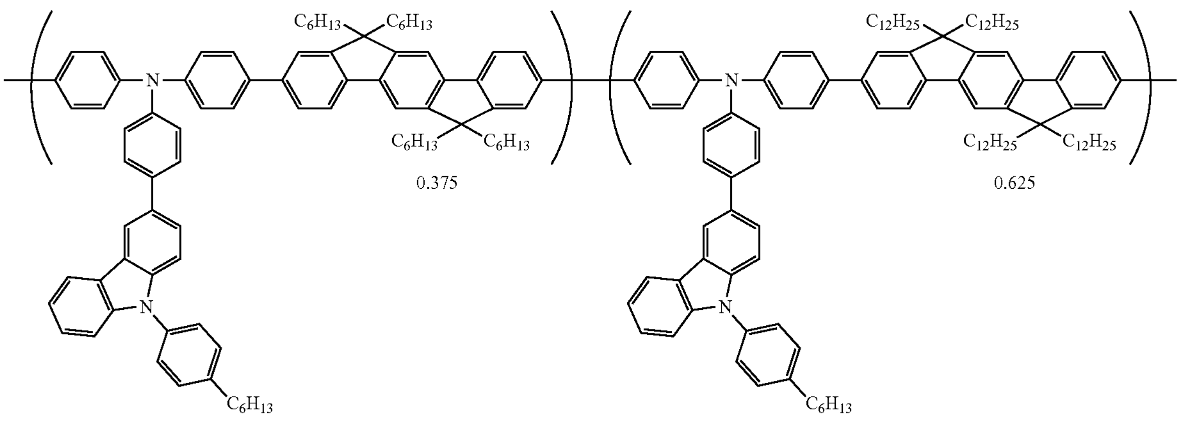

(Polymeric Compound P-6)

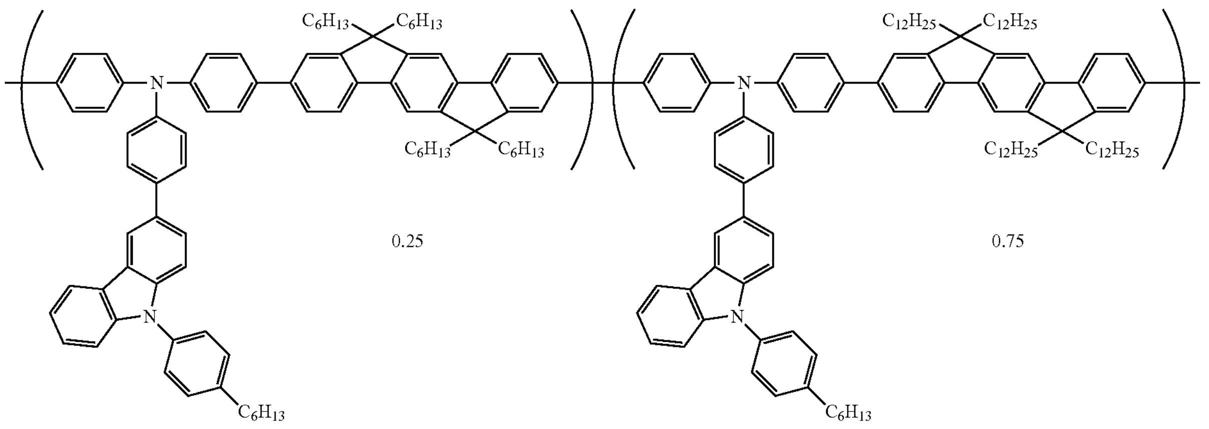

Comparative Example 1

(Synthesis of Polymeric Compound P-7)

Under an argon atmosphere, Compound M-A1 (1.64 g) synthesized in Synthesis Example 4, 2,7-dibromo-9,9-di-n-hexyl fluorene (0.983 g), palladium acetate (9.0 mg), tris(2-methoxy phenyl)phosphine (42.2 mg), toluene (53 mL), and a 20 mass % tetraethylammonium hydroxide aqueous solution (10.3 g) are put in a four-necked flask and then, stirred at 85° C. for 6 hours. Subsequently, phenyl boronic acid (241 mg), tetrakis(triphenyl phosphino)palladium (140 mg), and a 20 mass % tetraethylammonium hydroxide aqueous solution (10.3 g) are added thereto and then, stirred for 3 hours. Then, sodium N,N-diethyldithiocarbamate trihydrate (13.5 g) dissolved in ion-exchanged water (50 mL) is added thereto and then, stirred at 85° C. for 2 hours. After separating an organic layer from an aqueous layer, the organic layer is washed with water, followed by a 3 mass % acetic acid aqueous solution, and lastly, water. Subsequently, the organic layer is passed through a chromatography column charged with silica gel/alumina and the eluent was concentrated to remove a solvent through distillation under a reduced pressure. The obtained liquid is added dropwise to methanol, and a solid precipitate therein is dissolved in toluene. Subsequently, this solution is added dropwise to methanol for precipitation, and the precipitated solid is separated therefrom and dried, obtaining Polymeric Compound P-7 (1.35 g). Polymeric Compound P-7 is characterized with respect to a weight average molecular weight (Mw) and polydispersity (Mw/Mn) with SEC. As a result, the weight average molecular weight (Mw) and the polydispersity (Mw/Mn) of Polymeric Compound P-7 are respectively 86,000 g/mol and 2.56.

Polymeric Compound P-7 obtained in this way is presumed to be a polymeric compound having the following structural unit from the composition of the monomers.

(Polymeric Compound P-7)

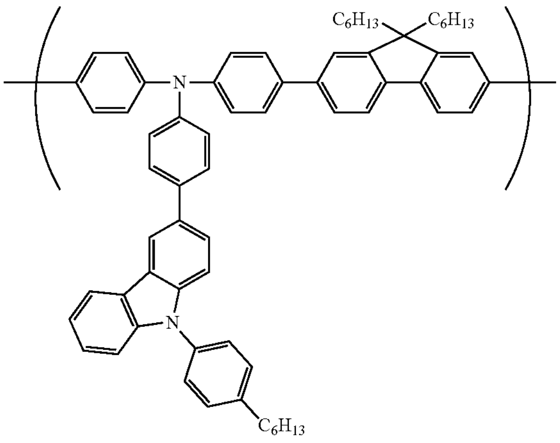

Example 7

As a first electrode (anode), a glass substrate with indium tin oxide (ITO), which is patterned with a film thickness of 150 nm, is used. This glass substrate with ITO is sequentially washed with a neutral detergent, deionized water, water, and isopropyl alcohol and then, treated with UV-ozone. Subsequently, on the glass substrate with ITO, poly (3,4-ethylenedioxythiophene)/poly(4-styrenesulfonate) (PEDOT/PSS) (Sigma-Aldrich Co., Ltd.) is spin-coated to have a dry film thickness of 30 nm and dried. As a result, a hole injection layer with a thickness (dry film thickness) of 30 nm is formed on the glass substrate with ITO.

On the hole injection layer, a toluene solution of 1.0 mass % of Polymeric Compound P-1 of Example 1 (hole transport material) is spin-coated to have a dry film thickness of 30 nm and heat-treated at 230° C. for 60 minutes, forming a hole transport layer. As a result, the hole transport layer with a thickness (dry film thickness) of 30 nm is formed on the hole injection layer.

Blue quantum dots of ZnTeSe/ZnSe/ZnS (core/shell/shell; average diameter=about 10 nm) having the following structure are dispersed in octane at 2.0 mass %, preparing quantum dot dispersion:

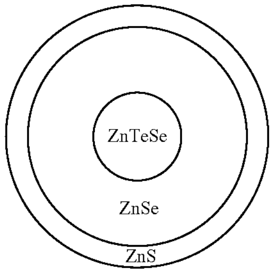

The hole transport layer (particularly, Polymeric Compound P-1) is not dissolved in octane. This quantum dot dispersion is spin-coated to have a dry film thickness of 30 nm on the hole transport layer and then, dried. As a result, a quantum dot light emitting layer with a thickness (dry film thickness) of about 30 nm is formed on the hole transport layer. When the quantum dot dispersion is irradiated with ultraviolet (UV) rays, light generated therefrom has a central wavelength of 462 nm and a full width at half maximum (FWHM) of 30 nm.

Subsequently, $ZnCl_2$ is dissolved in ethanol as a solvent at a concentration of 0.7 mol/L, thus forming a $ZnCl_2$ coating solution. The prepared $ZnCl_2$ coating solution is slowly dripped so as to cover the light emitting surface formed above, allowed to stand for 60 seconds, rotated at 1,000 rpm for 40 seconds in a spin coating method, and dried by heating at 80° C. for 20 minutes. Continuously, ethanol also is slowly dripped so as to cover the light emitting surface formed above, repeatedly twice rotated at 1,000 rpm in the spin coating method, and dried by heating at 80° C. for 20 minutes.

ZnMgO is dispersed at 1 mass % in ethanol, preparing ZnMgO dispersion. The ZnMgO dispersion is coated to have a dry film thickness of about 20 nm on the quantum dot light emitting layer in the spin coating method and then, dried by heating at 80° C. for 30 minutes. As a result, an electron transport layer with a thickness (dry film thickness) of about 20 nm is formed on the quantum dot light emitting layer.

A vacuum deposition apparatus is used to deposit aluminum (Al) on the electron transport layer. As a result, a second electrode (cathode) with a thickness of about 100 nm is formed on the electron transport layer. Accordingly, Quantum Dot Electroluminescent Device 1 is obtained.

Example 8

Quantum Dot Electroluminescent Device 2 is obtained in the same manner as in Example 7 except that Polymeric Compound P-2 of Example 2 is used instead of Polymeric Compound P-1.

Example 9

Quantum Dot Electroluminescent Device 3 is obtained in the same manner as in Example 7 except that Polymeric Compound P-3 of Example 3 is used instead of Polymeric Compound P-1.

Example 10

Quantum Dot Electroluminescent Device 4 is obtained in the same manner as in Example 7 except that Polymeric Compound P-4 of Example 4 is used instead of Polymeric Compound P-1.

Example 11

Quantum Dot Electroluminescent Device 5 is obtained in the same manner as in Example 7 except that Polymeric Compound P-5 of Example 5 is used instead of Polymeric Compound P-1.

Example 12

Quantum Dot Electroluminescent Device 6 is obtained in the same manner as in Example 7 except that Polymeric Compound P-6 of Example 6 is used instead of Polymeric Compound P-1.

Comparative Example 2

Comparative Quantum Dot Electroluminescent Device 1 is obtained in the same manner as in Example 7 except that poly[(9,9-dioctyl fluorenyl-2,7-diyl)-co-(4,4'-(N-(4-sec-butyl phenyl)diphenyl amine)] (TFB) (Luminescence Technology Corp.) having the following structure is used instead of Polymeric Compound P-1

TFB is characterized with respect to a weight average molecular weight (Mw) and polydispersity (Mw/Mn) with SEC. As a result, the weight average molecular weight and Mw/Mn of TFB are respectively 359,000 g/mol and 3.4.

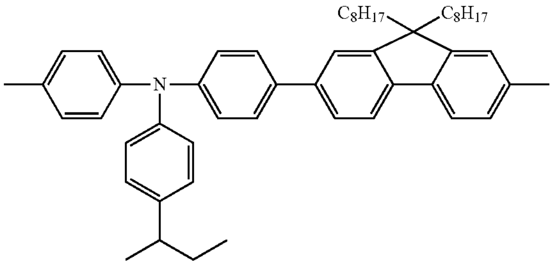

(TFB)

Comparative Example 3

Comparative Quantum Dot Electroluminescent Device 2 is obtained in the same manner as in Example 7 except that Polymeric Compound P-7 of Comparative Example 1 is used instead of Polymeric Compound P-1.

[Evaluation 1 of Quantum Dot Electroluminescent Device]

Quantum Dot Electroluminescent Devices 1 to 6 according to Examples 7 to 12 and Comparative Quantum Dot Electroluminescent Devices 1 and 2 according to Comparative Examples 2 and 3 are evaluated with respect to emission characteristics (V@5 mA (V), ΔV (V)) and luminescence lifespan in the following method, and the results are shown in Table 1.

(V@5 mA (V))

When a voltage is applied to each quantum dot electroluminescent device by using a DC constant voltage (source meter, KEYENCE Corp.), a current starts to flow at a constant voltage, and the quantum dot electroluminescent device emits light. A voltage (V) at current density of 5 $mA/cm^2$ is obtained as a driving voltage "V@5 mA (V)."

(ΔV (V) and Luminescence Lifespan)

A predetermined voltage is applied to each quantum dot electroluminescent device by using a DC constant voltage power source (source meter, KEYENCE Corp.) to make the quantum dot electroluminescent device emit light. While the quantum dot electroluminescent device is measured with respect to luminance by using a luminance measuring device (SR-3, Topcom Technology Co., Ltd.), when the luminance reaches 650 nit (cd/$m^2$) by slowly increasing a current, the quantum dot electroluminescent device is allowed to stand by keeping the current constant. The luminance measured by using the luminance measuring device is gradually deteriorated and reaches 90% of the initial luminance is regarded as "LT90 (hr)."

In addition, a difference between an initial voltage (V) when the luminance is 650 nit (cd/$m^2$) and a voltage (V) when the luminance reaches 50% of the initial luminance is regarded as ΔV (V). In Table 1, LT90 (hr) of each device is calculated as a relative value, when LT90 (hr) of Comparative Quantum Dot Electroluminescent Device 2 according to Comparative Example 2 is 1.0, and shown under "LT90 TFB=1."

TABLE 1

| | Polymeric compound | V@5 mA (V) | ΔV (V) | LT90 TFB = 1 |
|---|---|---|---|---|
| Example 7 | P-1 | 2.7 | 0.37 | 4.6 |
| Example 8 | P-2 | 2.8 | 0.37 | 5.3 |
| Example 9 | P-3 | 2.7 | 0.38 | 2.0 |
| Example 10 | P-4 | 2.9 | 0.36 | 6.9 |
| Example 11 | P-5 | 2.7 | 0.38 | 8.1 |
| Example 12 | P-6 | 2.9 | 0.36 | 9.9 |
| Comparative Example 2 | TFB | 3.0 | 0.40 | 1.0 |
| Comparative Example 3 | P-7 | 2.8 | 0.38 | 1.1 |

Referring to the results of Table 1, Quantum Dot Electroluminescent Device 1 to 6 of the examples, compared with Comparative Quantum Dot Electroluminescent Devices 1 and 2, exhibit significantly high durability (significantly long luminescence lifespan).

[Evaluation of Characteristics of Each Polymeric Compound]

Polymeric Compounds P-1 to P-6 of Examples 1 to 6, TFB, and Polymeric Compound P-7 of Comparative Example 1 are measured with respect to HOMO level (eV) and glass transition temperature ($T_g$) (° C.) in the following methods, and the results are shown in Table 2.

In addition, Polymeric Compounds P-1 to P-6 of Examples 1 to 6, TFB, and Polymeric Compound P-7 of Comparative Example 1 are measured with respect to characteristics of the model devices in the following method, and the results are shown in Table 2.

(Measurement of HOMO Level)

Each polymeric compound is dissolved in xylene at a concentration of 1 mass %, preparing a coating solution. The coating solution is spin-coated at 2,000 rpm on a glass substrate attached with ITO and cleaned with UV to form a film, which is dried on a hot plate at 150° C. for 30 minutes, preparing a sample. The sample is measured with respect to HOMO level in the air by using a photoelectron spectroscopy device (AC-3, Riken Keiki Co., Ltd.). Herein, a rising tangential intersection calculated from the measurement is regarded as the HOMO level (eV). The HOMO level is, in general, negative.

(Glass Transition Temperature ($T_g$))

A glass transition temperature ($T_g$) of each polymeric compound is measured with a differential scanning calorimeter (DSC) (DSC6000, Seiko Scientific Co., Ltd.) by heating the sample to 300° C. at 10° C./min and keeping it there for 10 minutes, cooling it to 25° C. at 10° C./min and keeping it there for 10 minutes, and then, heating it to 300° C. at 10° C./min. After the measurement, the temperature is cooled to room temperature (25° C.) at 10° C./min.

Reference Experiment: Characteristic Evaluation of Model Device

Reference Example 1

As a first electrode (anode), a glass substrate on which a stripe-shaped indium tin oxide (ITO) is formed as a film with a thickness of about 150 nm is prepared. On the glass substrate, PEDOT-PSS (Sigma-Aldrich Co., Ltd.) is spin-coated to have a dry film thickness of about 30 nm and dried, forming a hole injection layer with a film thickness of about 30 nm.

Subsequently, Polymeric Compound P-1 of Example 1 (hole transport material) is dissolved in xylene as a solvent at a concentration of 1 mass %, preparing a polymer coating solution. The polymer coating solution is spin-coated to have a dry film thickness of about 30 nm on the hole injection layer and then, dried by heating at 150° C. for 30 minutes. Accordingly, a hole transport layer with a dry film thickness of about 30 nm is formed.

Separately, a quantum dot dispersion is prepared in the same manner as in Example 7. This quantum dot dispersion is spin-coated to have a dry film thickness of about 20 nm on the hole transport layer and then, dried by heating at 80° C. for 30 minutes. Accordingly, a quantum dot light emitting layer with a dry film thickness of about 20 nm is formed.

Subsequently, $ZnCl_2$ is dissolved in ethanol as a solvent at a concentration of 0.7 mol/L, thus preparing a $ZnCl_2$ coating solution. The $ZnCl_2$ coating solution is slowly dripped to cover the quantum dot light emitting layer, allowed to stand for 60 seconds, rotated at 1,000 rpm for 40 seconds in the spin coating method, and dried by heating at 80° C. for 20 minutes. Subsequently, ethanol is slowly dripped to cover the light emitting layer, twice repeatedly rotated at 1000 rpm in the spin coating method, and dried by heating at 80° C. for 20 minutes.

α-NPD (N,N'-di-1-naphthyl-N,N'-diphenyl benzidine) and HAT-CN (dipyrazino[2,3-f:2',3'-h]quinoxaline-2,3,6,7,10,11-hexacarbonitrile) are sequentially vacuum deposited on the hole transport layer to form electron blocking layers with each thickness of about 36 nm and about 10 nm, respectively, manufacturing Hole Only Device 1.

Reference Example 2

Hole Only Device 2 is manufactured in the same manner as in Reference Example 1 except that Polymeric Compound P-2 of Example 2 is used instead of Polymeric Compound P-1 of Reference Example 1.

Reference Example 3

Hole Only Device 3 is manufactured in the same manner as in Reference Example 1 except that Polymeric Compound P-3 of Example 3 is used instead of Polymeric Compound P-1 of Reference Example 1.

Reference Example 4

Hole Only Device 4 is manufactured in the same manner as in Reference Example 1 except that Polymeric Compound P-4 of Example 4 is used instead of Polymeric Compound P-1 of Reference Example 1.

Reference Example 5

Hole Only Device 5 is manufactured in the same manner as in Reference Example 1 except that Polymeric Compound P-5 of Example 5 is used instead of Polymeric Compound P-1 of Reference Example 1.

Reference Example 6

Hole Only Device 6 is manufactured in the same manner as in Reference Example 1 except that Polymeric Compound P-6 of Example 6 is used instead of Polymeric Compound P-1 of Reference Example 1.

Comparative Reference Example 1

Comparative Hole Only Device 1 is manufactured in the same manner as in Reference Example 1 except that TFB of Comparative Example 2 is used instead of Polymeric Compound P-1 of Reference Example 1.

Comparative Reference Example 2

Comparative Hole Only Device 2 is manufactured in the same manner as in Reference Example 1 except that Polymeric Compound P-7 of Comparative Example 1 is used instead of Polymeric Compound P-1 of Reference Example 1.

Hole Only Devices 1 to 6 and Comparative Hole Only Devices 1 and 2 are evaluated with respect to hole current density @ 8 V in the following method.

(Hole Current Density @8 V)

Each hole only device is measured with respect to a current value at 8 V by gradually increasing a voltage with a direct current constant voltage power source (source meter, Keyence Corp.), and this current value is used with an area of each device to calculate a current value per unit area (current density $A/m^2$) as "Hole Current Density @8V."

The results are shown in Table 2. In Table 2, current density of each hole only device is calculated based on 1.00 of current density of Comparative Hole Only Device 1 according to Comparative Reference Example 1, which is provided as "HOD@8V TFB=1" in Table 2.

TABLE 2

| | Polymeric compound | HOD@ 8 V TFB = 1 | HOMO (eV) | $T_g$ (° C.) |
|---|---|---|---|---|
| Reference Example 1 | P-1 | 3.95 | 5.49 | 176 |
| Reference Example 2 | P-2 | 4.25 | 5.49 | 128 |
| Reference Example 3 | P-3 | 16.05 | 5.49 | 79 |
| Reference Example 4 | P-4 | 4.45 | 5.49 | 115 |
| Reference Example 5 | P-5 | 10.08 | 5.49 | 97 |
| Reference Example 6 | P-6 | 10.22 | 5.49 | 88 |
| Comparative Reference Example 1 | TFB | 1.00 | 5.54 | 150 |
| Comparative Reference Example 2 | P-7 | 2.50 | 5.47 | 183 |

As clearly shown in Table 2, the devices of Reference Examples 1 to 6 exhibit improved hole injection and transport properties, compared with the devices of Comparative Reference Examples 1 and 2. In this respect, the devices according to an embodiment are considered to have a long lifespan effect.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A polymeric compound comprising a structural unit represented by Chemical Formula 1:

(Chemical Formula 1)

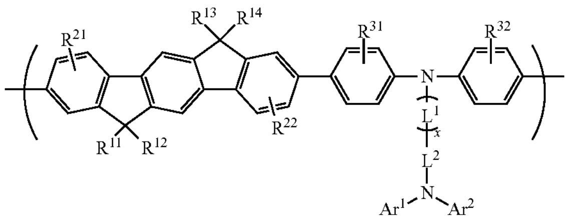

wherein, in Chemical Formula 1, $R^{11}$ to $R^{14}$, $R^{21}$, $R^{22}$, $R^{31}$, and $R^{32}$ are each independently a hydrogen atom or a hydrocarbon group having 1 to 18 carbon atoms, $L^1$ is a substituted or unsubstituted aromatic hydrocarbon group having 6 to 25 ring-forming atoms, or a substituted or unsubstituted heteroaromatic ring group having 5 to 14 ring-forming atoms, x is 0, 1, or 2, and when x is 2, each occurrence of $L^1$ is the same as or different from each other, $L^2$ is a substituted or unsubstituted aromatic hydrocarbon group having 6 to 25 ring-forming atoms, or a substituted or unsubstituted heteroaromatic ring group having 5 to 14 ring-forming atoms, wherein $L^2$ optionally forms a ring with $Ar^1$, $Ar^1$ is a substituted or unsubstituted aromatic hydrocarbon group having 6 to 25 ring-forming atoms, or a substituted or unsubstituted heteroaromatic ring group having 5 to 14 ring-forming atoms, wherein $Ar^1$ optionally forms a ring with $Ar^2$ or $L^2$, and $Ar^2$ is (i) an aromatic hydrocarbon group having 6 to 25 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms, or a divalent heteroaromatic ring group having 5 to 14 ring-forming atoms, or (ii) an heteroaromatic ring group having 5 to 14 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms, or a divalent heteroaromatic ring group having 5 to 14 ring-forming atoms, wherein $Ar^2$ optionally forms a ring with $Ar^1$.

2. The polymeric compound of claim 1, wherein the polymeric compound further comprises a structural unit represented by Chemical Formula 2:

(Chemical Formula 2)

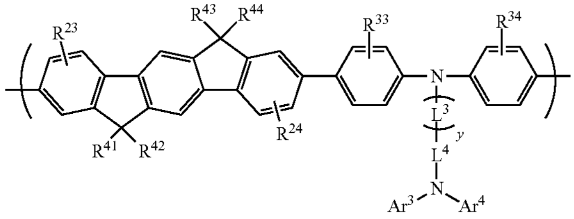

wherein, in Chemical Formula 2, $R^{41}$ to $R^{44}$, $R^{23}$, $R^{24}$, $R^{33}$, and $R^{34}$ are each independently a hydrogen atom, or a hydrocarbon group having 1 to 18 carbon atoms, wherein $R^{41}$ to $R^{44}$ are different from $R^{11}$ to $R^{14}$ of Chemical Formula 1, $L^3$ is a substituted or unsubstituted aromatic hydrocarbon group having 6 to 25 ring-forming atoms, or a substituted or unsubstituted heteroaromatic ring group having 5 to 14 ring-forming atoms, y is 0, 1, or 2, and when y is 2, each occurrence of $L^3$ is the same as or different from each other, $L^4$ is a substituted or unsubstituted aromatic hydrocarbon group having 6 to 25 ring-forming atoms or a substituted or unsubstituted heteroaromatic ring group having 5 to 14 ring-forming atoms, wherein $L^4$ optionally forms a ring with $Ar^3$, $Ar^3$ is a substituted or unsubstituted aromatic hydrocarbon group having 6 to 25 ring-forming atoms, or a substituted or unsubstituted heteroaromatic ring group having 5 to 14 ring-forming atoms, wherein $Ar^3$ optionally forms a ring with $Ar^4$ or $L^4$, and $Ar^4$ is (i) an aromatic hydrocarbon group having 6 to 25 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms, or a divalent heteroaromatic ring group having 5 to 14 ring-forming atoms, or (ii) an heteroaromatic ring group having 5 to 14 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms, or a divalent heteroaromatic ring group having 5 to 14 ring-forming atoms, wherein $Ar^4$ optionally forms a ring with $Ar^3$.

3. The polymeric compound of claim 2, wherein $R^{11}$ to $R^{14}$ of Chemical Formula 1 are each independently a hydrocarbon group having 3 to 9 carbon atoms, and $R^{41}$ to $R^{44}$ in Chemical Formula 2 are each independently a hydrocarbon group having 10 to 14 carbon atoms.

4. The polymeric compound of claim 2, wherein $R^{21}$, $R^{22}$, $R^{31}$, $R^{32}$, $L^1$, x, $L^2$, $Ar^1$, and $Ar^2$ of Chemical Formula 1 are the same as $R^{23}$, $R^{24}$, $R^{33}$, $R^{34}$, $L^3$, y, $L^4$, $Ar^3$, and $Ar^4$ of Chemical Formula 2, respectively.

5. The polymeric compound of claim 2, wherein a mole ratio of the structural unit represented by Chemical Formula 2 to the structural unit represented by Chemical Formula 1 is greater than or equal to about 1 mole and less than or equal to about 20 moles based on 1 mole of the structural unit represented by Chemical Formula 1.

6. The polymeric compound of claim 1, wherein the following structure in Chemical Formula 1:

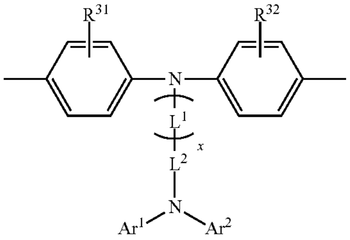

comprises a structure selected from Group 1:

(Group 1)

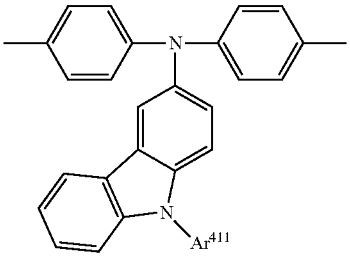

,

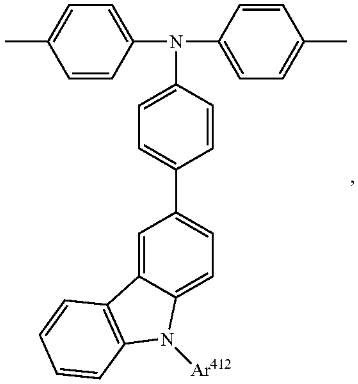

,

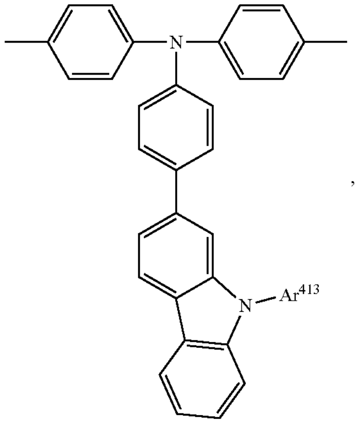

,

-continued
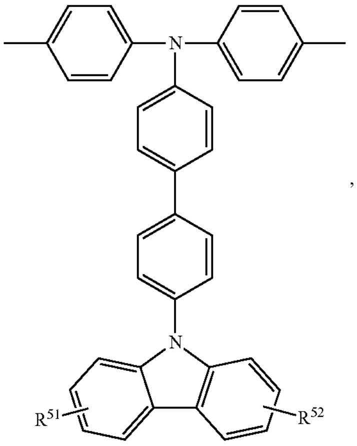
,
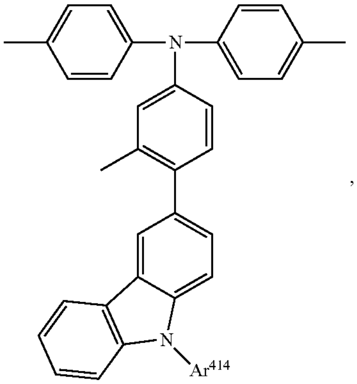
,
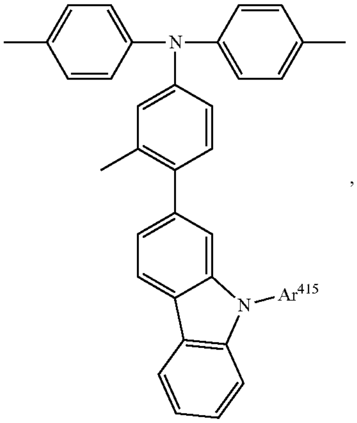
,
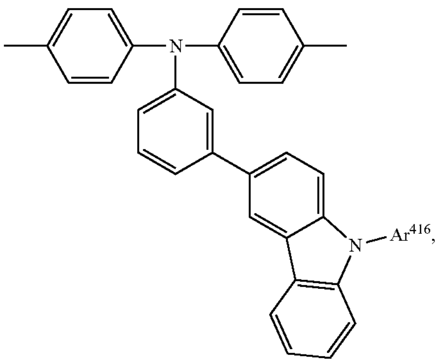
-continued
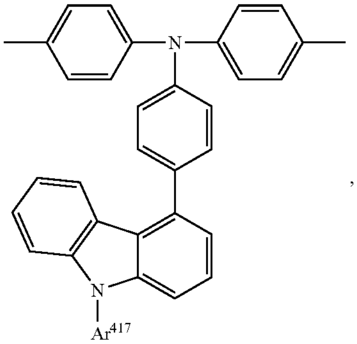
, and
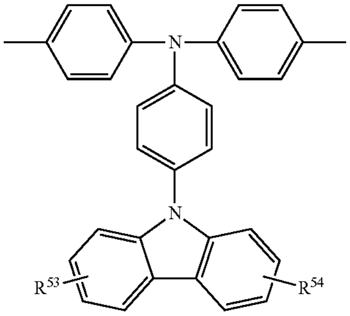
wherein, in Group 1, $R^{51}$ to $R^{54}$ are each independently a hydrogen atom, a linear alkyl group having 1 to 12 carbon atoms, a branched alkyl group having 3 to 12 carbon atoms, or a group selected from the following groups:
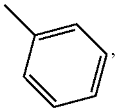
,
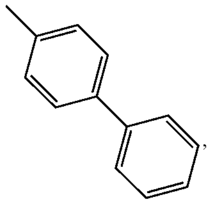
,
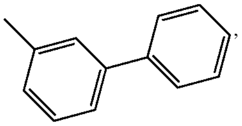
,
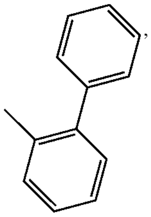
,
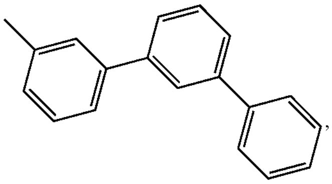
,
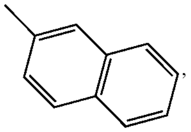
,
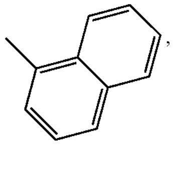
, and
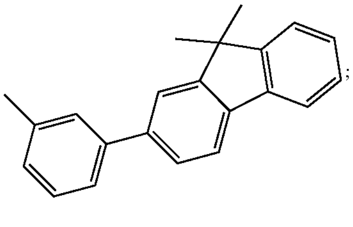
;

wherein, in Group 1, $Ar^{41}$ to $Ar^{417}$ are each independently a group selected from the following groups:

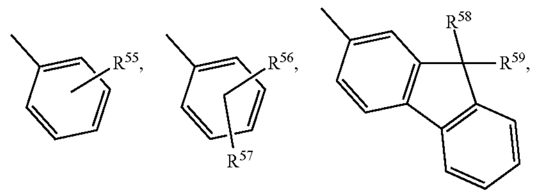

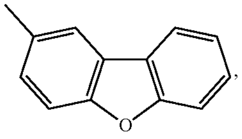

and

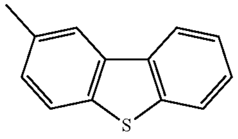

wherein, in the chemical formulas, $R^{55}$ to $R^{57}$ are each independently a hydrogen atom, a linear alkyl group having 1 to 12 carbon atoms, a branched alkyl group having 3 to 12 carbon atoms, or a group selected from the following groups:

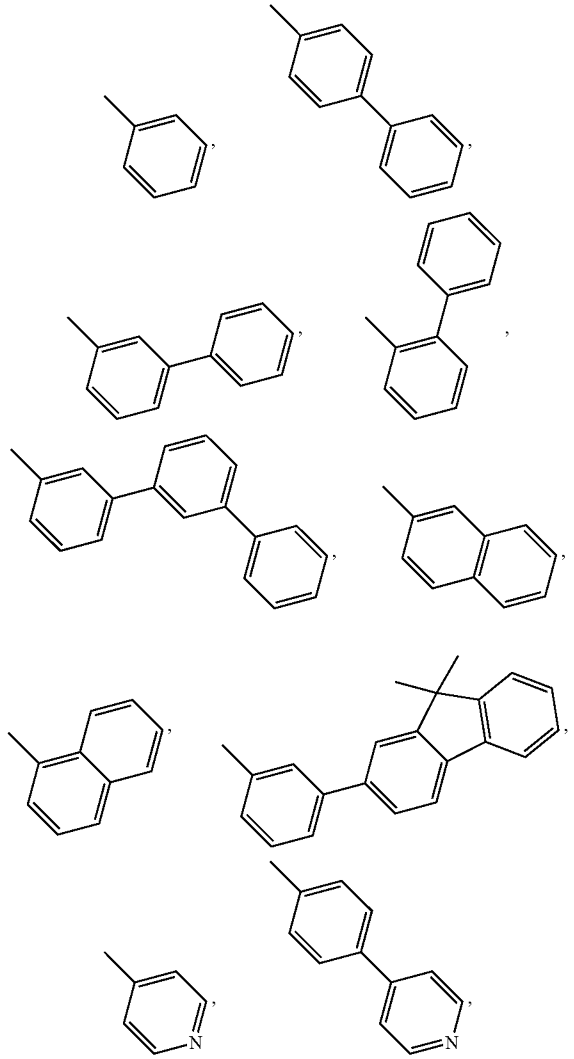

-continued

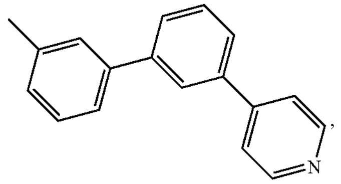

and

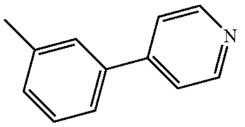

wherein, in the chemical formulas, $R^{58}$ and $R^{59}$ are each independently a hydrogen atom, a linear alkyl group having 1 to 12 carbon atoms, or a branched alkyl group having 3 to 12 carbon atoms.

7. The polymeric compound of claim 2, wherein the following structure in Chemical Formula 2:

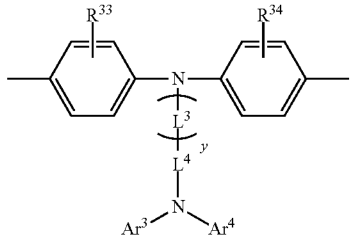

comprises a structure selected from Group 1:

(Group 1)

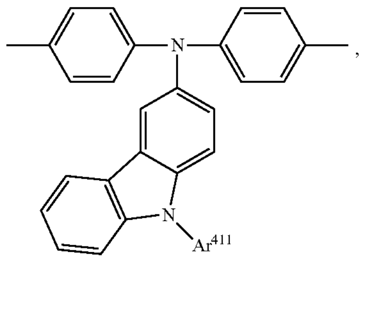

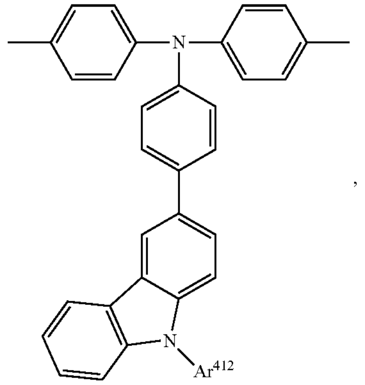

-continued
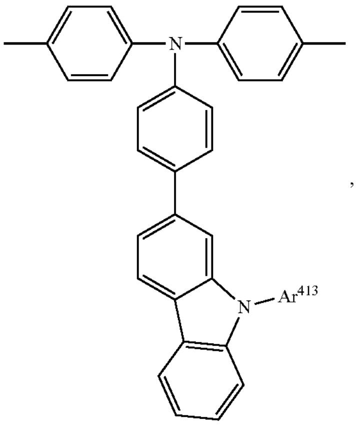
,
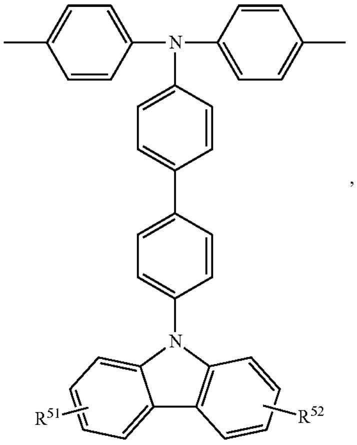
,
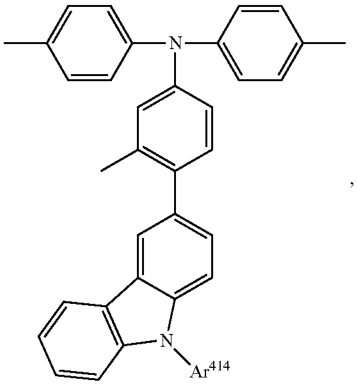
,
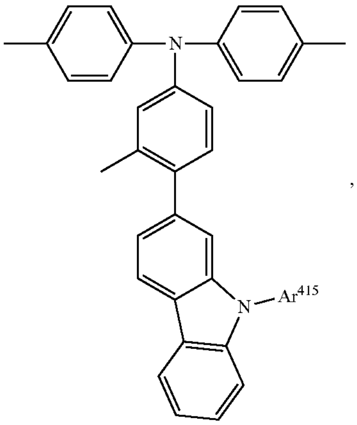
,
-continued
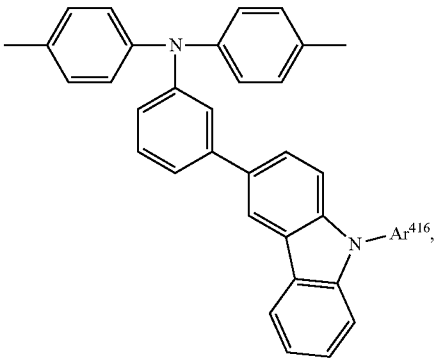
,
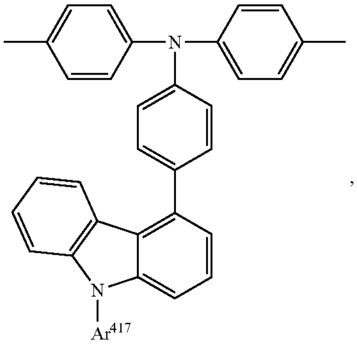
, and
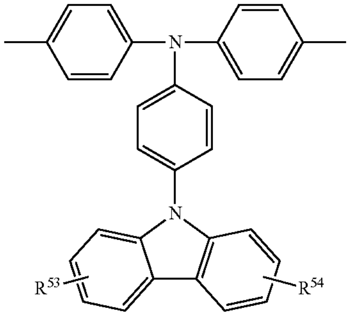
wherein, in Group 1, $R^{51}$ to $R^{54}$ are each independently a hydrogen atom, a linear alkyl group having 1 to 12 carbon atoms, a branched alkyl group having 3 to 12 carbon atoms, or a group selected from the following groups:
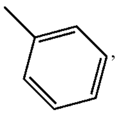
,
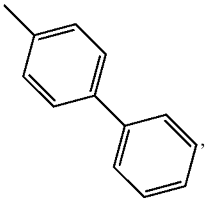
,
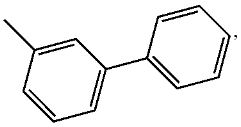
,
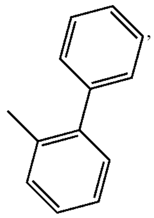
, -continued

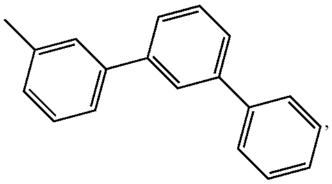,
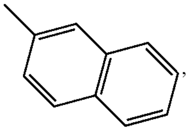,
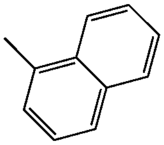 and 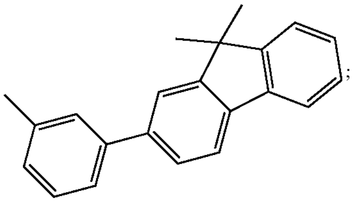;

$Ar^4$~ to $Ar^{417}$ of Group 1 are each independently a group selected from the following group:

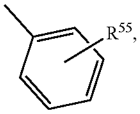,
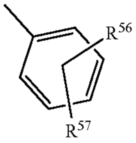
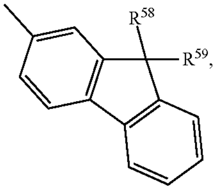,
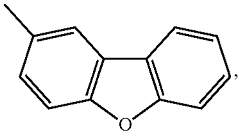, and 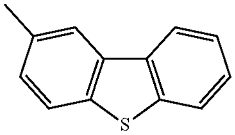

wherein, in the chemical formulas, $R^{55}$ to $R^{57}$ are each independently a hydrogen atom, a linear alkyl group having 1 to 12 carbon atoms, a branched alkyl group having 3 to 12 carbon atoms, or a group selected from the following groups:

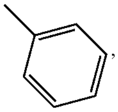,
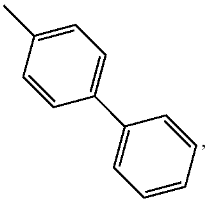,
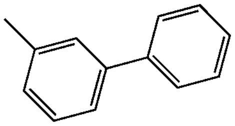,
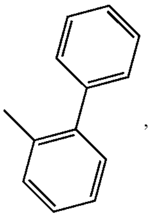,
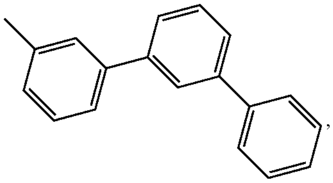,
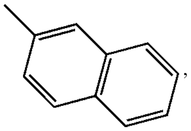,

-continued

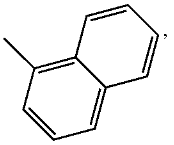,
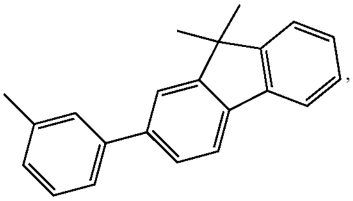,
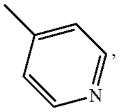,
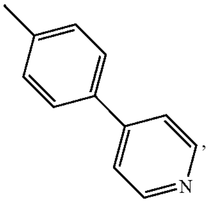,
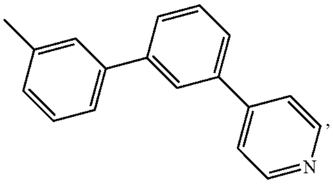, and
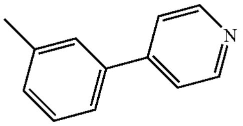

wherein, in the chemical formulas, $R^{58}$ and $R^{59}$ are each independently a hydrogen atom, a linear alkyl group having 1 to 12 carbon atoms, or a branched alkyl group having 3 to 12 carbon atoms.

8. The polymeric compound of claim 2, wherein the following structure in Chemical Formula 1:

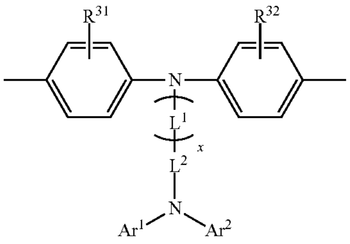

or the following structure in Chemical Formula 2:

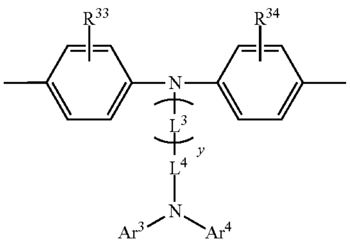

comprises a structure of Group 2:

(Group 2)

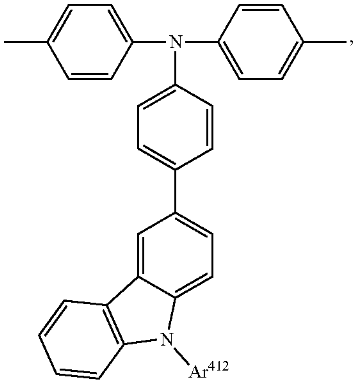

,

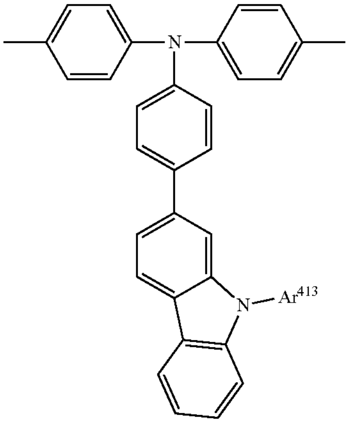

,

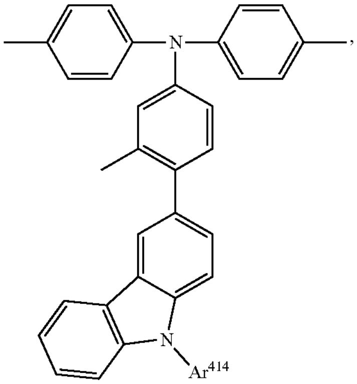

,

-continued

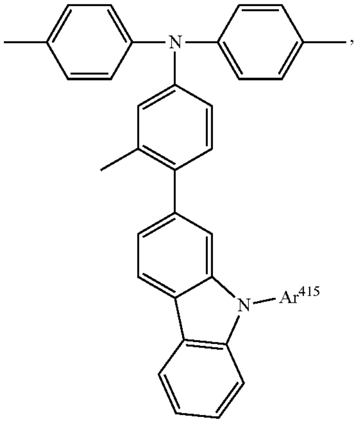

, and

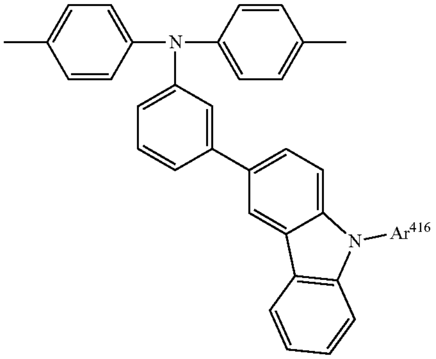

wherein, in Group 2, $Ar^{412}$ to $Ar^{416}$ are each independently a group selected from the following groups:

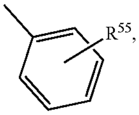

, and

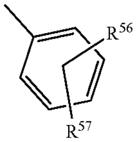

wherein, in the chemical formulas, $R^{55}$ to $R^{57}$ are each independently a linear alkyl group having 4 to 10 carbon atoms, or a branched alkyl group having 4 to 10 carbon atoms.

9. The polymeric compound of claim 1, wherein the structural unit represented by Chemical Formula 1 is represented by one or more of the following structural units:

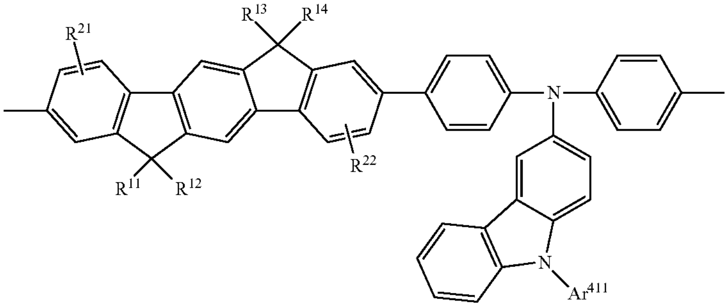

-continued
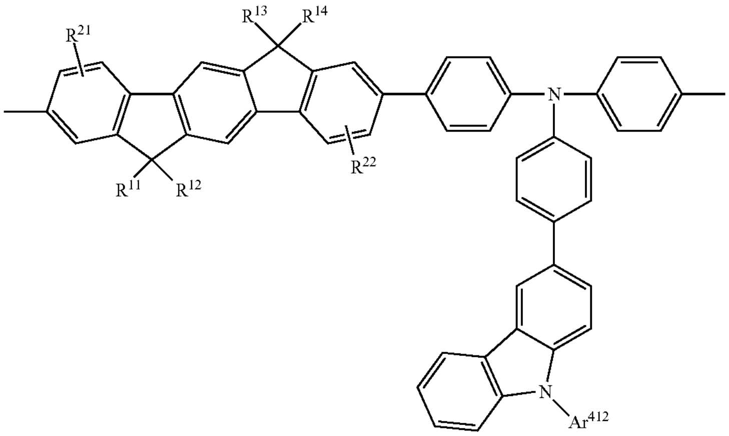
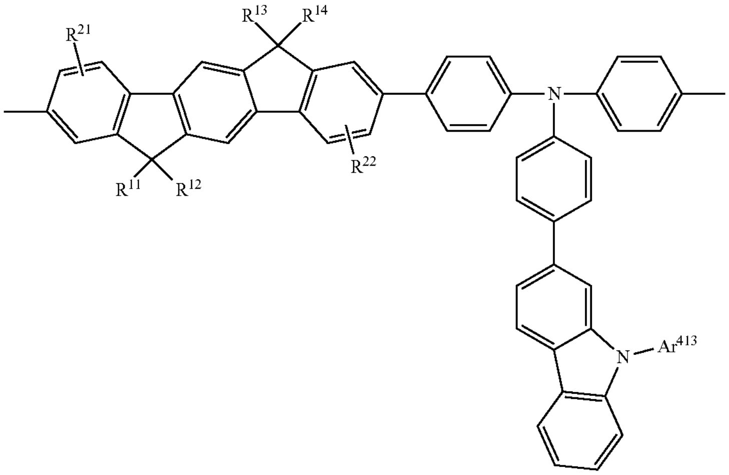
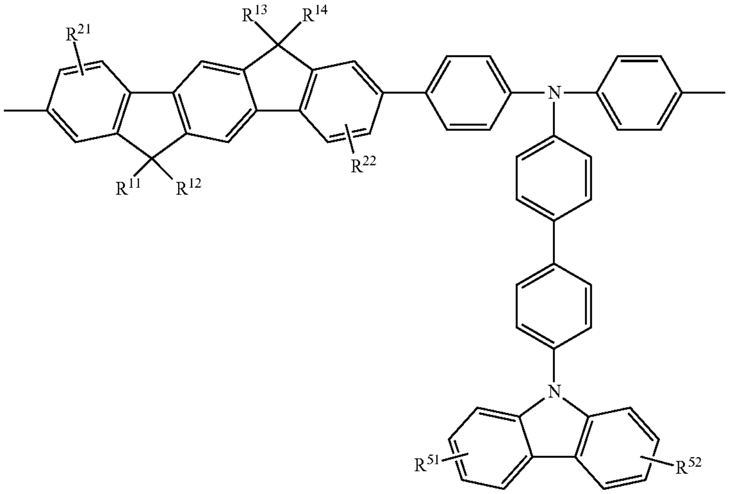

-continued
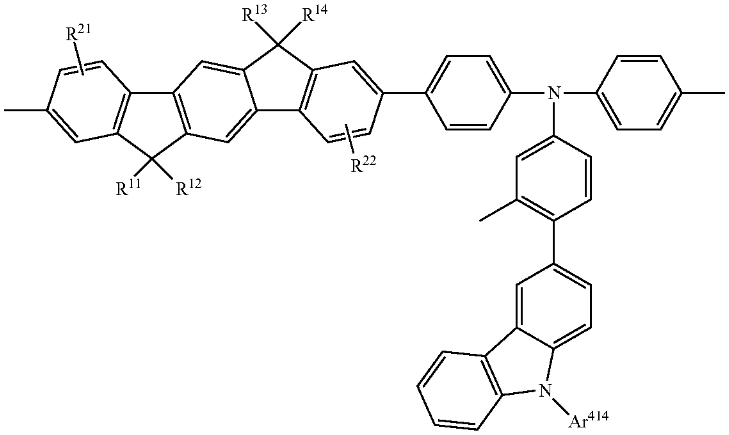
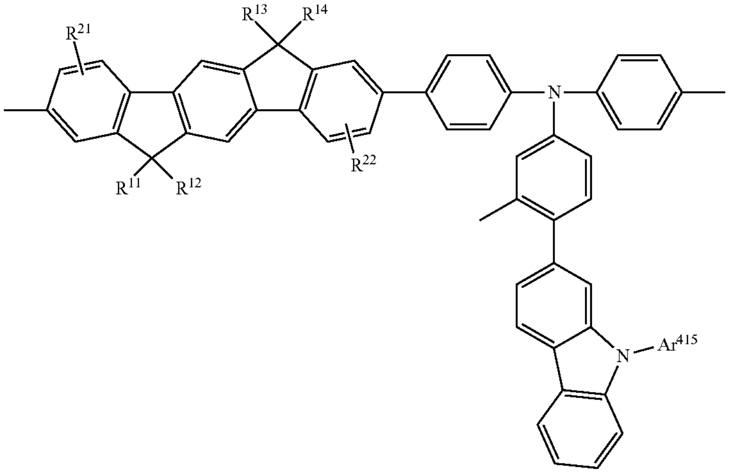
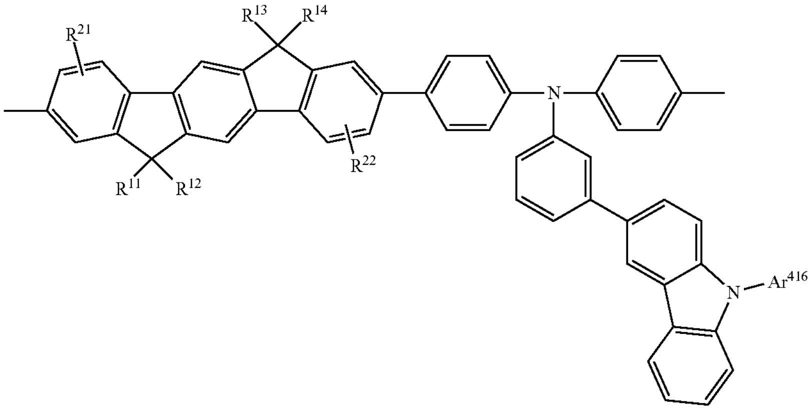
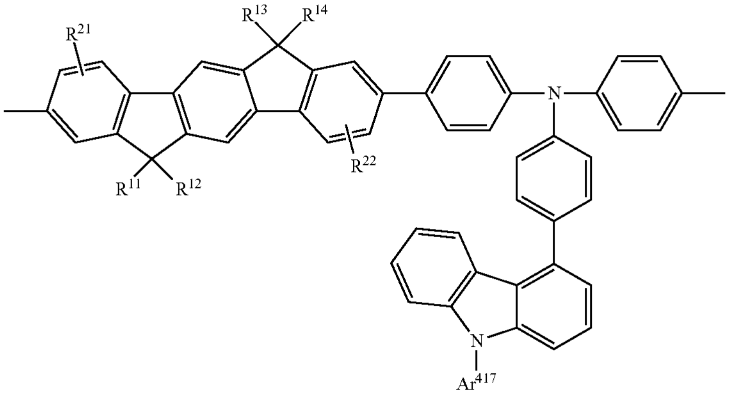

-continued

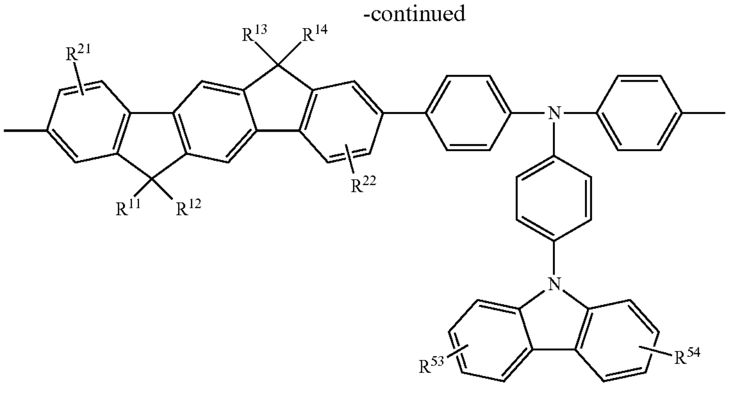

wherein, in the structural units, $R^{11}$ to $R^{14}$, $R^{21}$, and $R^{22}$ are defined as in Chemical Formula 1, and $Ar^{411}$ to $Ar^{417}$ are each independently a group selected from the following groups:

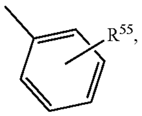,
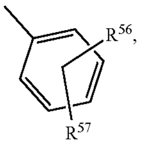,
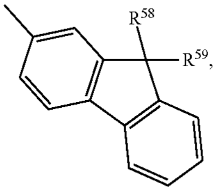,

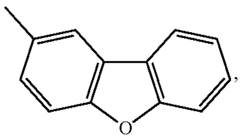, and 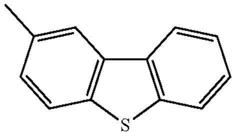

wherein, in the chemical formulas, $R^{55}$ to $R^{57}$ are each independently a hydrogen atom, a linear alkyl group having 1 to 12 carbon atoms, a branched alkyl group having 3 to 12 carbon atoms, or a group selected from the following groups:

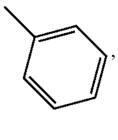,
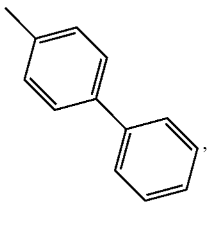,

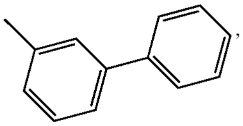,
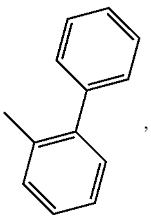,

-continued

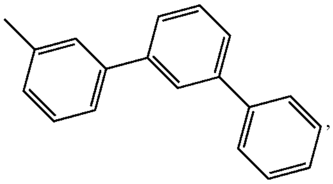,
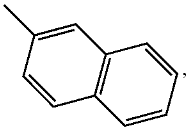,

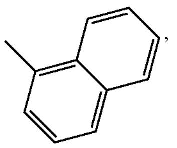,
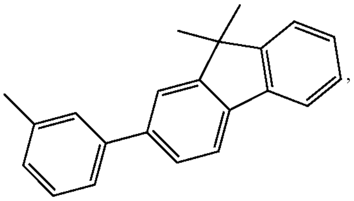,

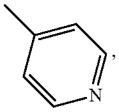,
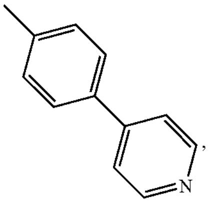,

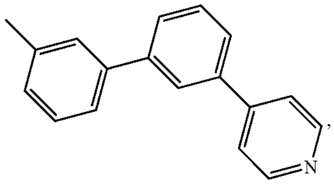, and

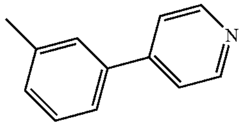

wherein, in the chemical formulas, $R^{58}$ and $R^{59}$ are each independently a hydrogen atom, a linear alkyl group having 1 to 12 carbon atoms, or a branched alkyl group having 3 to 12 carbon atoms.

10. The polymeric compound of claim 2, wherein the structural unit represented by Chemical Formula 2 is represented by one or more of the following structural units:

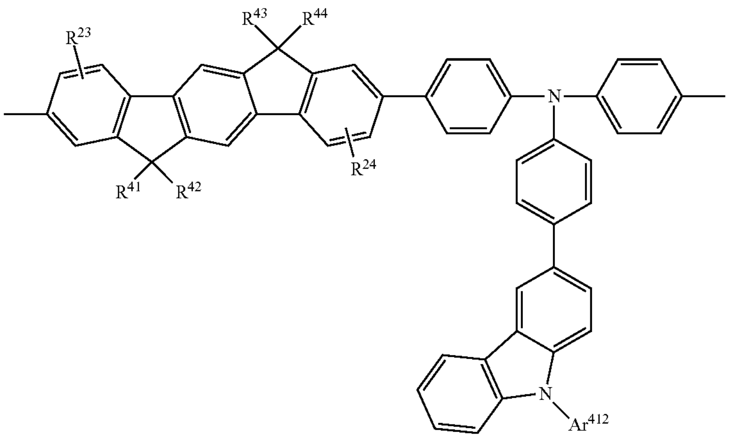
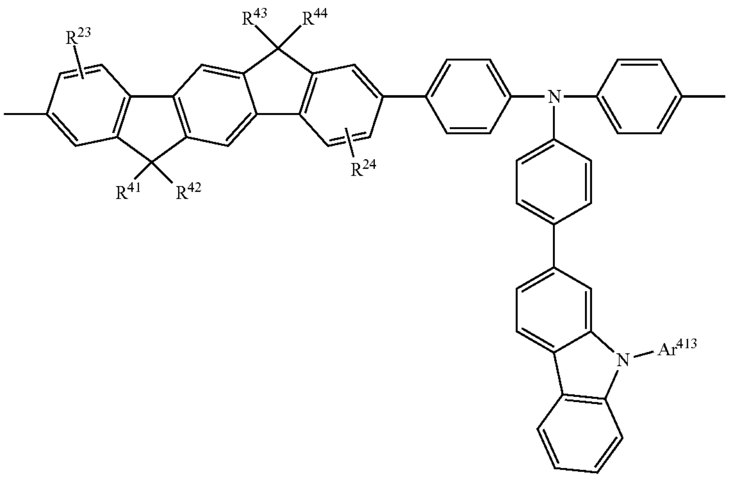
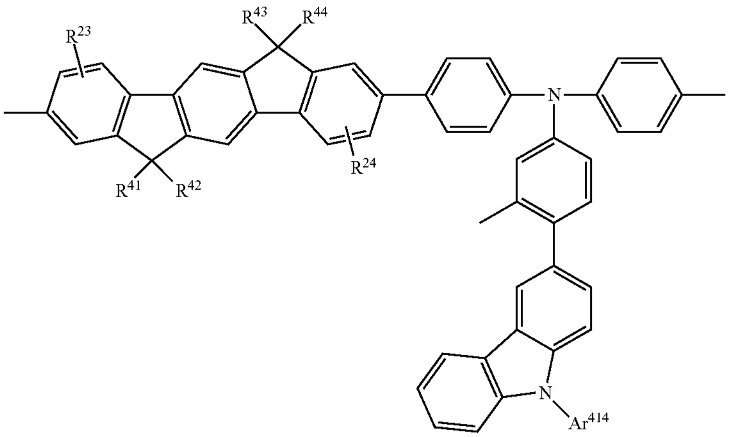

-continued

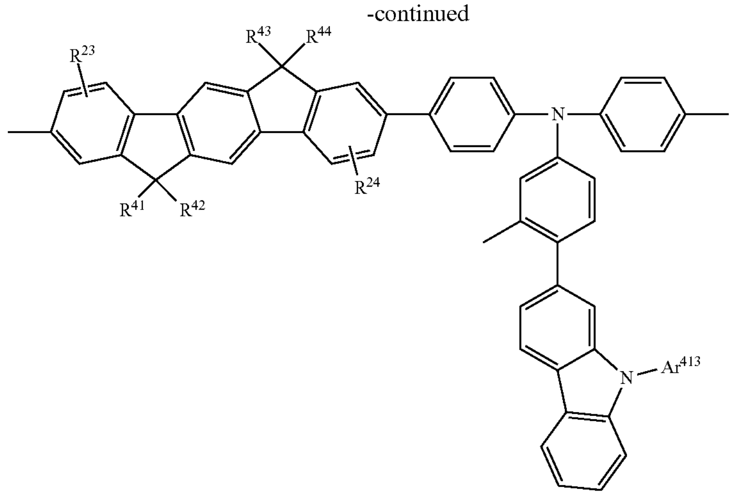

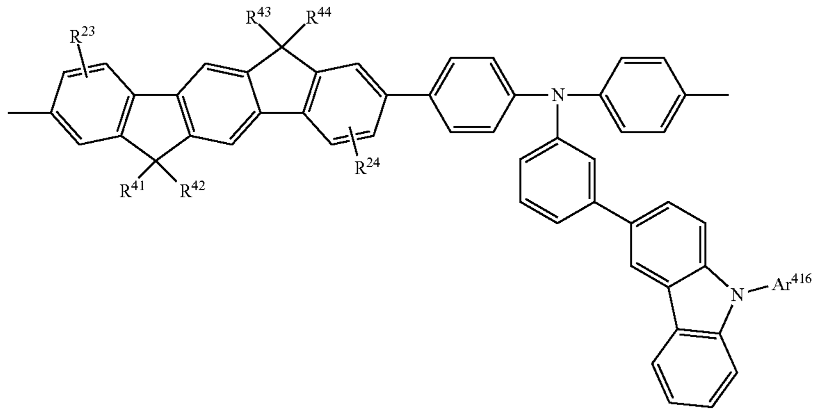

wherein, in the structural units, $R^{41}$ to $R^{44}$, $R^{23}$, and $R^{24}$ are defined as in Chemical Formula 2, and $Ar^{412}$ to $Ar^{416}$ are each independently a group selected from the following groups:

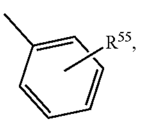 and 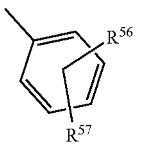

wherein, in the chemical formulas, $R^{55}$ to $R^{57}$ are each independently a linear alkyl group having 4 to 10 carbon atoms, or a branched alkyl group having 4 to 10 carbon atoms.

11. An electroluminescent device material comprising the polymeric compound of claim 1.

12. The electroluminescent device material of claim 11, wherein the polymeric compound further comprises a structural unit represented by Chemical Formula 2:

(Chemical Formula 2)

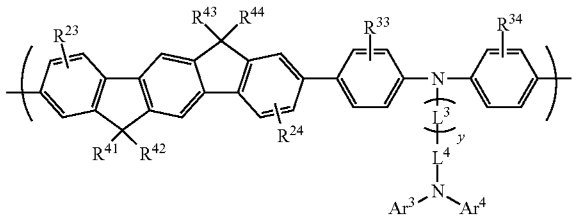

wherein, in Chemical Formula 2, $R^{41}$ to $R^{44}$, $R^{23}$, $R^{24}$, $R^{33}$, and $R^{34}$ are each independently a hydrogen atom, or a hydrocarbon group having 1 to 18 carbon atoms, wherein $R^{41}$ to $R^{44}$ are different from $R^{11}$ to $R^{14}$ of Chemical Formula 1, $L^3$ is a substituted or unsubstituted aromatic hydrocarbon group having 6 to 25 ring-forming atoms, or a substituted or unsubstituted heteroaromatic ring group having 5 to 14 ring-forming atoms, y is 0, 1, or 2, and when y is 2, each occurrence of $L^3$ is the same as or different from each other, $L^4$ is a substituted or unsubstituted aromatic hydrocarbon group having 6 to 25 ring-forming atoms, or a substituted or unsubstituted heteroaromatic ring group having 5 to 14 ring-forming atoms, wherein $L^4$ optionally forms a ring with $Ar^3$, $Ar^3$ is a substituted or unsubstituted aromatic hydrocarbon group having 6 to 25 ring-forming atoms, or a substituted or unsubstituted heteroaromatic ring group having 5 to 14 ring-forming atoms, wherein $Ar^3$ optionally forms a ring with $Ar^4$ or $L^4$, and $Ar^4$ is (i) an aromatic hydrocarbon group having 6 to 25 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms, or a heteroaromatic ring group having 5 to 14 ring-forming atoms, or (ii) an heteroaromatic ring group having 5 to 14 ring-forming atoms substituted with a linear hydrocarbon group having 1 to 12 carbon atoms, a branched hydrocarbon group having 3 to 12 carbon atoms, an aromatic hydrocarbon group having 6 to 25 ring-forming atoms, or a heteroaromatic ring group having 5 to 14 ring-forming atoms, wherein $Ar^4$ optionally forms a ring with $Ar^3$.

13. An electroluminescent device, comprising a first electrode, a second electrode, and at least one organic film disposed between the first electrode and the second electrode, wherein the at least one organic film comprises the polymeric compound of claim 1.

14. The electroluminescent device of claim 13, wherein the at least one organic film comprising the polymeric compound is a hole transport layer or a hole injection layer.

15. The electroluminescent device of claim 13, wherein the at least one organic film further comprises a light emitting layer comprising semiconductor nanoparticles or organometallic complexes.

16. An electroluminescent device, comprising a first electrode, a second electrode, and at least one organic film disposed between the first electrode and the second electrode, wherein the at least one organic film comprises the polymeric compound of claim 2.

17. The electroluminescent device of claim 16, wherein the at least one organic film comprising the polymeric compound is a hole transport layer or a hole injection layer.

18. The electroluminescent device of claim 16, wherein the at least one organic film further comprises a light emitting layer comprising a semiconductor nanoparticle or an organometallic complex.

19. An electronic device comprising the electroluminescent device of claim 13.

* * * * *